US012609693B2

(12) United States Patent
Lai et al.

(10) Patent No.: US 12,609,693 B2
(45) Date of Patent: Apr. 21, 2026

(54) SWITCHING CONTROL SYSTEM

(71) Applicants: Chicony Power Technology Co., Ltd., New Taipei City (TW); National Taipei University of Technology, Taipei (TW)

(72) Inventors: Yen-Shin Lai, Taipei City (TW); Jian-Hua Lu, Taipei City (TW); Yu-Xian Zeng, New Taipei City (TW)

(73) Assignees: CHICONY POWER TECHNOLOGY CO., LTD., New Taipei City (TW); NATIONAL TAIPEI UNIVERSITY OF TECHNOLOGY, Taipei (TW)

( * ) Notice: Subject to any disclaimer, the term of this patent is extended or adjusted under 35 U.S.C. 154(b) by 171 days.

(21) Appl. No.: 18/426,960

(22) Filed: Jan. 30, 2024

(65) Prior Publication Data

US 2025/0175172 A1    May 29, 2025

(30) Foreign Application Priority Data

Nov. 23, 2023    (TW) ................................. 112145436

(51) Int. Cl.
*H03K 17/10* (2006.01)
*H02M 1/00* (2007.01)
(Continued)

(52) U.S. Cl.
CPC ........ *H03K 17/102* (2013.01); *H02M 1/0009* (2021.05); *H02M 1/088* (2013.01); *H03K 17/6871* (2013.01)

(58) Field of Classification Search
CPC ............ H03K 17/102; H03K 17/6871; H02M 1/0009; H02M 1/088; H02M 5/293; H02M 7/797; H02J 9/068; H02J 9/061
See application file for complete search history.

(56) References Cited

U.S. PATENT DOCUMENTS 5,182,464 A    1/1993    Woodworth et al.
6,411,067 B1    6/2002    Björklund
(Continued)

FOREIGN PATENT DOCUMENTS

CN        102570590        7/2012
CN        103532218        1/2014
(Continued)

*Primary Examiner* — Metasebia T Retebo
(74) *Attorney, Agent, or Firm* — Birch, Stewart, Kolasch & Birch, LLP

(57)        ABSTRACT
A switching control system, including: switch units, configured to separately receive one of alternating currents and couple to a load; a detection unit, configured to detect the alternating currents; and a control unit, configured to, after receiving a switching signal, and in response to detecting that a power supply alternating current and a backup alternating current are in a polarity half cycle and a voltage difference is less than a preset voltage, perform: closing a first turn-on direction of a power supply switch unit; opening a second turn-on direction of a backup switch unit; closing a second turn-on direction of the power supply switch unit; and opening a first turn-on direction of the backup switch unit; where the first turn-on direction is opposite to a direction of the polarity half cycle, and the second turn-on direction is the same as the direction of the polarity half cycle.

29 Claims, 37 Drawing Sheets

(51) Int. Cl.
    *H02M 1/088*       (2006.01)
    *H03K 17/687*     (2006.01)

(56)           References Cited

U.S. PATENT DOCUMENTS

| | | | |
|---|---|---|---|
| 6,483,682 | B1 | 11/2002 | Reynolds |
| 9,716,445 | B2 | 7/2017 | Li et al. |
| 11,750,111 | B2 | 9/2023 | Hsiao et al. |
| 2003/0117761 | A1 | 6/2003 | Pebles et al. |

FOREIGN PATENT DOCUMENTS

| | | | |
|---|---|---|---|
| CN | 203775040 | | 8/2014 |
| CN | 104811020 A | | 7/2015 |
| CN | 105373205 A | * | 3/2016 |
| CN | 110635565 | | 12/2019 |
| CN | 111033924 | | 4/2020 |
| CN | 107863778 | | 6/2020 |
| CN | 107846211 | | 9/2020 |
| CN | 109474060 | | 6/2021 |
| CN | 116760395 | | 9/2023 |
| EP | 2 876 800 A1 | | 5/2015 |
| TW | 201743535 | | 12/2017 |
| TW | 202143598 | | 11/2021 |
| TW | 202136964 | | 2/2022 |
| TW | 202316765 | | 4/2023 |

* cited by examiner

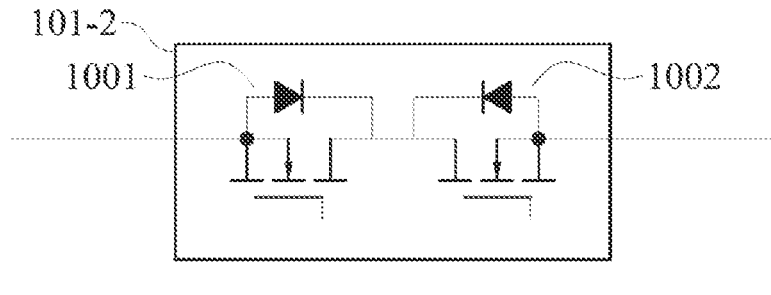
FIG. 10
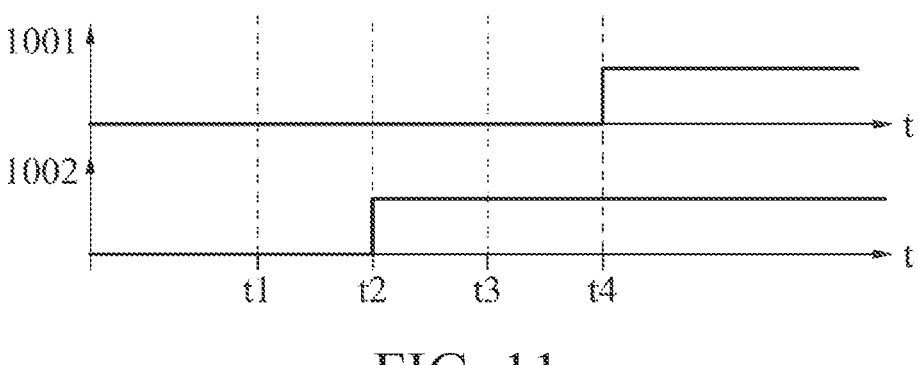
FIG. 11
FIG. 12

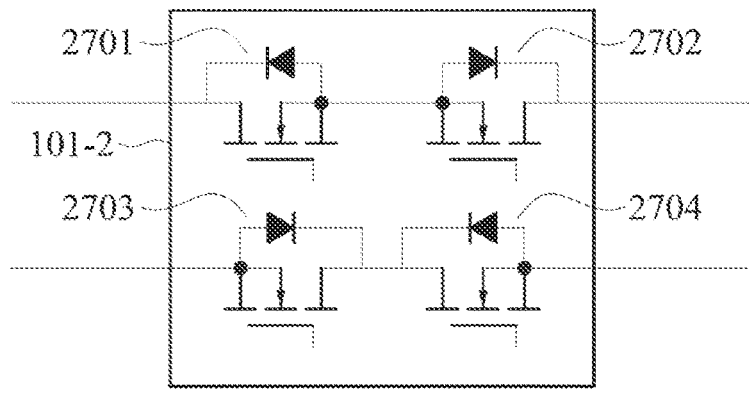
FIG. 27
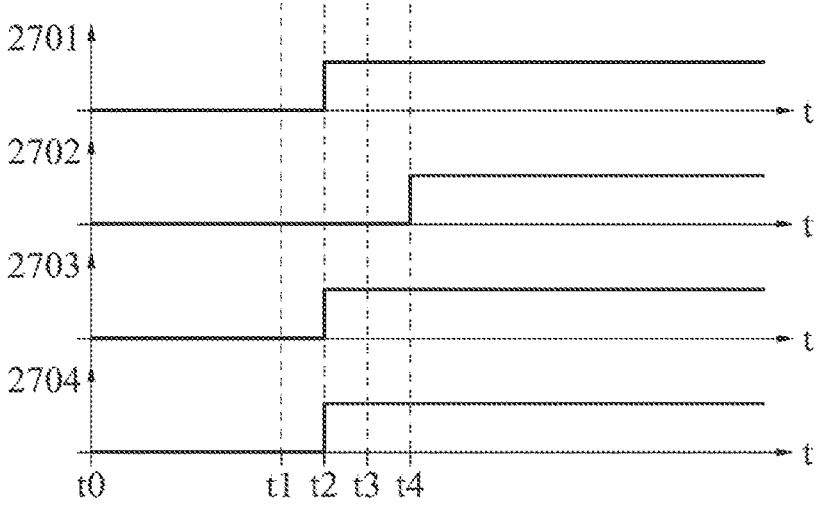
FIG. 28
FIG. 29

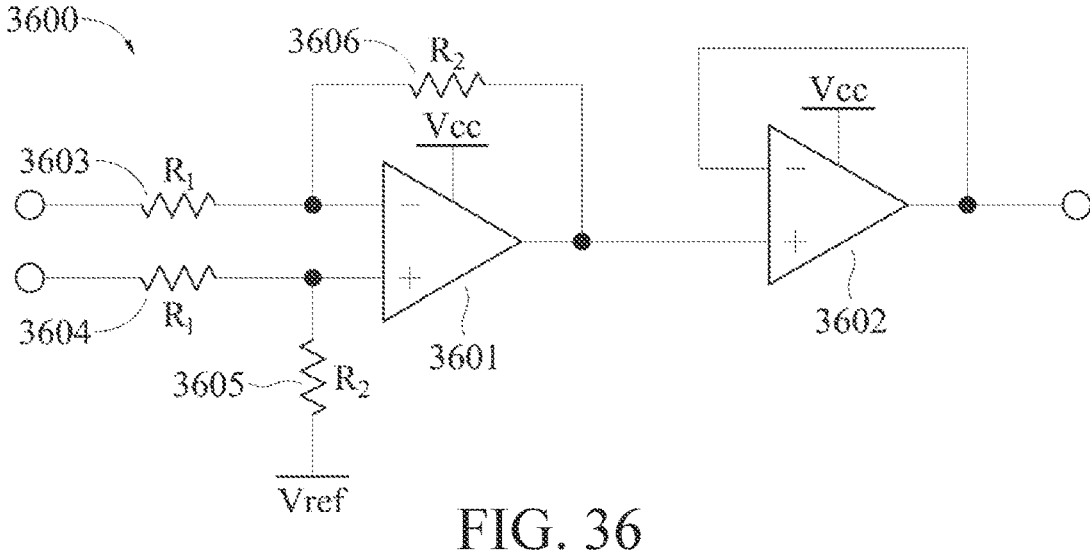

FIG. 36

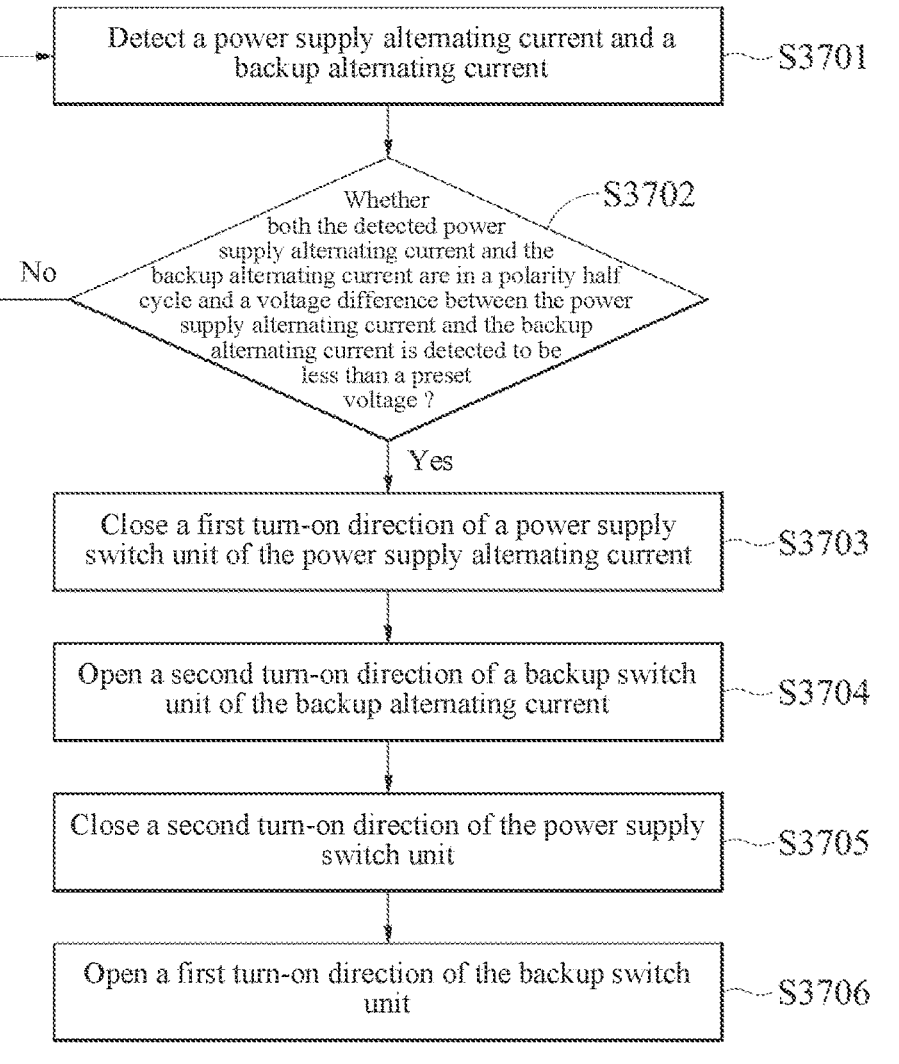

Detect a power supply alternating current and a backup alternating current — S3701

Whether both the detected power supply alternating current and the backup alternating current are in a polarity half cycle and a voltage difference between the power supply alternating current and the backup alternating current is detected to be less than a preset voltage ? — S3702

No

Yes

Close a first turn-on direction of a power supply switch unit of the power supply alternating current — S3703

Open a second turn-on direction of a backup switch unit of the backup alternating current — S3704

Close a second turn-on direction of the power supply switch unit — S3705

Open a first turn-on direction of the backup switch unit — S3706

FIG. 37

Positive half cycle

Negative half cycle

Positive half cycle

Negative half cycle

Positive half cycle

Negative half cycle

Positive half cycle

Negative half cycle

Positive half cycle

Negative half cycle

Positive half cycle

Negative half cycle

Positive half cycle

Negative half cycle

Positive half cycle

Negative half cycle

Positive half cycle

Negative half cycle

Positive half cycle

Negative half cycle

Positive half cycle

Negative half cycle

Positive half cycle

Negative half cycle

SWITCHING CONTROL SYSTEM

CROSS-REFERENCE TO RELATED APPLICATION

This non-provisional application claims priority under 35 U.S.C. § 119(a) to Patent Application No. 112145436 filed in Taiwan, R.O.C. on Nov. 23, 2023, the entire contents of which are hereby incorporated by reference.

BACKGROUND

Technical Field

The present disclosure relates to a switching control system, and in particular, to a switching control system using a two-way switch.

Related Art

To ensure stable power supply of an electronic device and minimize a power supply cost, usually management needs to be performed on the power supply, and an automatic switching switch is one of the cores of power supply management. However, the automatic switching switch conventionally uses a relay as a switch of the automatic switching switch. Due to mechanical structural characteristics of the relay, switching duration is prone to be too long, and the relay cannot withstand a great transient current. In addition, according to knowledge of the inventor, some automatic switching switch architectures include the relay, a silicon controlled rectifier (Silicon Controlled Rectifier, SCR), and a diode. The architecture withstands the transient current by using the SCR, and uses the diode on a turn-on path. A diode forward bias and internal resistance suppress the transient current. The architecture causes a quantity of components to be increased; some automatic switching switch architectures include the relay, the SCR, a transistor switch, and the diode. The transistor switch has a capability to turn off a great current flow and shorter switching duration, and the diode is configured to prevent a reverse current. The architecture requires an additional diode to prevent the reverse current from flowing through the transistor switch, thereby increasing the quantity of components; and some automatic switching switch architectures include a rectifier circuit and two sets of transistor switches connected in parallel with the diodes. Alternating power supply is rectified into a direct current with a lower voltage by the rectifier circuit. This allows a circuit component to withstand the lower voltage, but the architecture requires consideration of a rectifier circuit component.

SUMMARY

In view of this, some embodiments of the present invention provide a switching control system. Through an architecture and a control circuit of the switching control system, a circuit may maintain normal operation in a switching process, and achieve uninterrupted power supply, to improve the existing technical problems.

Embodiments of the present invention provide a switching control system, including: a plurality of switch units, configured to separately receive one of a plurality of alternating currents and couple to a load; a detection unit, configured to detect each of the alternating currents; and a control unit, configured to, after receiving a switching signal, and in response to detecting that both a power supply alternating current of the alternating currents and a backup alternating current of the alternating currents are in a polarity half cycle and a voltage difference between the power supply alternating current of the alternating currents and the backup alternating current is less than a preset voltage, perform the following steps: closing a first turn-on direction of a power supply switch unit of the power supply alternating current; opening a second turn-on direction of a backup switch unit of the backup alternating current; closing a second turn-on direction of the power supply switch unit; and opening a first turn-on direction of the backup switch unit; where the first turn-on direction of the power supply switch unit and the first turn-on direction of the backup switch unit are opposite to a direction of the polarity half cycle, the second turn-on direction of the power supply switch unit and the second turn-on direction of the backup switch unit are the same as the direction of the polarity half cycle, and the power supply switch unit and the backup switch unit are included in the switch units.

In some embodiments of the present invention, pairs of transistor switches are connected in reverse series to form a two-way switch unit, thereby replacing the conventional relay and the SCR.

Based on the above, some embodiments of the present invention provide a switching control system. By first closing the first turn-on direction of the power supply switch unit of the power supply alternating current and also maintaining the second turn-on direction of the power supply switch unit to be opened before the second turn-on direction of the backup switch unit of the backup alternating current is opened, the power supply alternating current may be prevented from short-circuiting and maintain normal operation in the switching process, to achieve an effect of uninterrupted power supply. In addition, because the switching control system replaces the conventional relay (relay) and the silicon controlled rectifier (silicon controlled rectifier, SCR) with the two-way switch, and an architecture of the switching control system is simple, through the switching control system, the power supply alternating current and the backup alternating current may be quickly switched, to implement a backup function. In some embodiments of the present invention, pairs of transistor switches are connected in reverse series to form a two-way switch unit, thereby replacing the conventional relay and the SCR, and an additional diode is not required to prevent a reverse current.

BRIEF DESCRIPTION OF THE DRAWINGS

FIG. 10 is a circuit block diagram of a backup switch unit according to some embodiments of the present invention.

FIG. 11 is a schematic diagram of controlling of a switch unit of a positive half cycle according to some embodiments of the present invention.

FIG. 12 is a schematic diagram of controlling of a switch unit of a negative half cycle according to some embodiments of the present invention.

FIG. 27 is a circuit block diagram of a backup switch unit according to some embodiments of the present invention.

FIG. 28 is a schematic diagram of controlling of a switch unit of a positive half cycle according to some embodiments of the present invention.

FIG. 29 is a schematic diagram of controlling of a switch unit of a negative half cycle according to some embodiments of the present invention.

FIG. 36 is a circuit block diagram of a voltage detection circuit according to some embodiments of the present invention.

FIG. 37 is a flowchart of a switching control method according to an embodiment of the present invention.

DETAILED DESCRIPTION

Figure 1:
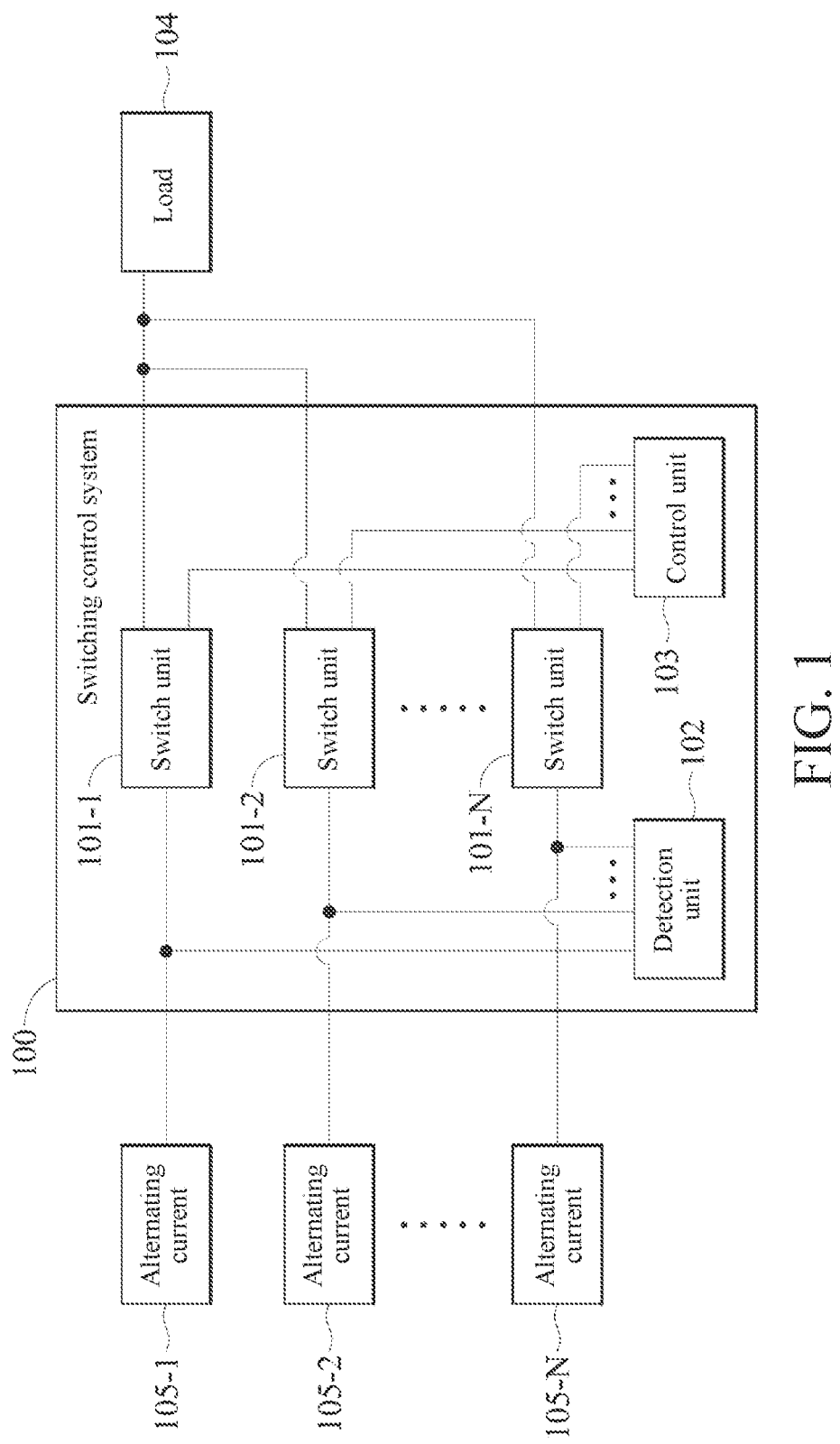
FIG. 1 is a block diagram of a switching control system according to an embodiment of the present invention.

The aforementioned and other technical contents, features, and effects of the present invention will be clearly presented in the following detailed description of embodiments with reference to the accompanying drawings. A thickness or a size of each component in the accompanying drawings are expressed in an exaggerated, omitted, or schematic manner for a person skilled in the art to understand and read, and the size of each component is not entirely its actual size, and they are not intended to limit the conditions under which the present invention can be implemented and therefore have no technical significance. Any modifications to the structure, changes to the proportional relationship or the adjustment on the size should fall within the scope of the technical content disclosed by the present invention without affecting the effects and the objectives that can be achieved by the present invention. The same reference numeral is used to indicate the same or similar elements in all of the drawings.

FIG. 1 is a block diagram of a switching control system according to an embodiment of the present invention. Referring to FIG. 1, the switching control system 100 includes a plurality of switch units 101-1 to 101-N, a detection unit 102, and a control unit 103, where N is a positive integer. The plurality of switch units 101-1 to 101-N are configured to respectively receive one of a plurality of alternating currents 105-1 to 105-N. For example, the switch unit 101-1 is coupled to the alternating current 105-1, and the switch unit 101-2 is coupled to the alternating current 105-2. The switch units 101-1 to 101-N are configured to be coupled to a load 104. The control unit 103 may be implemented as a digital microcontroller or an analog controller, which is not limited in the present invention. The detection unit 102 is configured to detect a voltage and a current of each of the alternating currents 105-1 to 105-N.

Each of the plurality of switch units 101-1 to 101-N has two turn-on directions. For example, the two turn-on directions of the switch unit 101-1 are: a direction from the alternating current 105-1 to the load 104 and a direction from the load 104 to the alternating current 105-1. The two turn-on directions of other switch units 101-1 to 101-N are deduced by analogy The control unit 103 may open and close the two turn-on directions of each of the plurality of switch units 101-1 to 101-N by sending a control signal. For example, the control unit 103 may simultaneously open the direction from the switch unit alternating currents 101-1 to 105-1 to the load 104 and the direction from the load 104 to the alternating current 105-1 by sending the control signal; and the control unit 103 may also open the direction from the switch unit alternating currents 101-1 to 105-1 to the load 104 but close the direction from the load 104 to the alternating current 105-1 by sending the control signal.

Each of the alternating currents 105-1 to 105-N is an alternating current of a same frequency and a same amplitude, but phases (phase) of the alternating currents 105-1 to 105-N may be different from each other. In some embodiments of the present invention, N=2 and a phase difference between the alternating current 105-1 and the alternating current 105-2 is 120°.

The following provides a detailed description of a switching control method according to some embodiments of the present invention and how various modules of the switching control system 100 cooperate with each other with reference to the accompanying drawings.

FIG. 37 is a flowchart of a switching control method according to some embodiments of the present invention. Refer to both FIG. 1 and FIG. 37. In this embodiment, the control unit 103 is configured to perform step S3701 to step S3706 shown in FIG. 37 after receiving a switching signal. In step S3701, the control unit 103 detects a power supply alternating current and a backup alternating current among the alternating currents 105-1 to 105-N through the detection unit 102. The power supply alternating current is a power supply that is currently supplying power to the load 104, and the backup alternating current is a power supply that replaces the power supply alternating current and supplies power to the load 104. In the following description, an example in which the alternating current 105-1 is used as the power supply alternating current, and the alternating current 105-2 is used as the backup alternating current is used. In step S3702, the control unit 103 determines whether both the detected power supply alternating current and the backup alternating current are in a polarity half cycle and a voltage difference between the detected power supply alternating current and the backup alternating current is less than a preset voltage (that is, detecting a proximity point between two voltages). If yes, the control unit 103 performs step S3703 in response to detecting that both the power supply alternating current and the backup alternating current are in the polarity half cycle and the voltage difference between the power supply alternating current and the backup alternating current is less than the preset voltage. The polarity half cycle is selected from a set including a positive half cycle and a negative half cycle. In other words, the polarity half cycle is a positive half cycle of the alternating current or a negative half cycle of the alternating current. In some embodiments of the present invention, before performing step S3701, the control unit 103 first selects (or is set by an external signal) one of the positive half cycle or the negative half cycle as the polarity half cycle, to determine in step S3702 that both the power supply alternating current and the backup alternating current are in the polarity half cycle.

If the control unit 103 does not detect that both the power supply alternating current and the backup alternating current are in the same polarity half cycle (for example, both the power supply alternating current and the backup alternating current are in the positive half cycle or are in the negative half cycle) and the voltage difference between the power supply alternating current and the backup alternating current is less than the preset voltage (in other words, the power supply alternating current and the backup alternating current are not in the same polarity half cycle or the voltage difference between the power supply alternating current and the backup alternating current is not less than the preset voltage), the control unit 103 continues to detect the power supply alternating current and the backup alternating current. In this embodiment, the control unit 103 obtains a voltage of the power supply alternating current and a voltage of the backup alternating current through the detection unit 102, the control unit 103 then calculates a voltage difference between the voltage of the power supply alternating current and the voltage of the backup alternating current, and the control unit 103 then determines whether the voltage difference is less than the preset voltage. The control unit 103 obtains a flow direction of a current of the power supply alternating current and a flow direction of a current of the backup alternating current through the detection unit 102 to determine whether both the power supply alternating current and the backup alternating current are in the polarity half cycle.

In some embodiments of the present invention, after receiving the switching signal, the control unit 103 selects one of the alternating currents 105-1 to 105-N as the backup alternating current.

In step S3703, the control unit 103 closes a first turn-on direction of the power supply switch unit of the power supply alternating current (the alternating current 105-1). The power supply switch unit of the power supply alternating current is a switch unit coupled to the power supply alternating current, which is the switch unit 101-1 in this example. The first turn-on direction of the power supply switch unit of the power supply alternating current is opposite to a direction of the polarity half cycle. That the first turn-on direction is opposite to the direction of the polarity half cycle means that the first turn-on direction of the power supply switch unit is opposite to the flow direction of the current of the polarity half cycle. Refer to FIG. 1 again. For example, if the polarity half cycle is the positive half cycle, the first turn-on direction of the power supply switch unit is the direction from the load 104 to the alternating current 105-1; and if the polarity half cycle is the negative half cycle, the first turn-on direction of the power supply switch unit is the direction from the alternating current 105-1 to the load 104.

In step S3704, the control unit 103 opens a second turn-on direction of the backup switch unit of the backup alternating current (the alternating current 105-2). The backup switch unit of the backup alternating current is a switch unit coupled to the backup alternating current, which is the switch unit 101-2 in this example. The second turn-on direction of the backup switch unit of the backup alternating current is the same as the direction of the polarity half cycle. That the second turn-on direction of the backup switch unit of the backup alternating current is the same as the direction of the polarity half cycle means that the second turn-on direction of the backup switch unit is the same as the flow direction of the current of the polarity half cycle. Refer to FIG. 1 again. For example, if the polarity half cycle is the positive half cycle, the second turn-on direction of the backup switch unit is the direction from the alternating current 105-1 to the load 104; and if the polarity half cycle is the negative half cycle, the second turn-on direction of the backup switch unit is the direction from the load 104 to the alternating current 105-1.

In step S3705, the control unit 103 closes the second turn-on direction of the power supply switch unit. A second turn-on direction of the power supply switch unit of the power supply alternating current is the same as the direction of the polarity half cycle. In step S3706, the control unit 103 opens the first turn-on direction of the backup switch unit, where the first turn-on direction of the backup switch unit is opposite to the direction of the polarity half cycle.

In the foregoing embodiments, the first turn-on direction of the power supply switch unit of the power supply alternating current is first closed and the second turn-on direction of the power supply switch unit is also maintained to be opened before the second turn-on direction of the backup switch unit of the backup alternating current (the alternating current 105-2) is opened, which may prevent the power supply alternating current from short-circuiting and maintain normal operation in the switching process, to achieve an effect of uninterrupted power supply. In addition, because the switching control system 100 replaces the conventional relay and the silicon controlled rectifier with the two-way switch, and an architecture of the switching control system 100 is simple, through the switching control system 100 and the switching control method described in FIG. 37, the power supply alternating current and the backup alternating current may be quickly switched, to implement a backup function.

Figure 2:
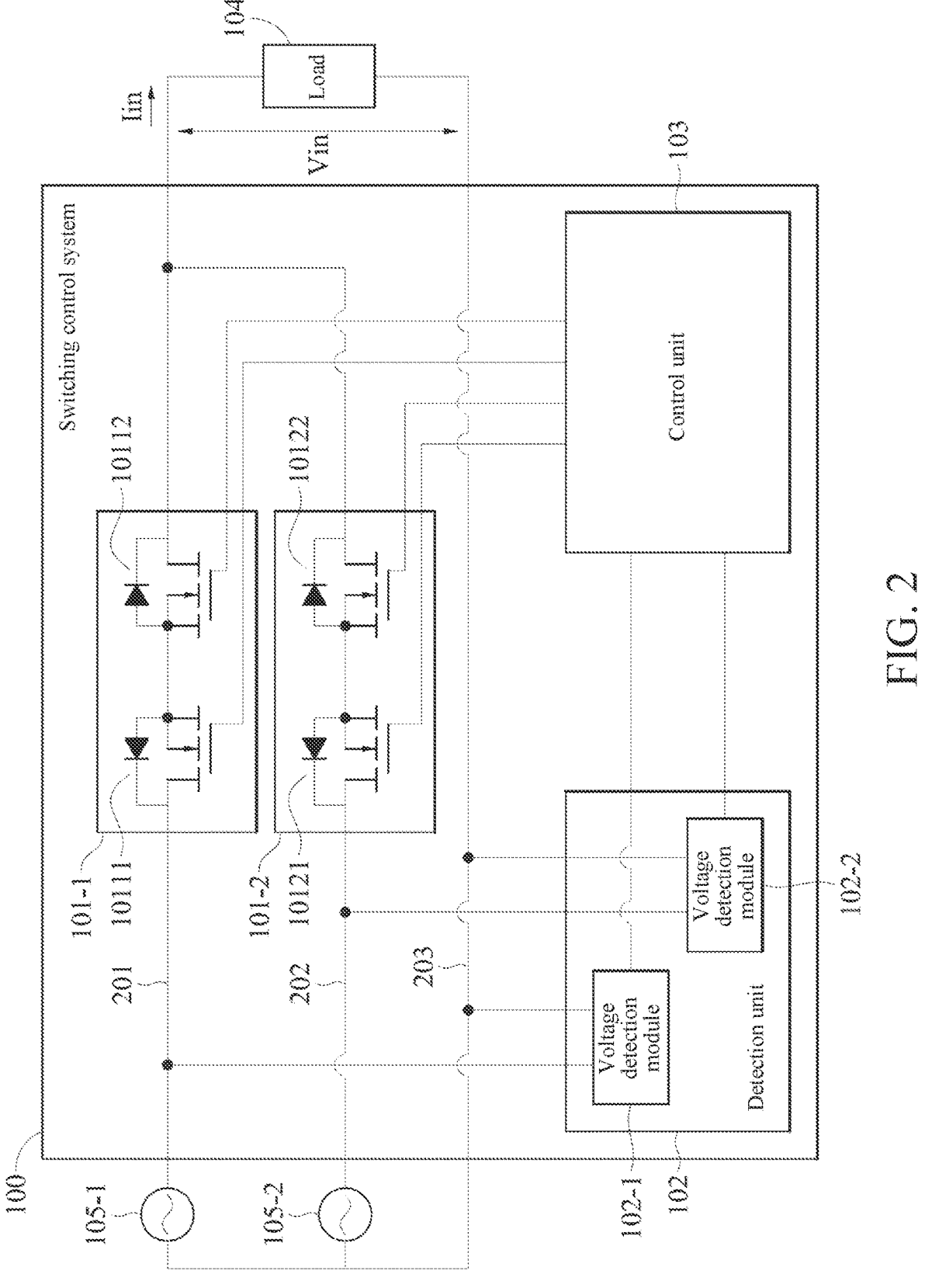
FIG. 2 is a circuit block diagram of a switching control system according to some embodiments of the present invention.

FIG. 2 is a circuit block diagram of a switching control system according to some embodiments of the present invention. Refer to both FIG. 1 and FIG. 2. In the embodiment shown in FIG. 2, the switching control system 100 receives the alternating current 105-1 from the outside as the power supply alternating current, and receives the alternating current 105-2 from the outside as the backup alternating current. The switching control system 100 includes a first phase line 201, a second phase line 202, and a neutral line

203. The first phase line 201 and the neutral line 203 are configured to receive the power supply alternating current (the alternating current 105-1), and the second phase line 202 and the neutral line 203 are configured to receive the backup alternating current (the alternating current 105-2). In this embodiment, the power supply switch unit of the power supply alternating current is the switch unit 101-1, and the backup switch unit of the backup alternating current is the switch unit 101-2. A voltage across the load 104 is Vin, and a current flows through the load 104 is Iin.

In this embodiment, the detection unit 102 includes a voltage detection module 102-1 and a voltage detection module 102-2. The voltage detection module 102-1 is configured to detect a voltage of the alternating current 105-1, and the voltage detection module 102-2 is configured to detect a voltage of the alternating current 105-2.

The power supply switch unit (the switch unit 101-1) includes a transistor 10111 (for convenience of description, also referred to as a first transistor of the power supply switch unit below) and a transistor 10112 (for convenience of description, also referred to as a second transistor of the power supply switch unit below); and the backup switch unit includes a transistor 10121 (for convenience of description, also referred to as a first transistor of the backup switch unit below) and a transistor 10122 (for convenience of description, also referred to as a second transistor of the backup switch unit below). The first transistor and the second transistor of the power supply switch unit are located on the first phase line 201 and are connected in reverse series. The first transistor and the second transistor of the backup switch unit are located on the second phase line 202 and are connected in reverse series.

Figures 3, 4:
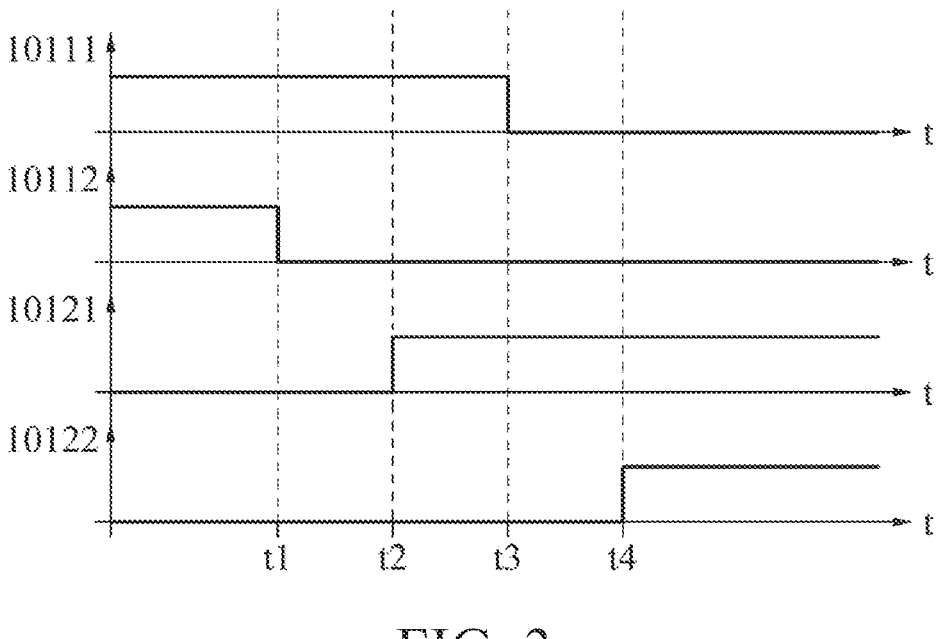
FIG. 3 is a schematic diagram of controlling of a switch unit according to some embodiments of the present invention.
FIG. 4 is a schematic diagram of a voltage and current switching according to some embodiments of the present invention.
Figure 38A:
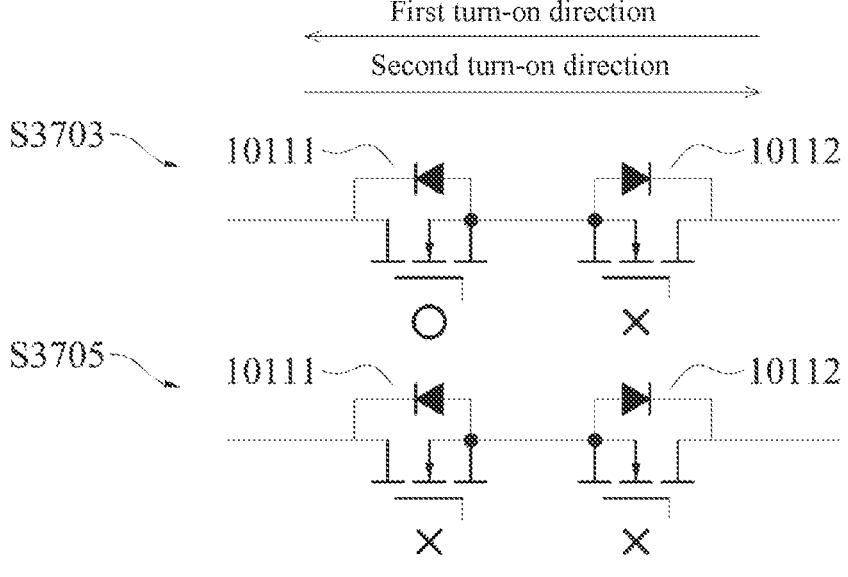
FIG. 38A and FIG. 38B are schematic diagrams of a power supply switch unit control method according to some embodiments of the present invention.
Figure 38B:
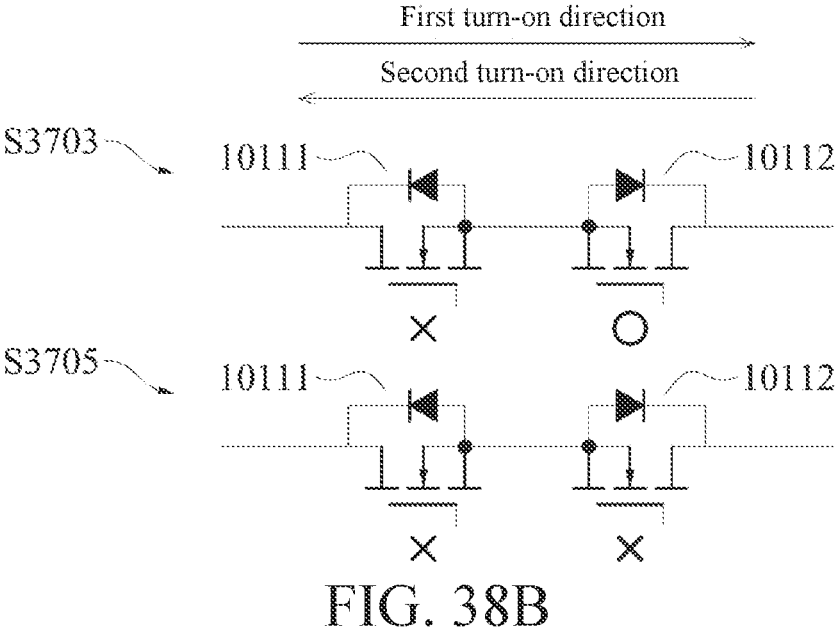
Figure 40A:
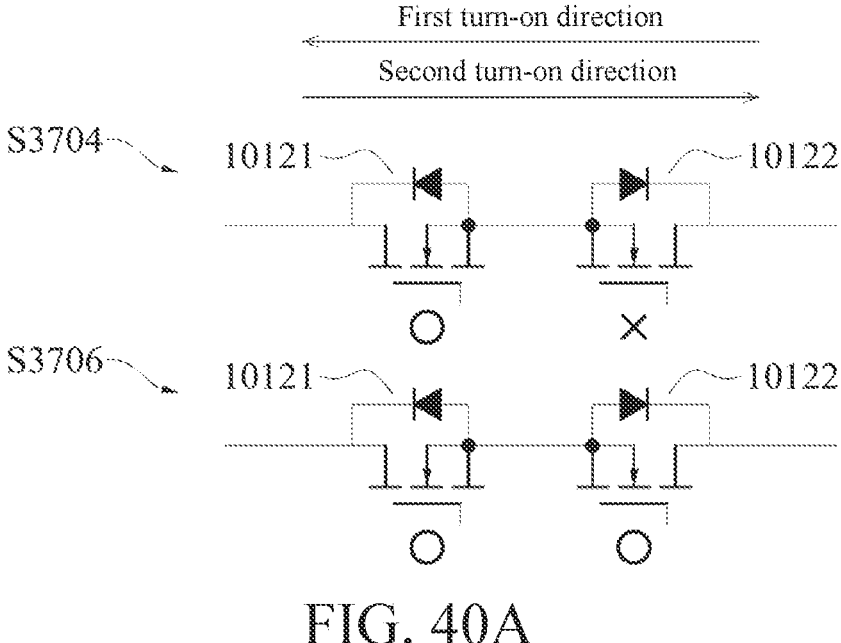
FIG. 40A and FIG. 40B are schematic diagrams of a backup switch unit control method according to some embodiments of the present invention.
Figure 40B:
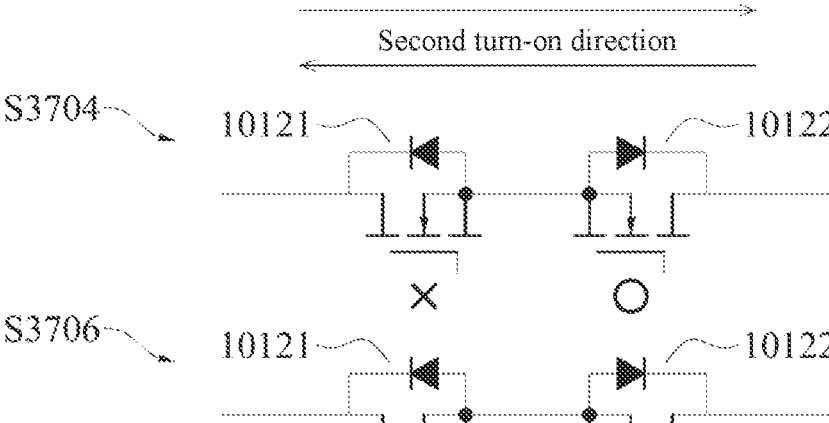

FIG. 3 is a schematic diagram of controlling of a switch unit according to some embodiments of the present invention. FIG. 4 is a schematic diagram of a voltage and current switching according to some embodiments of the present invention. FIG. 38A and FIG. 38B are schematic diagrams of a power supply switch unit control method according to some embodiments of the present invention. FIG. 40A and FIG. 40B are schematic diagrams of a backup switch unit control method according to some embodiments of the present invention. Referring to FIG. 2, FIG. 3, FIG. 4, FIG. 38A, and FIG. 40A, in some embodiments of the present invention, the polarity half cycle is a positive half cycle. Both the first transistor (the transistor 10111) and the second transistor (the transistor 10112) of the power supply switch unit each are an NMOS. In addition, a drain of the first transistor of the power supply switch unit receives the power supply alternating current, a source of the first transistor of the power supply switch unit is connected to a source of the second transistor of the power supply switch unit. A drain of the second transistor of the power supply switch unit is connected to the load (a connection method for the first transistor (the transistor 10111) and the second transistor (the transistor 10112) of the power supply switch unit is referred to as a common source connection). Both the first transistor (the transistor 10121) and the second transistor (the transistor 10122) of the backup switch unit each are an NMOS. A drain of the first transistor of the backup switch unit receives the backup alternating current, a source of the first transistor of the backup switch unit is connected to a source of the second transistor of the backup switch unit, and a drain of the second transistor of the backup switch unit is connected to the load (in other words, the first transistor (the transistor 10121) and the second transistor (the transistor 10122) of the backup switch unit also use the common source connection).

In this embodiment, step S3703 includes a first step, and step S3705 includes a second step; and step S3704 includes a third step, and step S3706 includes a fourth step (the first step, the second step, the third step, and the fourth step are only used to distinguish various steps, and do not have significance in sequence). In the first step, the control unit 103 sends a turn-off signal ("×" as shown in FIG. 38A) to a gate of the first control transistor of the power supply switch unit to turn off the first control transistor of the power supply switch unit. Because the polarity half cycle is the positive half cycle, the first control transistor of the power supply switch unit is the second transistor of the power supply switch unit. In this embodiment, the turn-off signal is a low voltage signal. As shown in FIG. 3, t represents time. At a time point t1, a voltage received by a gate of the second transistor (the transistor 10112) of the power supply switch unit is a low voltage, and then the second transistor (the transistor 10112) of the power supply switch unit starts to turn off after the time point t1. In this case, because the second transistor (the transistor 10112) of the power supply switch unit is in a turn-off state, the first turn-on direction (to be specific, opposite to a direction of the positive half cycle) of the power supply switch unit is closed. It is worth noting that in this case, because the first transistor of the power supply switch unit is still turned on ("○" shown in FIG. 38A), the second turn-on direction of the power supply switch unit is still opened.

In the second step, the control unit 103 sends a turn-off signal ("×" as shown in FIG. 38A) to the gate of the second control transistor of the power supply switch unit to turn off the second control transistor of the power supply switch unit. Because the polarity half cycle is the positive half cycle, the second control transistor of the power supply switch unit is the first transistor of the power supply switch unit. As shown in FIG. 3, at a time point t3, a voltage received by a gate of the first transistor (the transistor 10111) of the power supply switch unit is a low voltage, and then the first transistor (the transistor 10111) of the power supply switch unit starts to turn off after the time point t3. In this case, because both the first transistor (the transistor 10111) and the second transistor (the transistor 10112) of the power supply switch unit are in the turn-off state, both the first turn-on direction and the second turn-on direction of the power supply switch unit are closed.

In the third step, the control unit 103 sends a turn-on signal ("○" as shown in FIG. 40A) to a gate of the first control transistor of the backup switch unit to turn on the first control transistor of the backup switch unit. Because the polarity half cycle is the positive half cycle, the first control transistor of the backup switch unit is the first transistor (the transistor 10121) of the backup switch unit. In this embodiment, the turn-on signal is a high voltage signal. As shown in FIG. 3, at a time point t2, a voltage received by a gate of the first transistor (the transistor 10121) of the backup switch unit is a high voltage, and then the first transistor (the transistor 10121) of the backup switch unit starts to turn on after the time point t2. In this case, because the first transistor (the transistor 10121) of the backup switch unit is in a turn-on state, the second turn-on direction (to be specific, the same as a direction of the positive half cycle) of the backup switch unit is opened. It is worth noting that in this case, because the second transistor (the transistor 10112) of the backup switch unit is still turned off ("×" as shown in FIG. 40A), the first turn-on direction of the backup switch unit is still closed.

In the fourth step, the control unit 103 sends a turn-on signal ("○" as shown in FIG. 40A) to a gate of the second control transistor of the backup switch unit to turn on the second control transistor of the backup switch unit. Because the polarity half cycle is the positive half cycle, the second control transistor of the backup switch unit is the second transistor (the transistor 10122) of the backup switch unit. As shown in FIG. 3, at a time point t4, a voltage received by a gate of the second transistor (the transistor 10122) of the backup switch unit is a high voltage, and then the second transistor (the transistor 10122) of the backup switch unit starts to turn on after the time point t4. In this case, because both the first transistor (the transistor 10121) and the second transistor (the transistor 10122) of the backup switch unit are in the turn-on state, both the first turn-on direction and the second turn-on direction of the backup switch unit are opened.

Referring to FIG. 4, because the control unit 103 receives a switching signal before a time point tw, and detects that both the power supply alternating current and the backup alternating current are in the positive half cycle at the time point tw, and a voltage difference between the power supply alternating current and the backup alternating current is less than a preset voltage, the switching control methods S3703 to S3706 are performed. It may be learnt from switching waveforms of a voltage Vin and a current Iin that the power supply is not interrupted in the switching period.

Figure 5:
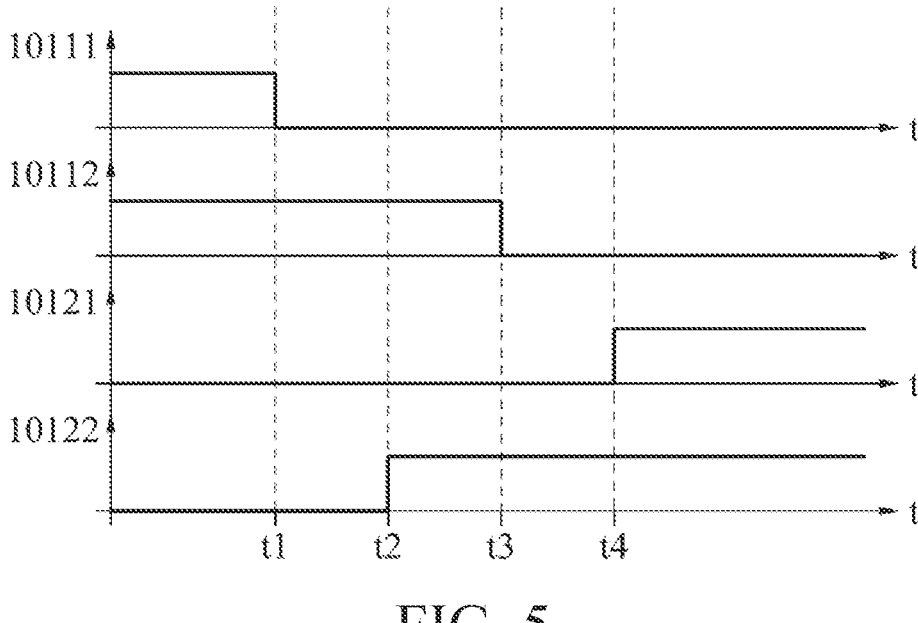
FIG. 5 is a schematic diagram of controlling of a switch unit according to some embodiments of the present invention.
Figure 6:
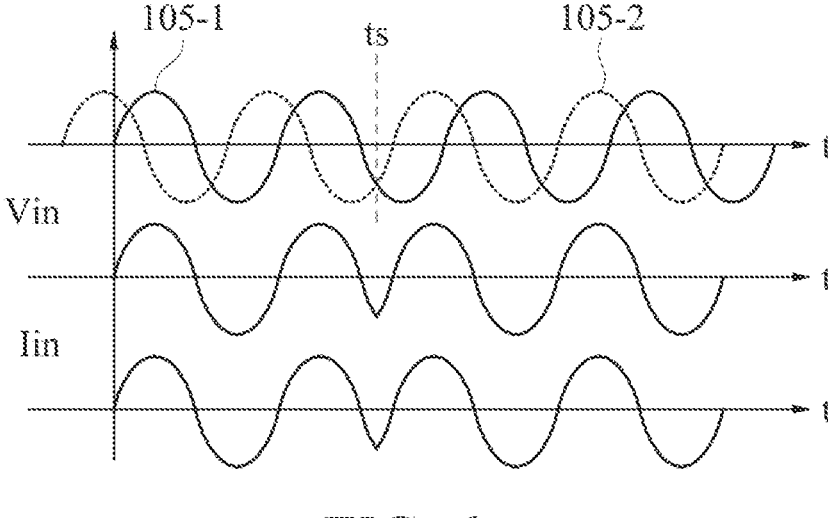
FIG. 6 is a schematic diagram of a voltage and current switching according to some embodiments of the present invention.

FIG. 5 is a schematic diagram of controlling of a switch unit according to some embodiments of the present invention. FIG. 6 is a schematic diagram of a voltage and current switching according to some embodiments of the present invention. Referring to FIG. 2, FIG. 5, FIG. 6, FIG. 38B, and FIG. 40B, in some embodiments of the present invention, the polarity half cycle is a negative half cycle, step S3703 includes the first step, and step S3705 includes the second step; and step S3704 includes a third step, and step S3706 includes a fourth step. In the first step, the control unit 103 sends a turn-off signal ("×" as shown in FIG. 38B) to a gate of the first control transistor of the power supply switch unit to turn off the first control transistor of the power supply switch unit. Because the polarity half cycle is the negative half cycle, the first control transistor of the power supply switch unit is the first transistor of the power supply switch unit. In this embodiment, the turn-off signal is a low voltage signal. As shown in FIG. 5, at a time point t1, a voltage received by a gate of the first transistor (the transistor 10111) of the power supply switch unit is a low voltage, and then the first transistor (the transistor 10111) of the power supply switch unit starts to turn off after the time point t1. In this case, because the first transistor (the transistor 10111) of the power supply switch unit is in a turn-off state, the first turn-on direction (to be specific, opposite to a direction of the negative half cycle) of the power supply switch unit is closed. It is worth noting that in this case, because the second transistor of the power supply switch unit is still turned on ("○" as shown in FIG. 38B), the second turn-on direction (to be specific, the same as a direction of the negative half cycle) of the power supply switch unit is still opened.

In the second step, the control unit 103 sends a turn-off signal ("×" as shown in FIG. 38B) to the gate of the second control transistor of the power supply switch unit to turn off the second control transistor of the power supply switch unit. Because the polarity half cycle is the negative half cycle, the second control transistor of the power supply switch unit is the second transistor of the power supply switch unit. As shown in FIG. 5, at a time point t3, a voltage received by a gate of the second transistor (the transistor 10112) of the power supply switch unit is a low voltage, and then the second transistor (the transistor 10112) of the power supply switch unit starts to turn off after the time point t3. In this case, because both the first transistor (the transistor 10111) and the second transistor (the transistor 10112) of the power supply switch unit are in the turn-off state, both the first turn-on direction and the second turn-on direction of the power supply switch unit are closed.

In the third step, the control unit 103 sends a turn-on signal ("O" as shown in FIG. 40B) to a gate of the first control transistor of the backup switch unit to turn on the first control transistor of the backup switch unit. Because the polarity half cycle is the negative half cycle, the first control transistor of the backup switch unit is the second transistor (the transistor 10122) of the backup switch unit. In this embodiment, the turn-on signal is a high voltage signal. As shown in FIG. 5, at a time point t2, a voltage received by a gate of the second transistor (the transistor 10122) of the backup switch unit is a high voltage, and then the second transistor (the transistor 10122) of the backup switch unit starts to turn on after the time point t2. In this case, because the second transistor (the transistor 10122) of the backup switch unit is in a turn-on state, the second turn-on direction (to be specific, the same as a direction of the negative half cycle) of the backup switch unit is opened. It is worth noting that in this case, because the first transistor (the transistor 10121) of the backup switch unit is still turned off ("×" as shown in FIG. 40B), the first turn-on direction of the backup switch unit is still closed.

In the fourth step, the control unit 103 sends a turn-on signal ("×" as shown in FIG. 40B) to a gate of the second control transistor of the backup switch unit to turn on the second control transistor of the backup switch unit. Because the polarity half cycle is the negative half cycle, the second control transistor of the backup switch unit is the first transistor (the transistor 10121) of the backup switch unit. As shown in FIG. 5, at a time point t4, a voltage received by a gate of the first transistor (the transistor 10121) of the backup switch unit is a high voltage, and then the first transistor (the transistor 10121) of the backup switch unit starts to turn on after the time point t4. In this case, because both the first transistor (the transistor 10121) and the second transistor (the transistor 10122) of the backup switch unit are in the turn-on state, both the first turn-on direction and the second turn-on direction of the backup switch unit are opened.

Referring to FIG. 6, because the control unit 103 receives a switching signal before a time point ts, and detects that both the power supply alternating current and the backup alternating current are in the negative half cycle at the time point ts, and a voltage difference between the power supply alternating current and the backup alternating current is less than a preset voltage, the switching control methods S3703 to S3706 are performed. It may be learnt from switching waveforms of a voltage Vin and a current Iin that the power supply is not interrupted in the switching period.

In the foregoing embodiments, both the power supply switch unit and the backup switch unit use a common source connection. However, the power supply switch unit and the backup switch unit may also respectively use a common drain connection or a common source connection. Only a turn-off sequence of the first transistor and the second transistor of the power supply switch unit and a turn-on sequence of the first transistor and the second transistor of the backup switch unit need to be accordingly adjusted. A specific implementation will be described in the following embodiments.

Figure 7:
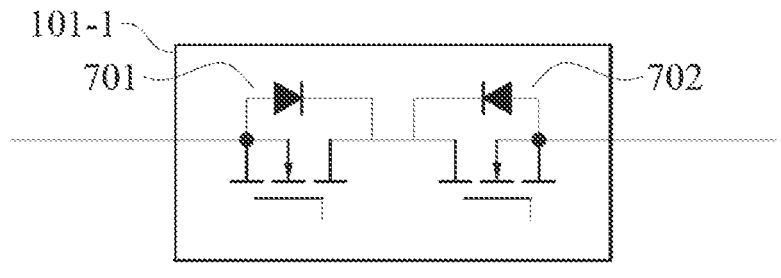
FIG. 7 is a circuit block diagram of a power supply switch unit according to some embodiments of the present invention.
Figure 8:
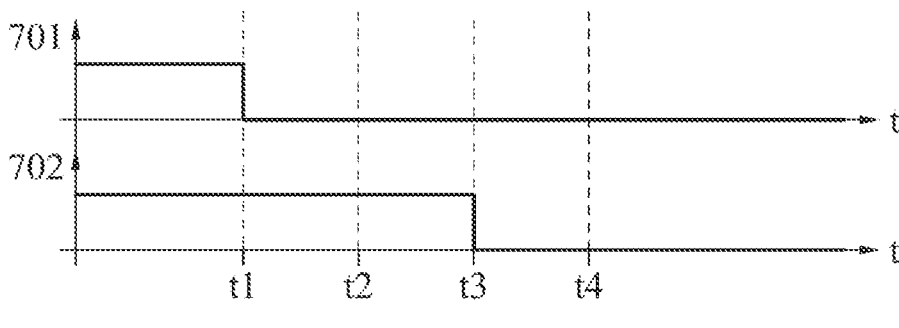
FIG. 8 is a schematic diagram of controlling of a switch unit of a positive half cycle according to some embodiments of the present invention.
Figure 9:
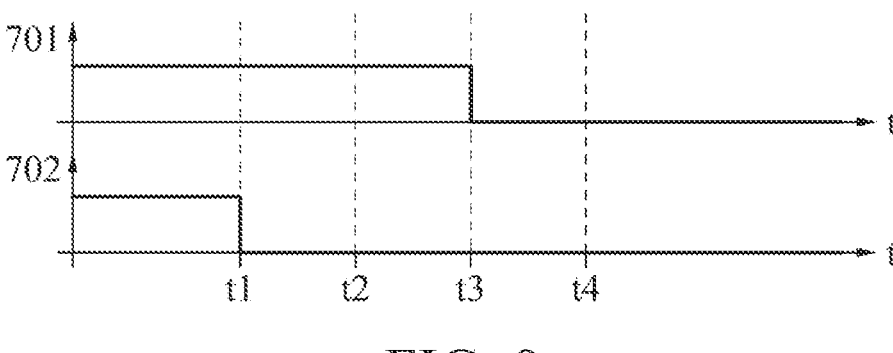
FIG. 9 is a schematic diagram of controlling of a switch unit of a negative half cycle according to some embodiments of the present invention.
Figure 39A:
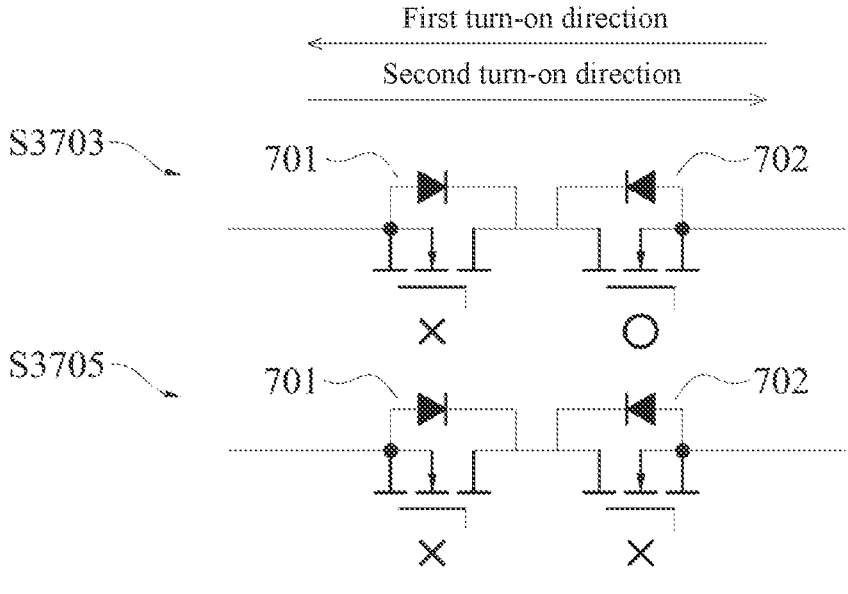
FIG. 39A and FIG. 39B are schematic diagrams of a power supply switch unit control method according to some embodiments of the present invention.
Figure 39B:
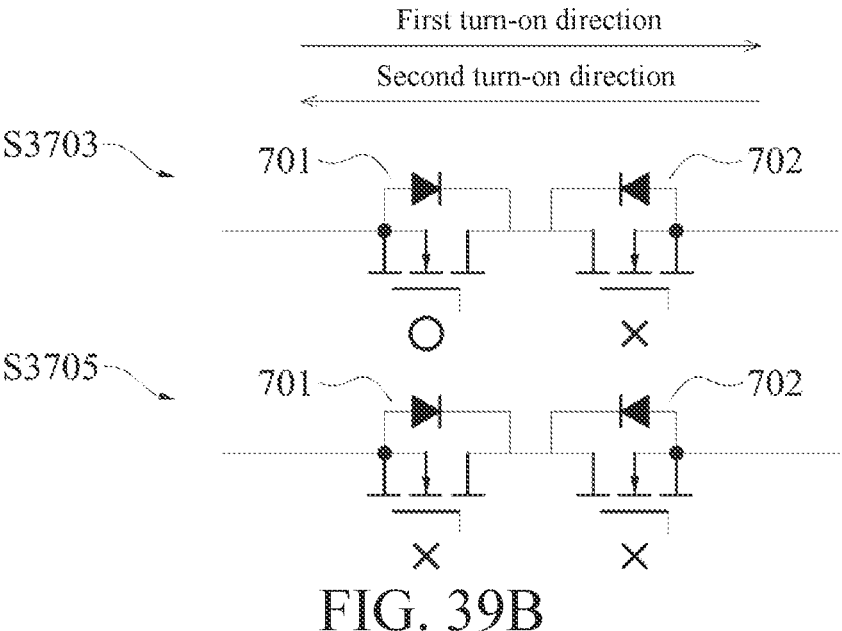

FIG. 7 is a circuit block diagram of a power supply switch unit according to some embodiments of the present invention. FIG. 8 is a schematic diagram of controlling of a switch unit of a positive half cycle according to some embodiments of the present invention. FIG. 9 is a schematic diagram of controlling of a switch unit of a negative half cycle according to some embodiments of the present invention. FIG. 39A and FIG. 39B are schematic diagrams of a power supply switch unit control method according to some embodiments of the present invention. Referring to FIG. 7, FIG. 8, FIG. 9, FIG. 39A, and FIG. 39B, in some embodiments of the present invention, the power supply switch unit (the switch unit 101-1) includes a transistor 701 (also referred to as a first transistor of the power supply switch unit below) and a transistor 702 (also referred to as a second transistor of the power supply switch unit below); and Both the first transistor (the transistor 701) and the second transistor (the transistor 702) of the power supply switch unit each are an NMOS. In addition, a source of the first transistor of the power supply switch unit receives the power supply alternating current, a drain of the first transistor of the power supply switch unit is connected to a drain of the second transistor of the power supply switch unit. A source of the second transistor of the power supply switch unit is connected to the load (a connection method for the first transistor (the transistor 701) and the second transistor (the transistor 702) of the power supply switch unit is referred to as a common drain connection).

If the power supply switch unit uses the common drain connection, step S3703 includes a first step, and step S3705 includes a second step (the first step and the second step are only used to distinguish various steps, and do not have significance in sequence).

When the polarity half cycle is the positive half cycle, in the first step, the control unit 103 sends a turn-off signal ("×" as shown in FIG. 39A) to a gate of the first control transistor of the power supply switch unit to turn off the first control transistor of the power supply switch unit. Because the polarity half cycle is the positive half cycle, the first control transistor of the power supply switch unit is the first transistor of the power supply switch unit. In this embodiment, the turn-off signal is a low voltage signal. As shown in FIG. 8, at a time point t1, a voltage received by a gate of the first transistor (the transistor 701) of the power supply switch unit is a low voltage, and then the first transistor (the transistor 701) of the power supply switch unit starts to turn off after the time point t1. In this case, because the first transistor (the transistor 701) of the power supply switch unit is in a turn-off state, the first turn-on direction (to be specific, opposite to a direction of the positive half cycle) of the power supply switch unit is closed. It is worth noting that in this case, because the second transistor of the power supply switch unit is still turned on ("O" as shown in FIG. 39A), the second turn-on direction of the power supply switch unit is still opened. In the second step, the control unit 103 sends a turn-off signal to the gate of the second control transistor of the power supply switch unit to turn off the second control transistor of the power supply switch unit. Because the polarity half cycle is the positive half cycle, the second control transistor of the power supply switch unit is the second transistor of the power supply switch unit. As shown in FIG. 8, at a time point t3, a voltage received by a gate of the second transistor (the transistor 702) of the power supply switch unit is a low voltage, and then the second transistor (the transistor 702) of the power supply switch unit starts to turn off after the time point t3. In this case, because both the first transistor (the transistor 701) and the second transistor (the transistor 702) of the power supply switch unit are in the turn-off state, both the first turn-on direction and the second turn-on direction of the power supply switch unit are closed.

When the polarity half cycle is the negative half cycle, in the first step, the control unit 103 sends a turn-off signal ("×" as shown in FIG. 39B) to a gate of the first control transistor of the power supply switch unit to turn off the first control transistor of the power supply switch unit. Because the polarity half cycle is the negative half cycle, the first control transistor of the power supply switch unit is the second transistor of the power supply switch unit. As shown in FIG. 9, at a time point t1, a voltage received by a gate of the second transistor (the transistor 702) of the power supply switch unit is a low voltage, and then the second transistor (the transistor 702) of the power supply switch unit starts to turn off after the time point t1. In this case, because the second transistor (the transistor 702) of the power supply switch unit is in a turn-off state, the first turn-on direction (to be specific, opposite to a direction of the negative half cycle) of the power supply switch unit is closed. It is worth noting that in this case, because the first transistor of the power supply switch unit is still turned on ("○" as shown in FIG. 39B), the second turn-on direction of the power supply switch unit is still opened. In the second step, the control unit 103 sends a turn-off signal ("×" as shown in FIG. 39B) to the gate of the second control transistor of the power supply switch unit to turn off the second control transistor of the power supply switch unit. Because the polarity half cycle is the negative half cycle, the second control transistor of the power supply switch unit is the first transistor of the power supply switch unit. As shown in FIG. 9, at a time point t3, a voltage received by a gate of the first transistor (the transistor 701) of the power supply switch unit is a low voltage, and then the first transistor (the transistor 701) of the power supply switch unit starts to turn off after the time point t3. In this case, because both the first transistor (the transistor 701) and the second transistor (the transistor 702) of the power supply switch unit are in the turn-off state, both the first turn-on direction and the second turn-on direction of the power supply switch unit are closed.

Figure 41A:
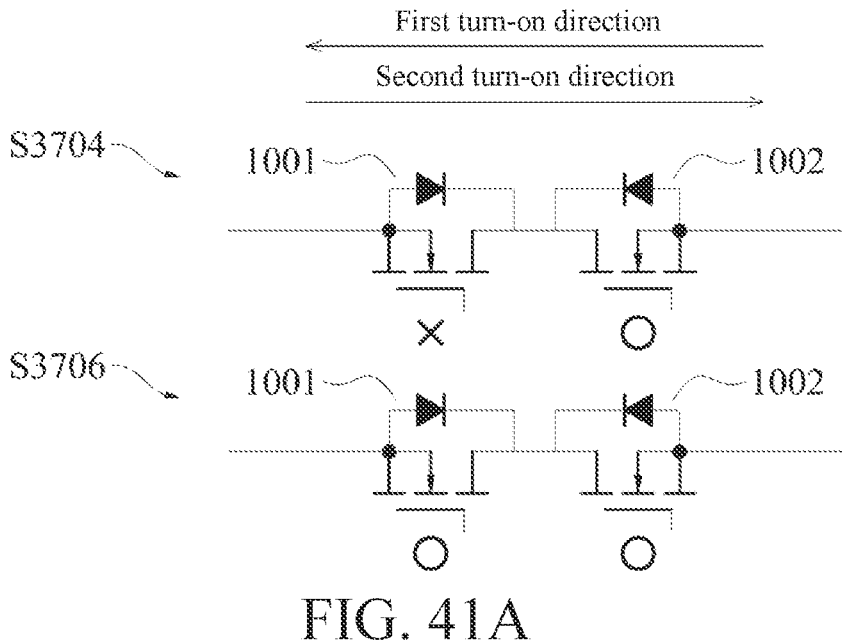
FIG. 41A and FIG. 41B are schematic diagrams of a power supply switch unit control method according to some embodiments of the present invention.
Figure 41B:
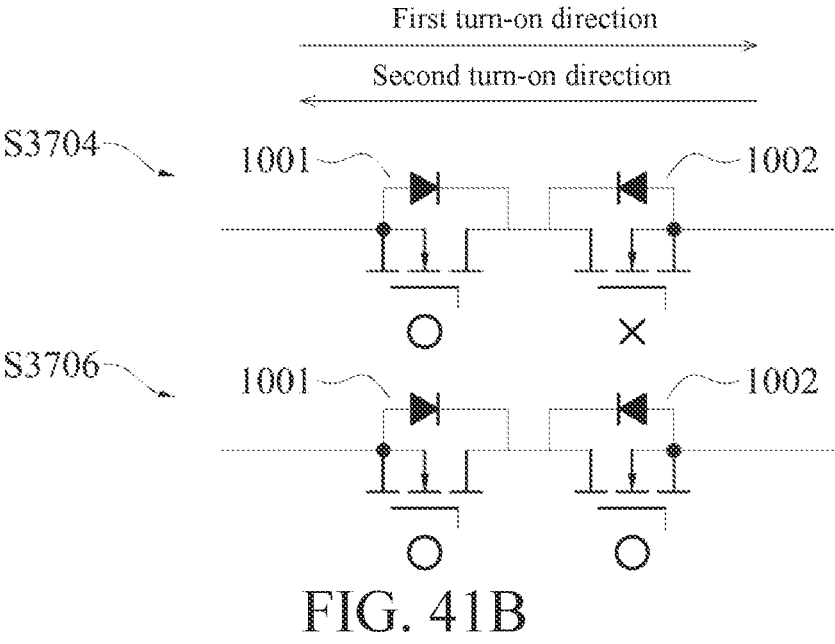

FIG. 10 is a circuit block diagram of a backup switch unit according to some embodiments of the present invention. FIG. 11 is a schematic diagram of controlling of a switch unit of a positive half cycle according to some embodiments of the present invention. FIG. 12 is a schematic diagram of controlling of a switch unit of a negative half cycle according to some embodiments of the present invention. FIG. 41A and FIG. 41B are schematic diagrams of a power supply switch unit control method according to some embodiments of the present invention. Referring to FIG. 10, FIG. 11, FIG. 12, FIG. 41A, and FIG. 41B, in some embodiments of the present invention, the backup switch unit (the switch unit 101-2) includes a transistor 1001 (also referred to as a first transistor of the backup switch unit below) and a transistor 1002 (also referred to as a second transistor of the backup switch unit below); and Both the first transistor (the transistor 1001) and the second transistor (the transistor 1002) of the backup switch unit each are an NMOS. A source of the first transistor of the backup switch unit receives the power supply alternating current, a drain of the first transistor of the backup switch unit is connected to a drain of the second transistor of the backup switch unit, and a source of the second transistor of the backup switch unit is connected to the load (in other words, in this embodiment, the backup switch unit uses a common drain connection).

If the backup switch unit uses the common drain connection, step S3704 includes a first step, and step S3706 includes a second step (the first step and the second step are only used to distinguish various steps, and do not have significance in sequence).

When the polarity half cycle is the positive half cycle, in the first step, the control unit 103 sends a turn-on signal ("○" as shown in FIG. 41A) to a gate of the first control transistor of the backup switch unit to turn on the first control transistor of the backup switch unit. Because the polarity half cycle is the positive half cycle, the first control transistor of the backup switch unit is the second transistor of the backup switch unit. In this embodiment, the turn-on signal is a high voltage signal. As shown in FIG. 11, at a time point t2, a voltage received by a gate of the second transistor (the transistor 1002) of the backup switch unit is a high voltage, and then the second transistor (the transistor 1002) of the backup switch unit starts to turn on after the time point t2. In this case, because the second transistor (the transistor 1002) of the backup switch unit is in a turn-on state, the second turn-on direction (to be specific, the same as a direction of the positive half cycle) of the backup switch unit is opened. It is worth noting that in this case, because the first transistor (the transistor 1001) of the backup switch unit is still turned off ("×" as shown in FIG. 41A), the first turn-on direction of the backup switch unit is still closed. In the second step, the control unit 103 sends a turn-on signal to a gate of the second control transistor of the backup switch unit to turn on the second control transistor of the backup switch unit. Because the polarity half cycle is the positive half cycle, the second control transistor of the backup switch unit is the first transistor (the transistor 1001) of the backup switch unit. As shown in FIG. 11, at a time point t4, a voltage received by a gate of the first transistor (the transistor 1001) of the backup switch unit is a high voltage, and then the first transistor (the transistor 1001) of the backup switch unit starts to turn on after the time point t4. In this case, because both the first transistor (the transistor 1001) and the second transistor (the transistor 1002) of the backup switch unit are in the turn-on state, both the first turn-on direction and the second turn-on direction of the backup switch unit are opened.

When the polarity half cycle is the negative half cycle, in the first step, the control unit 103 sends a turn-on signal ("○" as shown in FIG. 41B) to a gate of the first control transistor of the backup switch unit to turn on the first control transistor of the backup switch unit. Because the polarity half cycle is the negative half cycle, the first control transistor of the backup switch unit is the first transistor (the transistor 1001) of the backup switch unit. As shown in FIG. 12, at a time point t2, a voltage received by a gate of the first transistor (the transistor 1001) of the backup switch unit is a high voltage, and then the first transistor (the transistor 1001) of the backup switch unit starts to turn on after the time point t2. In this case, because the first transistor (the transistor 1001) of the backup switch unit is in a turn-on state, the second turn-on direction (to be specific, the same as a direction of the negative half cycle) of the backup switch unit is opened. It is worth noting that in this case, because the second transistor (the transistor 1002) of the backup switch unit is still turned off ("×" as shown in FIG. 41B), the first turn-on direction of the backup switch unit is still closed. In the second step, the control unit 103 sends a turn-on signal to a gate of the second control transistor of the backup switch unit to turn on the second control transistor of the backup switch unit. Because the polarity half cycle is the negative half cycle, the second control transistor of the backup switch unit is the second transistor (the transistor 1002) of the backup switch unit. As shown in FIG. 12, at a time point t4, a voltage received by a gate of the second transistor (the transistor 1002) of the backup switch unit is a high voltage, and then the second transistor (the transistor 1002) of the backup switch unit starts to turn on after the time point t4. In this case, because both the first transistor (the transistor 1001) and the second transistor (the transistor 1002) of the backup switch unit are in the turn-on state, both the first turn-on direction and the second turn-on direction of the backup switch unit are opened.

When the power supply switch unit and the backup switch unit are implemented, a common source connection or a common drain connection may be respectively used, provided that the turn-off sequence of the first transistor and the second transistor of the power supply switch unit and the turn-on sequence of the first transistor and the second transistor of the backup switch unit described in the foregoing embodiments are used. The following describes an operation process of the switching control system 100 by using an embodiment when the power supply switch unit uses the common drain connection, the backup switch unit uses the common source connection, and the polarity half cycle is the positive half cycle.

Figure 13:
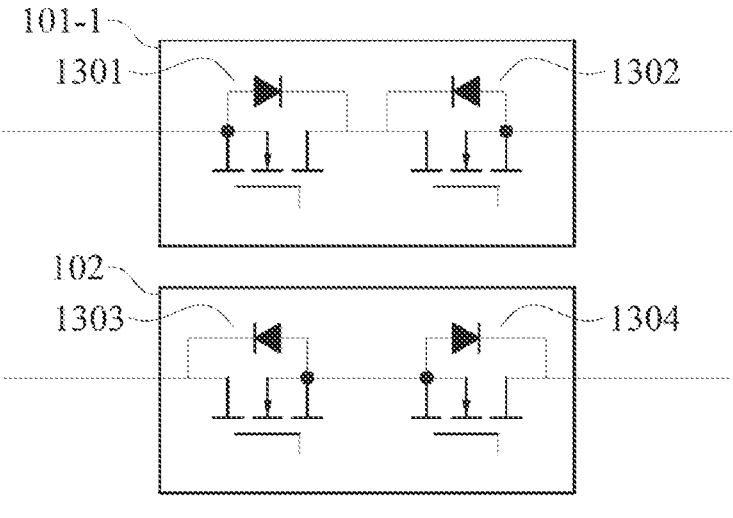
FIG. 13 is a circuit block diagram of a power supply switch unit and a backup switch unit according to some embodiments of the present invention.
Figure 14:
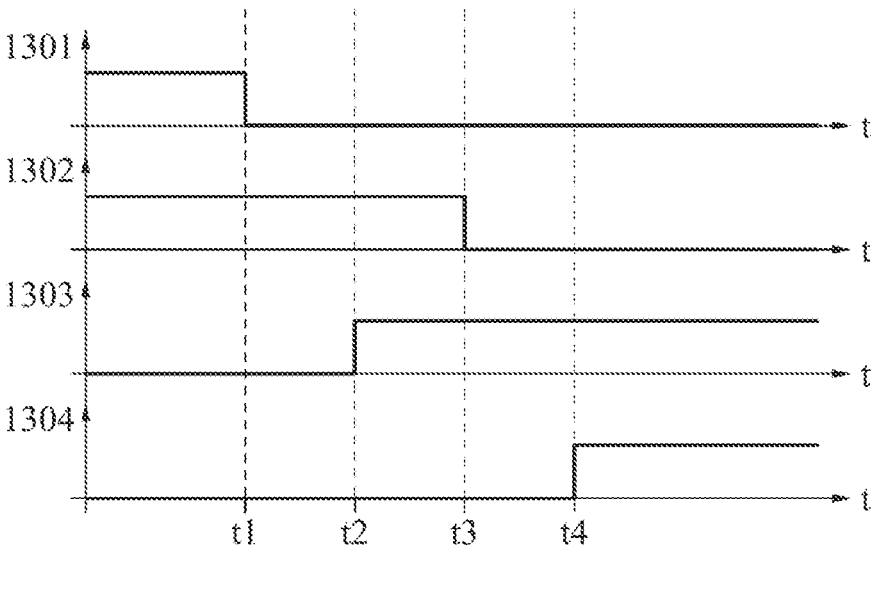
FIG. 14 is a schematic diagram of controlling of a switch unit according to some embodiments of the present invention.

FIG. 13 is a circuit block diagram of a power supply switch unit and a backup switch unit according to some embodiments of the present invention. FIG. 14 is a schematic diagram of controlling of a switch unit according to some embodiments of the present invention. Referring to both FIG. 13 and FIG. 14, in some embodiments of the present invention, the polarity half cycle is the positive half cycle. Both the first transistor (the transistor 1301) and the second transistor (the transistor 1302) of the power supply switch unit each are an NMOS, the common drain connection is used. Both the first transistor (the transistor 1303) and the second transistor (the transistor 1304) of the backup switch unit each are an NMOS, the common source connection is used.

As shown in FIG. 14, because the polarity half cycle is the positive half cycle, the power supply switch unit uses the common drain connection, and the backup switch unit uses the common source connection, the control signals of the first transistor (the transistor 1301) and the second transistor (the transistor 1302) of the power supply switch unit are the same as the control signals shown in FIG. 8. The control signals of the first transistor (the transistor 1303) and the second transistor (the transistor 1304) of the backup switch unit are the same as the control signals of the transistor 10121 and the transistor 10122 in FIG. 3.

Figure 15:
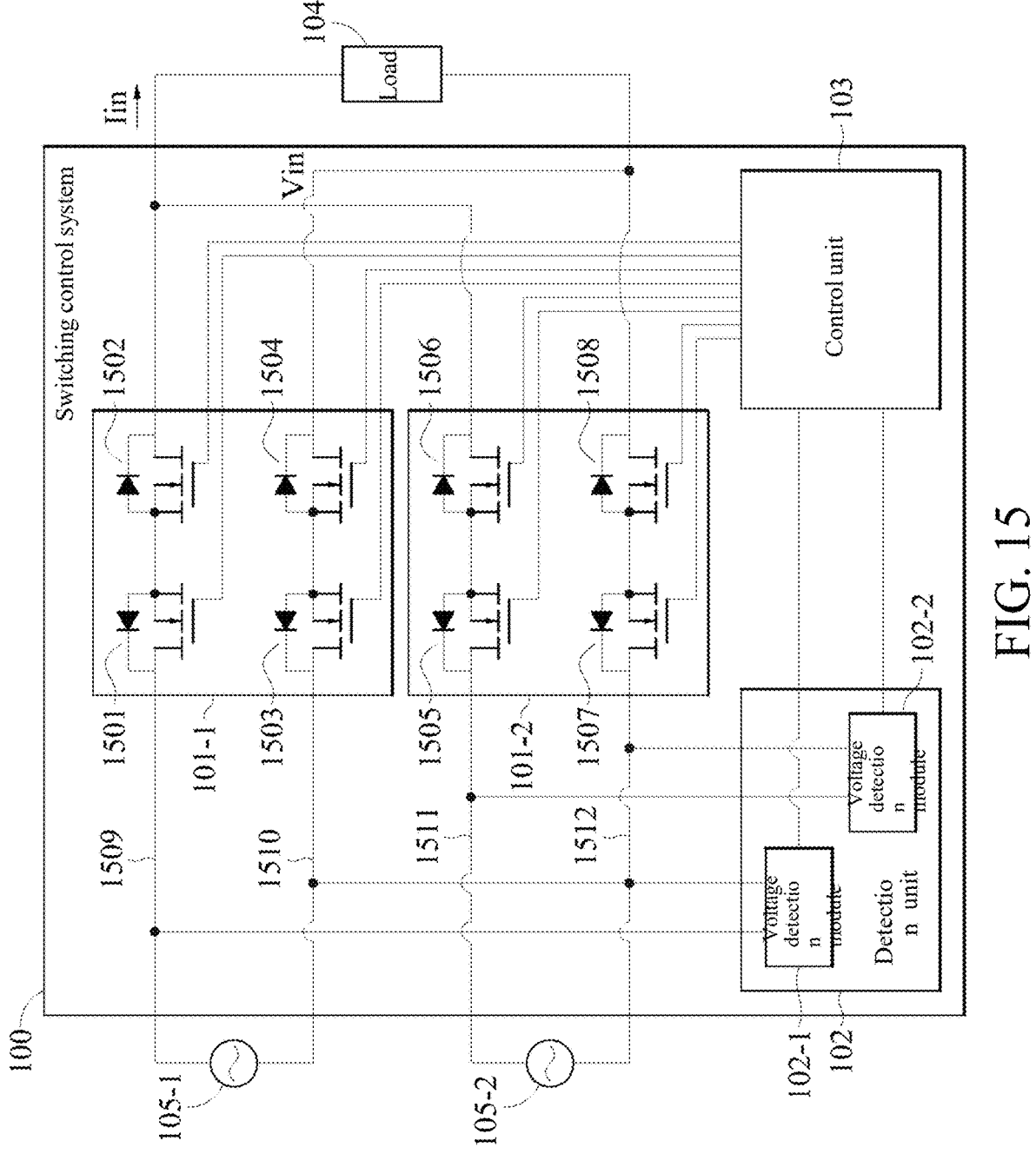
FIG. 15 is a circuit block diagram of a switching control system according to some embodiments of the present invention.

FIG. 15 is a circuit block diagram of a switching control system according to some embodiments of the present invention. Refer to both FIG. 1 and FIG. 15. In the embodiment shown in FIG. 15, compared with FIG. 2, the switching control system 100 receives the alternating current 105-1 from the outside as the power supply alternating current, and receives the alternating current 105-2 from the outside as the backup alternating current; and the switching control system 100 includes a first phase line 1509, a first neutral line 1510, a second phase line 1511, and a second neutral line 1512. The first phase line 1509 and the first neutral line 1510 are configured to receive the power supply alternating current, and the second phase line 1511 and the second neutral line 1512 are configured to receive the backup alternating current.

In this embodiment, the detection unit 102 includes a voltage detection module 102-1 and a voltage detection module 102-2. The voltage detection module 102-1 is configured to detect a voltage of the alternating current 105-1, and the voltage detection module 102-2 is configured to detect a voltage of the alternating current 105-2.

The power supply switch unit (the switch unit 101-1) includes a transistor 1501 (also referred to as the first transistor of the power supply switch unit below), a transistor 1502 (also referred to as the second transistor of the power supply switch unit below), a transistor 1503 (also referred to as the third transistor of the power supply switch unit below), and a transistor 1504 (also referred to as the fourth transistor of the power supply switch unit below). The first transistor and the second transistor of the power supply switch unit are located on the first phase line 1509 and are connected in reverse series. The third transistor and the fourth transistor of the power supply switch unit are located on the first neutral line 1510 and are connected in reverse series. The backup switch unit (the switch unit 101-2) includes a transistor 1505 (also referred to as the first transistor of the backup switch unit below), a transistor 1506 (also referred to as the second transistor of the backup switch unit below), a transistor 1507 (also referred to as the third transistor of the backup switch unit below), and a transistor 1508 (also referred to as the fourth transistor of the backup switch unit below). The first transistor and the second transistor of the backup switch unit are located on the second phase line 1511 and are connected in reverse series. The third transistor and the fourth transistor of the backup switch unit are located on the second neutral line 1512 and are connected in reverse series.

Figure 16:
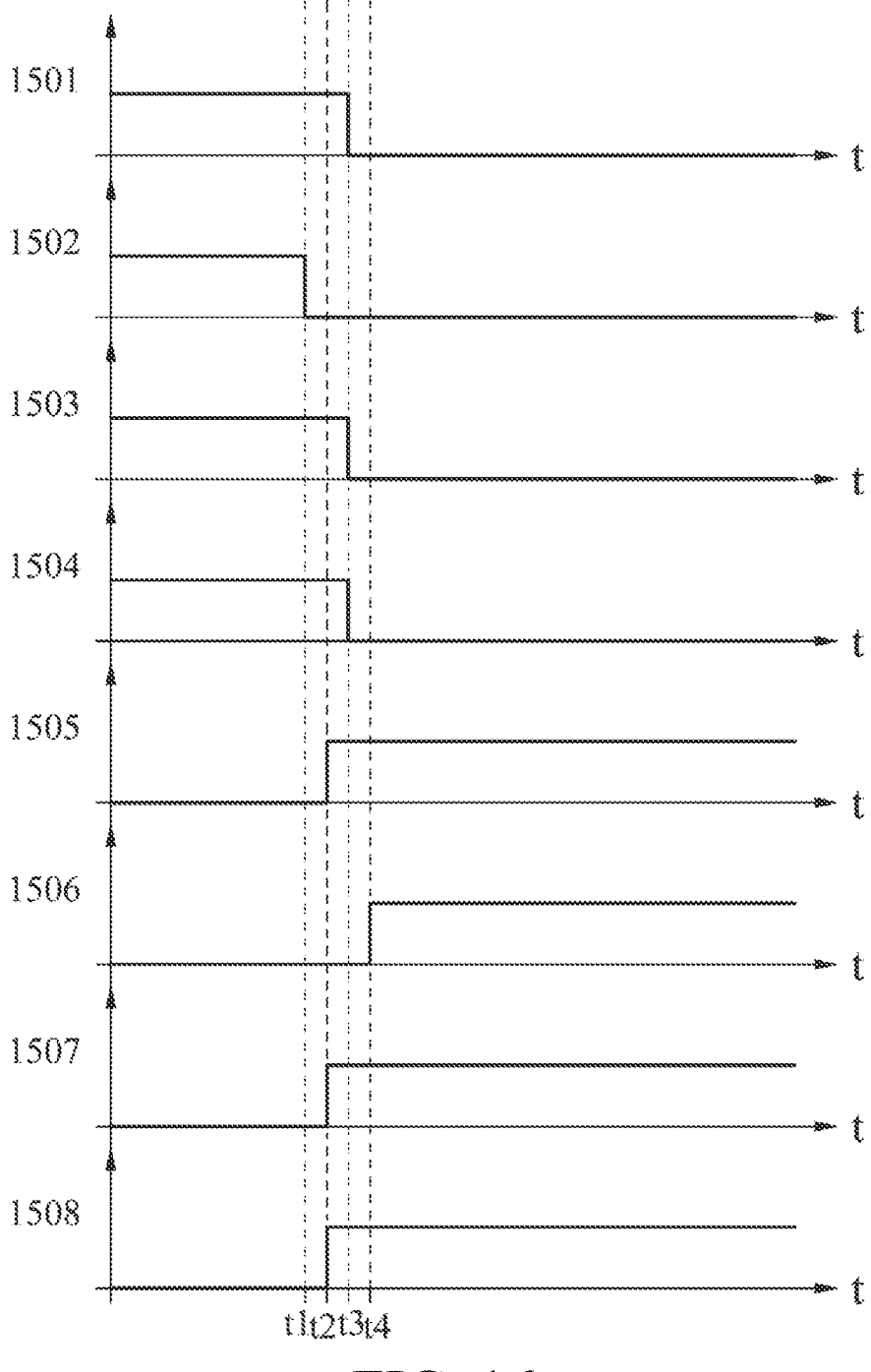
FIG. 16 is a schematic diagram of controlling of a switch unit according to some embodiments of the present invention.
Figure 42A:
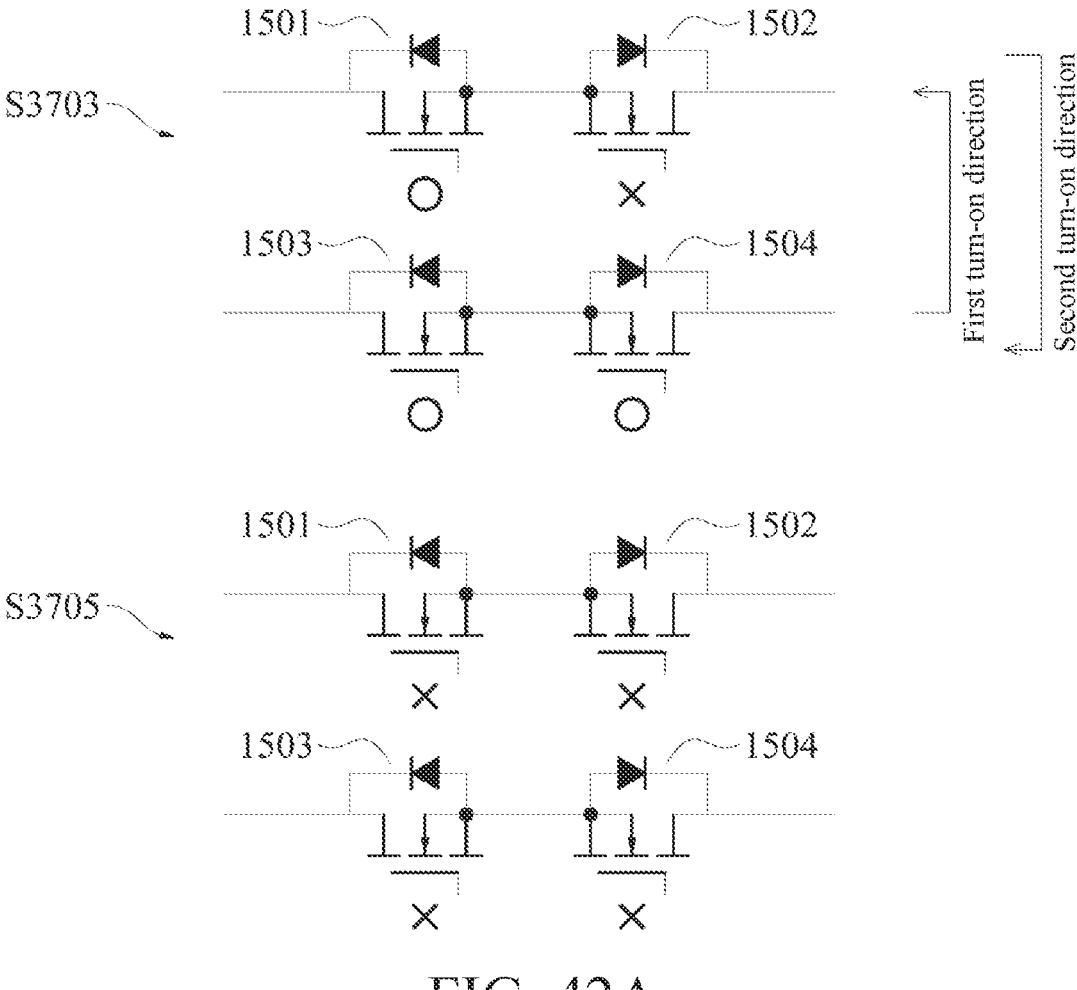
FIG. 42A and FIG. 42B are schematic diagrams of a power supply switch unit control method according to some embodiments of the present invention.
Figure 42B:
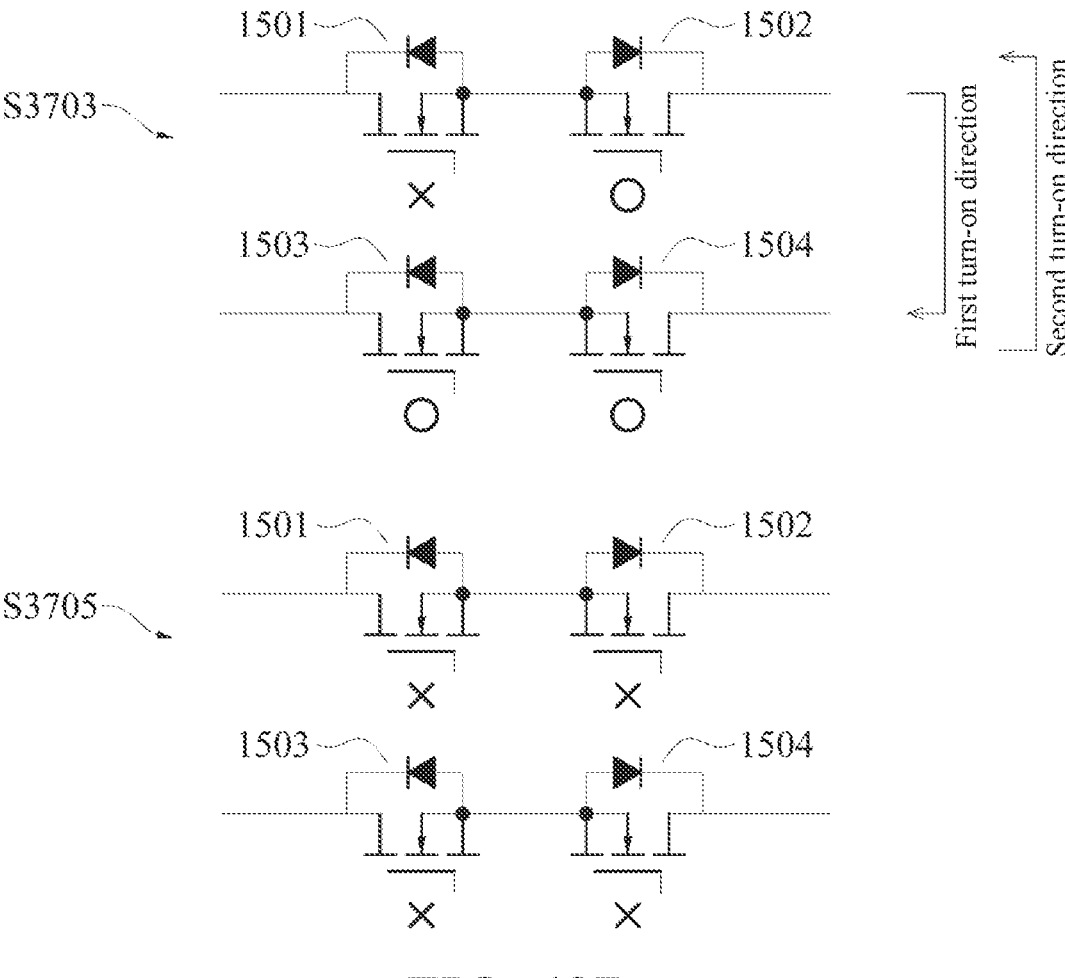
Figure 46A:
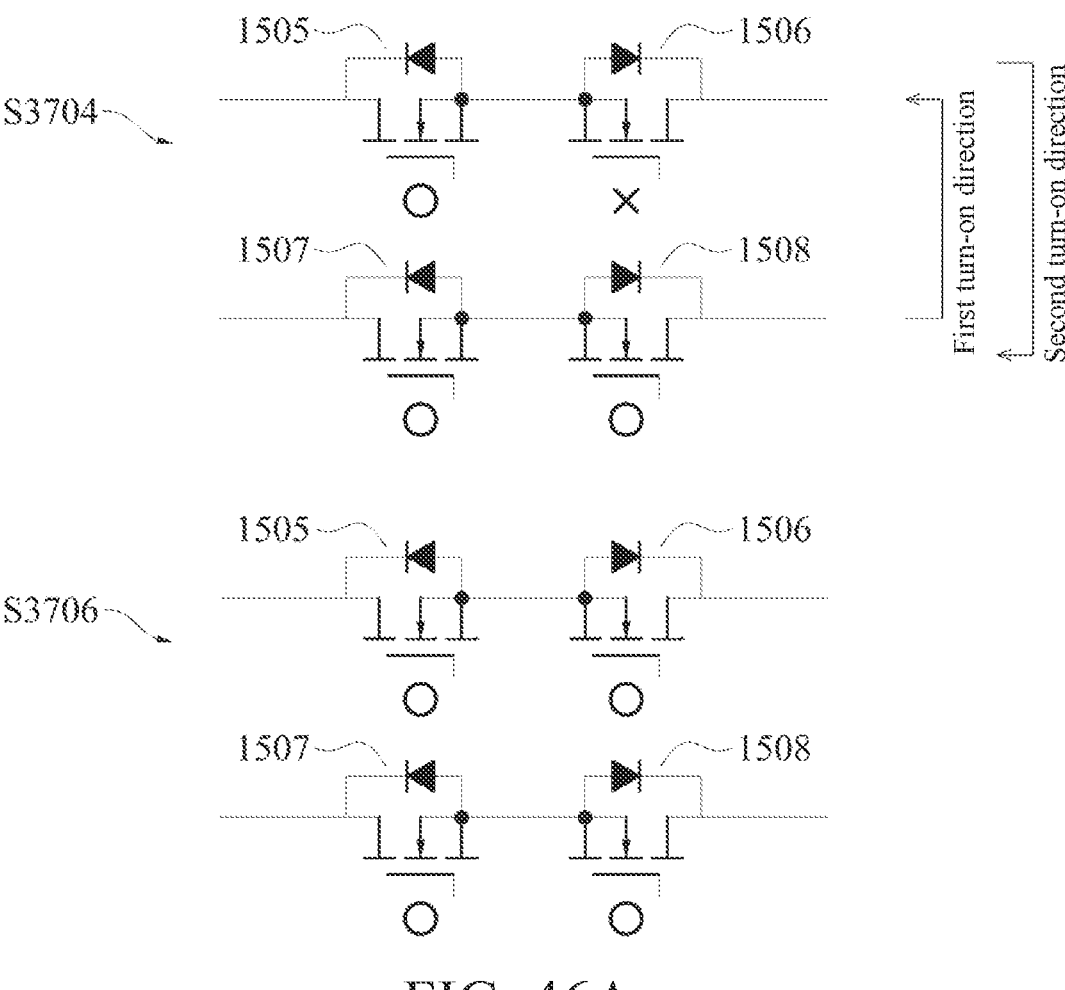
FIG. 46A and FIG. 46B are schematic diagrams of a backup switch unit control method according to some embodiments of the present invention.
Figure 46B:
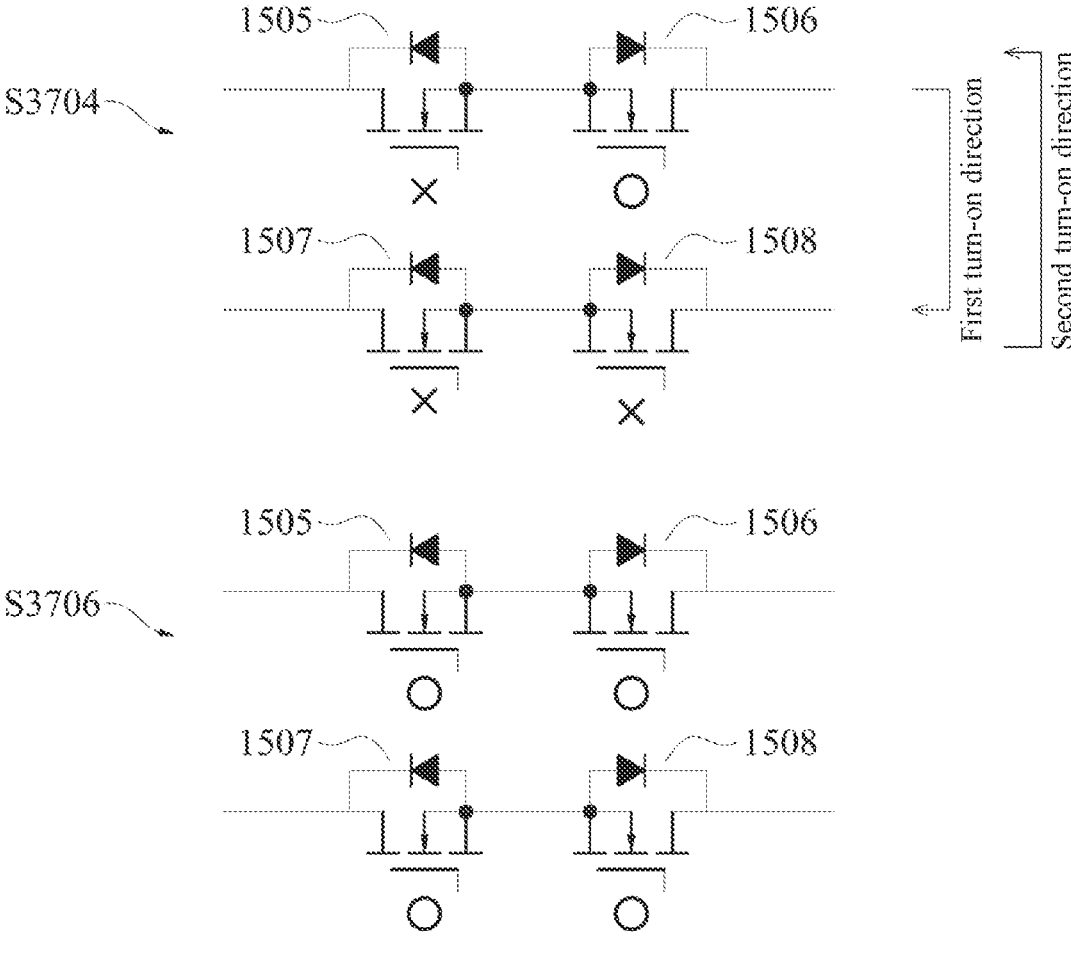

FIG. 16 is a schematic diagram of controlling of a switch unit according to some embodiments of the present invention. FIG. 42A and FIG. 42B are schematic diagrams of a power supply switch unit control method according to some embodiments of the present invention. FIG. 46A and FIG. 46B are schematic diagrams of a backup switch unit control method according to some embodiments of the present invention. Referring to FIG. 2, FIG. 16, FIG. 42A, and FIG. 46A, in some embodiments of the present invention, the polarity half cycle is the positive half cycle. The first transistor (the transistor 1501), the second transistor (the transistor 1502), the third transistor (the transistor 1503), and the fourth transistor (the transistor 1504) of the power supply switch unit each are an NMOS, and the first transistor (transistor 1501) and the second transistor (transistor 1502) of the power supply switch unit are connected in a common source connection manner; and the third transistor (the transistor 1503) and the fourth transistor (the transistor 1504) of the power supply switch unit are connected in a common source connection manner. The first transistor (the transistor 1505), the second transistor (the transistor 1506), the third transistor (the transistor 1507), and the fourth transistor (the transistor 1508) of the backup switch unit each are an NMOS, and the first transistor (transistor 1505) and the second transistor (transistor 1506) of the backup switch unit are connected in a common source connection manner; and the third transistor (the transistor 1507) and the fourth transistor (the transistor 1508) of the backup switch unit are connected in a common source connection manner.

In this embodiment, step S3703 includes a first step, and step S3705 includes a second step; and step S3704 includes a third step, and step S3706 includes a fourth step (the first step, the second step, the third step, and the fourth step are only used to distinguish various steps, and do not have significance in sequence). In the first step, the control unit 103 sends a turn-off signal ("×" as shown in FIG. 42A) to a gate of the first control transistor of the power supply switch unit. Because the polarity half cycle is the positive half cycle, the first control transistor of the power supply switch unit is the second transistor of the power supply switch unit. In this embodiment, the turn-off signal is a low voltage signal. As shown in FIG. 16, at a time point t1, a voltage received by a gate of the second transistor (the transistor 1502) of the power supply switch unit is a low voltage, and then the second transistor (the transistor 1502) of the power supply switch unit starts to turn off after the time point t1. In this case, because the second transistor (the transistor 1502) of the power supply switch unit is in a turn-off state, the first turn-on direction (to be specific, opposite to a direction of the positive half cycle) of the power supply switch unit is closed. It is worth noting that in this case, because the first transistor, the third transistor, and the fourth transistor of the power supply switch unit are still turned on ("O" as shown in FIG. 42A), the second turn-on direction of the power supply switch unit is still opened.

In the second step, the control unit 103 sends a turn-off signal ("×" as shown in FIG. 42A) to a gate of each of a plurality of second control transistors of the power supply switch unit. Because the polarity half cycle is the positive half cycle, the second control transistor of the power supply switch unit is the first control transistor (the transistor 1501), the third transistor (the transistor 1503), and the fourth transistor (the transistor 1504) of the power supply switch unit. As shown in FIG. 16, at a time point t3, voltages received by gates of the first transistor (the transistor 1501), the third transistor (the transistor 1503), and the fourth transistor (the transistor 1504) of the power supply switch unit are low voltages, and then the first transistor (the transistor 1501), the second transistor (the transistor 1502), the third transistor (the transistor 1503), and the fourth transistor (the transistor 1504) of the power supply switch unit start to turn off after the time point t3. In this case, because the first transistor (the transistor 1501), the second transistor (the transistor 1502), the third transistor (the transistor 1503), and the fourth transistor (the transistor 1504) of the power supply switch unit are all in the turn-off state, both the first turn-on direction and the second turn-on direction of the power supply switch unit are closed.

In the third step, the control unit 103 sends a turn-on signal ("O" as shown in FIG. 46A) to a gate of each of a plurality of first control transistors of the backup switch unit. Because the polarity half cycle is the positive half cycle, the first control transistor of the backup switch unit is the first control transistor (the transistor 1505), the third transistor (the transistor 1507), and the fourth transistor (the transistor 1508) of the backup switch unit. In this embodiment, the turn-on signal is a high voltage signal. As shown in FIG. 16, at a time point t2, voltages received by gates of the first control transistor (the transistor 1505), the third transistor (the transistor 1507), and the fourth transistor (the transistor 1508) of the backup switch unit are high voltages, and then the first transistor (the transistor 1505), the third transistor (the transistor 1507), and the fourth transistor (the transistor 1508) of the backup switch unit start to turn on after the time point t2. In this case, because the first transistor (the transistor 1505), the third transistor (the transistor 1507), and the fourth transistor (the transistor 1508) of the backup switch unit are in a turn-on state, the second turn-on direction (to be specific, the same as a direction of the positive half cycle) of the backup switch unit is opened. It is worth noting that in this case, because the second transistor (the transistor 1506) of the backup switch unit is still turned off ("×" as shown in FIG. 46A), the first turn-on direction of the backup switch unit is still closed.

In the fourth step, the control unit 103 sends a turn-on signal ("O" as shown in FIG. 46A) to a gate of the second control transistor of the backup switch unit. Because the polarity half cycle is the positive half cycle, the second control transistor of the backup switch unit is the second transistor (the transistor 1506) of the backup switch unit. As shown in FIG. 16, at a time point t4, a voltage received by a gate of the second transistor (the transistor 1506) of the backup switch unit is a high voltage, and then the second transistor (the transistor 1506) of the backup switch unit starts to turn on after the time point t4. In this case, because the first transistor (the transistor 1505), the second transistor (the transistor 1506), the third transistor (the transistor 1507), and the fourth transistor (the transistor 1508) of the backup switch unit are all in the turn-on state, both the first turn-on direction and the second turn-on direction of the backup switch unit are opened.

Figure 17:
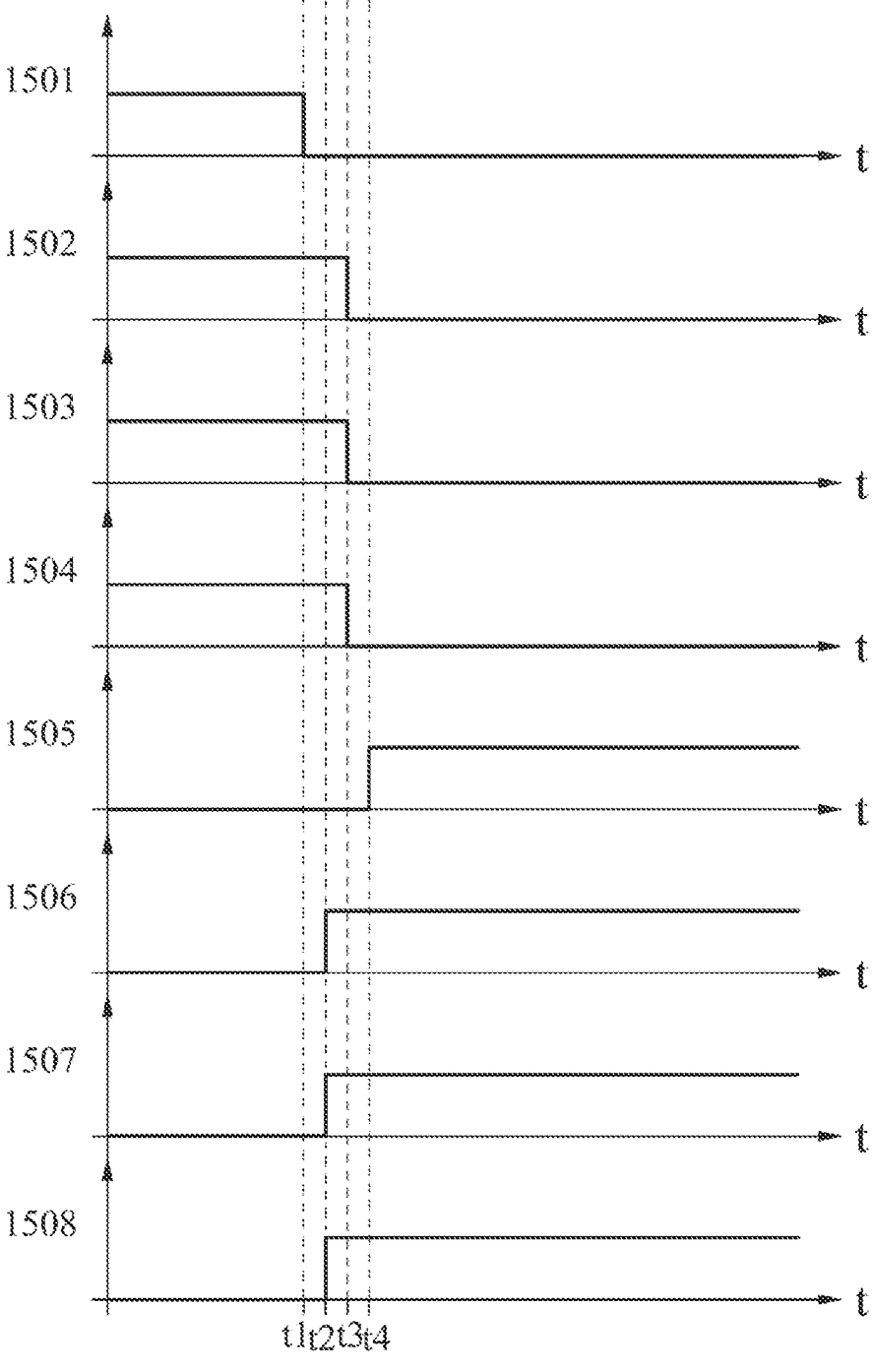
FIG. 17 is a schematic diagram of controlling of a switch unit according to some embodiments of the present invention.

FIG. 17 is a schematic diagram of controlling of a switch unit according to some embodiments of the present invention. Referring to FIG. 2, FIG. 17, FIG. 42B, and FIG. 46B, in some embodiments of the present invention, the polarity half cycle is the negative half cycle. In this embodiment, step S3703 includes a first step, and step S3705 includes a second step; and step S3704 includes a third step, and step S3706 includes a fourth step (the first step, the second step, the third step, and the fourth step are only used to distinguish various steps, and do not have significance in sequence). In the first step, the control unit 103 sends a turn-off signal ("×" as shown in FIG. 42B) to a gate of the first control transistor of the power supply switch unit. Because the polarity half cycle is the negative half cycle, the first control transistor of the power supply switch unit is the first transistor of the power supply switch unit. In this embodiment, the turn-off signal is a low voltage signal. As shown in FIG. 17, at a time point t1, a voltage received by a gate of the first transistor (the transistor 1501) of the power supply switch unit is a low voltage, and then the first transistor (the transistor 1501) of the power supply switch unit starts to turn off after the time point t1. In this case, because the first transistor (the transistor 1501) of the power supply switch unit is in a turn-off state, the first turn-on direction (to be specific, opposite to a direction of the negative half cycle) of the power supply switch unit is closed. It is worth noting that in this case, because the second transistor, the third transistor, and the fourth transistor of the power supply switch unit are still turned on ("O" as shown in FIG. 42B), the second turn-on direction (to be specific, the same as a direction of the negative half cycle) of the power supply switch unit is still opened.

In the second step, the control unit 103 sends a turn-off signal ("×" as shown in FIG. 42B) to a gate of each of a plurality of second control transistors of the power supply switch unit. Because the polarity half cycle is the negative half cycle, a plurality of second control transistors of the power supply switch unit are the second control transistor, the third transistor, and the fourth transistor of the power supply switch unit. In this embodiment, the turn-off signal is a low voltage signal. As shown in FIG. 17, at a time point t3, voltages received by gates of the second transistor (the transistor 1502), the third transistor (the transistor 1503), and the fourth transistor (the transistor 1504) of the power supply switch unit are low voltages, and then the second transistor (the transistor 1502), the third transistor (the transistor 1503), and the fourth transistor (the transistor 1504) of the power supply switch unit start to turn off after the time point t3. In this case, because the first transistor (the transistor 1501), the second transistor (the transistor 1502), the third transistor (the transistor 1503), and the fourth transistor (the transistor 1504) of the power supply switch unit are all in the turn-off state, both the first turn-on direction and the second turn-on direction of the power supply switch unit are closed.

In the third step, the control unit 103 sends a turn-on signal ("O" as shown in FIG. 46B) to a gate of each of a plurality of first control transistors of the backup switch unit. Because the polarity half cycle is the negative half cycle, the first control transistor of the backup switch unit is the second transistor (the transistor 1506), the third transistor (the transistor 1507), and the fourth transistor (the transistor 1508) of the backup switch unit. In this embodiment, the turn-on signal is a high voltage signal. As shown in FIG. 17, at a time point t2, voltages received by gates of the second transistor (the transistor 1506), the third transistor (the transistor 1507), and the fourth transistor (the transistor 1508) of the backup switch unit are high voltages, and then the second transistor (the transistor 1506), the third transistor (the transistor 1507), and the fourth transistor (the transistor 1508) of the backup switch unit start to turn on after the time point t2. In this case, because the second transistor (the transistor 1506), the third transistor (the transistor 1507), and the fourth transistor (the transistor 1508) of the backup switch unit are in a turn-on state, the second turn-on direction (to be specific, the same as a direction of the negative half cycle) of the backup switch unit is opened. It is worth noting that in this case, because the first transistor (the transistor 1505) of the backup switch unit is still turned off ("×" as shown in FIG. 46B), the first turn-on direction of the backup switch unit is still closed.

In the fourth step, the control unit 103 sends a turn-on signal ("O" as shown in FIG. 46B) to a gate of the second control transistor of the backup switch unit. Because the polarity half cycle is the negative half cycle, the second control transistor of the backup switch unit is the first transistor (the transistor 1505) of the backup switch unit. As shown in FIG. 17, at a time point t4, a voltage received by a gate of the first transistor (the transistor 1505) of the backup switch unit is a high voltage, and then the first transistor (the transistor 1505) of the backup switch unit starts to turn on after the time point t4. In this case, because the first transistor (the transistor 1505), the second transistor (the transistor 1506), the third transistor (the transistor 1507), and the fourth transistor (the transistor 1508) of the backup switch unit are all in the turn-on state, both the first turn-on direction and the second turn-on direction of the backup switch unit are opened.

In the foregoing embodiments, the power supply switch unit and the first transistor, the second transistor, the third transistor, and the fourth transistor of the power supply switch unit all use the common source connection. However, the power supply switch unit and the first transistor, the second transistor, the third transistor, and the fourth transistor of the backup switch unit may also respectively use the common drain connection or the common source connection. Only a turn-off sequence of the first transistor, the second transistor, the third transistor, and the fourth transistor of the power supply switch unit and a turn-on sequence of the first transistor, the second transistor, the third transistor, and the fourth transistor of the backup switch unit need to be accordingly adjusted. A specific implementation will be described in the following embodiments.

Figure 18:
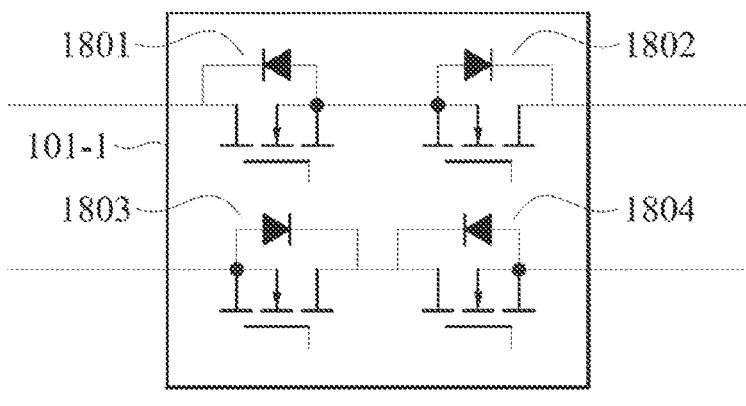
FIG. 18 is a circuit block diagram of a power supply switch unit according to some embodiments of the present invention.
Figure 19:
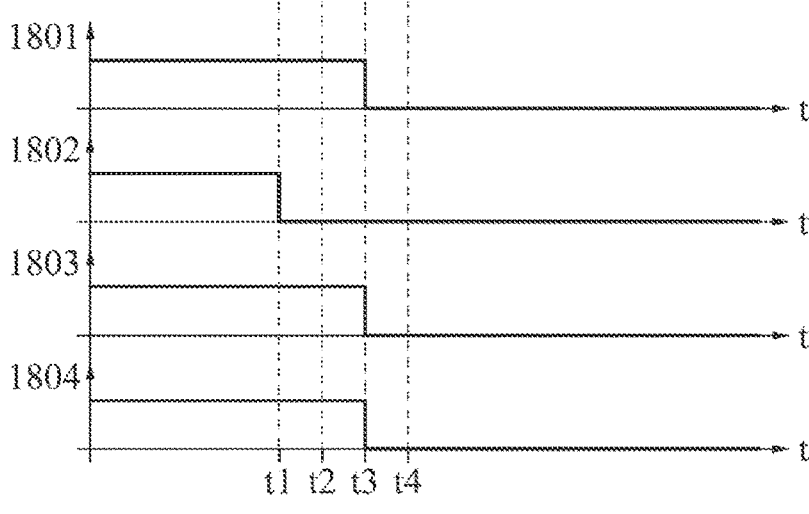
FIG. 19 is a schematic diagram of controlling of a switch unit of a positive half cycle according to some embodiments of the present invention.
Figure 20:
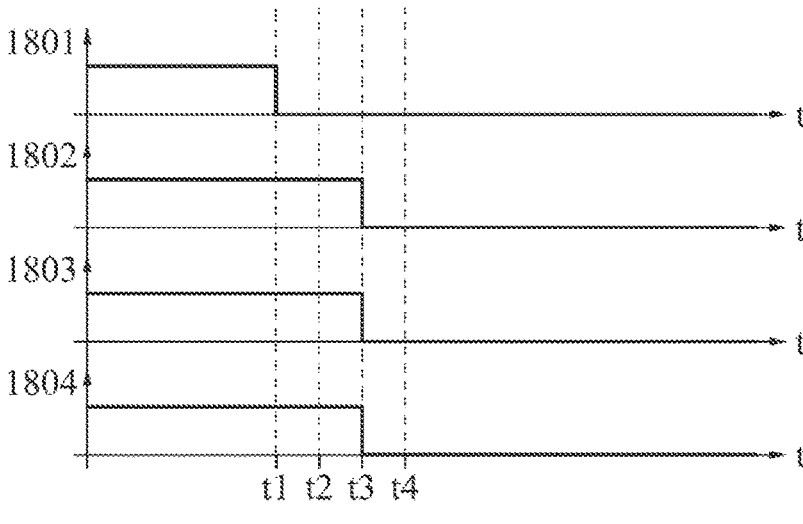
FIG. 20 is a schematic diagram of controlling of a switch unit of a negative half cycle according to some embodiments of the present invention.
Figure 43A:
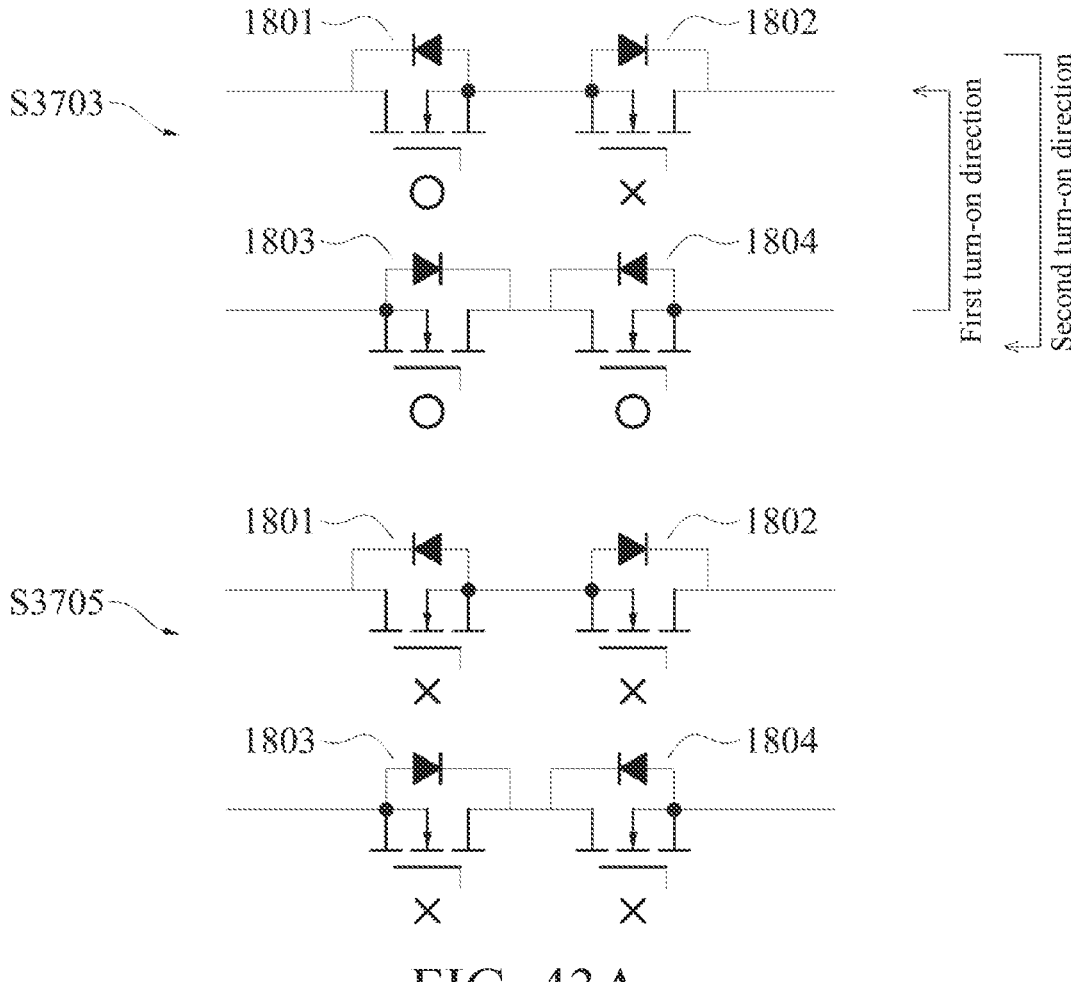
FIG. 43A and FIG. 43B are schematic diagrams of a power supply switch unit control method according to some embodiments of the present invention.
Figure 43B:
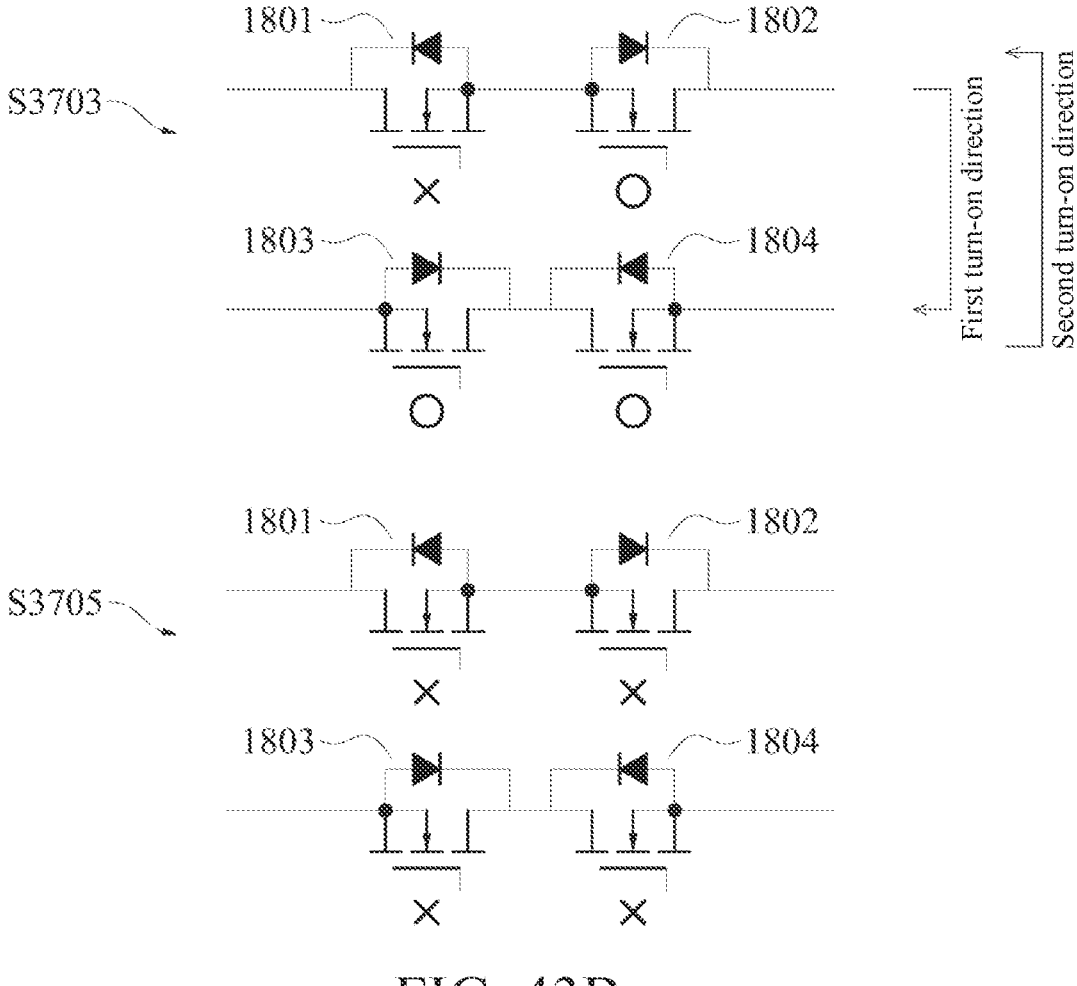

FIG. 18 is a circuit block diagram of a power supply switch unit according to some embodiments of the present invention. FIG. 19 is a schematic diagram of controlling of a switch unit of a positive half cycle according to some embodiments of the present invention. FIG. 20 is a schematic diagram of controlling of a switch unit of a negative half cycle according to some embodiments of the present invention. FIG. 43A and FIG. 43B are schematic diagrams of a power supply switch unit control method according to some embodiments of the present invention. Referring to FIG. 18, FIG. 19, FIG. 20, FIG. 43A, and FIG. 43B, in some embodiments of the present invention, the power supply switch unit (the switch unit 101-1) includes a transistor 1801 (also referred to as the first transistor of the power supply switch unit below), a transistor 1802 (also referred to as the second transistor of the power supply switch unit below), a transistor 1803 (also referred to as the third transistor of the power supply switch unit below), and a transistor 1804 (also referred to as the fourth transistor of the power supply switch unit below). The foregoing transistors each are an NMOS. The first transistor and the second transistor of the power supply switch unit are connected in a common source connection method; and the third transistor and the fourth transistor of the power supply switch unit are connected in a common drain connection method.

If the power supply switch unit is connected in the foregoing connection method, step S3703 includes a first step, and step S3705 includes a second step (the first step and the second step are only used to distinguish various steps, and do not have significance in sequence).

When the polarity half cycle is the positive half cycle, in the first step, the control unit 103 sends a turn-off signal ("×" as shown in FIG. 43A) to a gate of the first control transistor of the power supply switch unit. Because the polarity half cycle is the positive half cycle, the first control transistor of the power supply switch unit is the second transistor of the power supply switch unit. As shown in FIG. 19, at a time point t1, a voltage received by a gate of the second transistor (the transistor 1802) of the power supply switch unit is a low voltage, and then the second transistor (the transistor 1802) of the power supply switch unit starts to turn off after the time point t1. In this case, because the second transistor (the transistor 1802) of the power supply switch unit is in a turn-off state, the first turn-on direction (to be specific, opposite to a direction of the positive half cycle) of the power supply switch unit is closed. In the second step, the control unit 103 sends a turn-off signal ("×" as shown in FIG. 43A) to a gate of each of a plurality of second control transistors of the power supply switch unit. Because the polarity half cycle is the positive half cycle, the second control transistor of the power supply switch unit is the first control transistor (the transistor 1801), the third transistor (the transistor 1803), and the fourth transistor (the transistor 1804) of the power supply switch unit. As shown in FIG. 19, at a time point t3, voltages received by gates of the first transistor (the transistor 1801), the third transistor (the transistor 1803), and the fourth transistor (the transistor 1804) of the power supply switch unit are low voltages, and then the first transistor (the transistor 1801), the third transistor (the transistor 1803), and the fourth transistor (the transistor 1804) of the power supply switch unit start to turn off after the time point t3. In this case, because the first transistor (the transistor 1801), the second transistor (the transistor 1802), the third transistor (the transistor 1803), and the fourth transistor (the transistor 1804) of the power supply switch unit are all in the turn-off state, both the first turn-on direction and the second turn-on direction of the power supply switch unit are closed.

When the polarity half cycle is the negative half cycle, in the first step, the control unit 103 sends a turn-off signal ("×" as shown in FIG. 43B) to a gate of the first control transistor of the power supply switch unit. Because the polarity half cycle is the negative half cycle, the first control transistor of the power supply switch unit is the first transistor of the power supply switch unit. In this embodiment, as shown in FIG. 20, at a time point t1, a voltage received by a gate of the first transistor (the transistor 1801) of the power supply switch unit is a low voltage, and then the first transistor (the transistor 1801) of the power supply switch unit starts to turn off after the time point t1. In this case, because the first transistor (the transistor 1801) of the power supply switch unit is in a turn-off state, the first turn-on direction (to be specific, opposite to a direction of the negative half cycle) of the power supply switch unit is closed. In the second step, the control unit 103 sends a turn-off signal to a gate of each of a plurality of second control transistors of the power supply switch unit. Because the polarity half cycle is the negative half cycle, the second control transistor of the power supply switch unit is the second control transistor (the transistor 1802), the third transistor (the transistor 1803), and the fourth transistor (the transistor 1804) of the power supply switch unit. As shown in FIG. 20, at a time point t3, voltages received by gates of the second transistor, the third transistor, and the fourth transistor of the power supply switch unit are low voltages, and then the second transistor (the transistor 1802), the third transistor (the transistor 1803), and the fourth transistor (the transistor 1804) of the power supply switch unit start to turn off after the time point t3.

Figure 21:
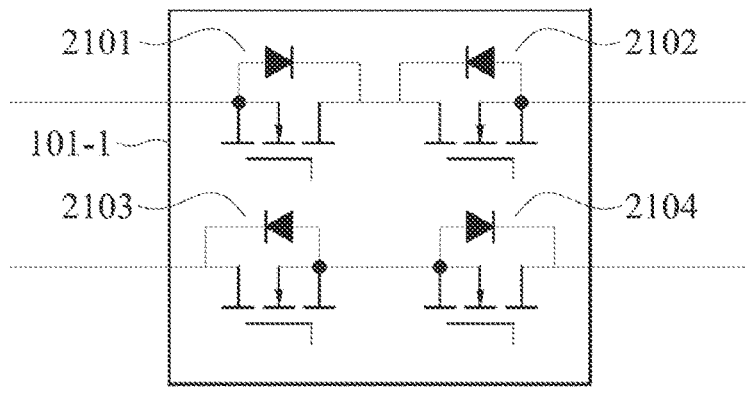
FIG. 21 is a circuit block diagram of a power supply switch unit according to some embodiments of the present invention.
Figure 22:
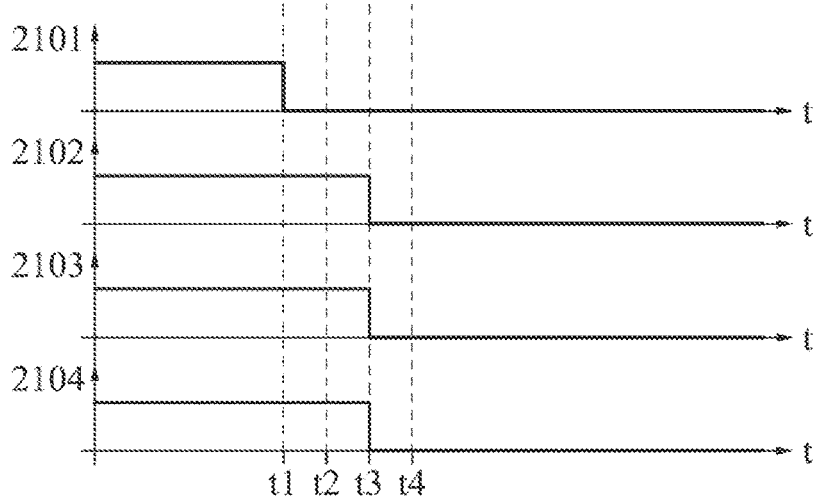
FIG. 22 is a schematic diagram of controlling of a switch unit of a positive half cycle according to some embodiments of the present invention.
Figure 23:
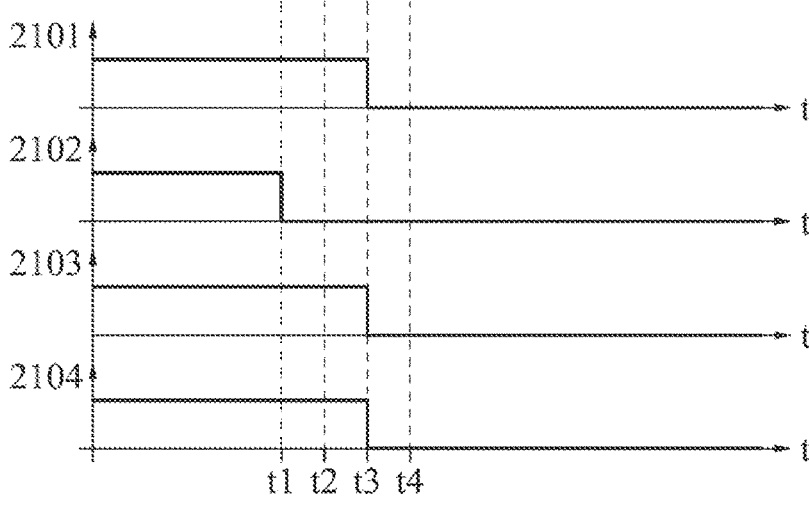
FIG. 23 is a schematic diagram of controlling of a switch unit of a negative half cycle according to some embodiments of the present invention.
Figure 44A:
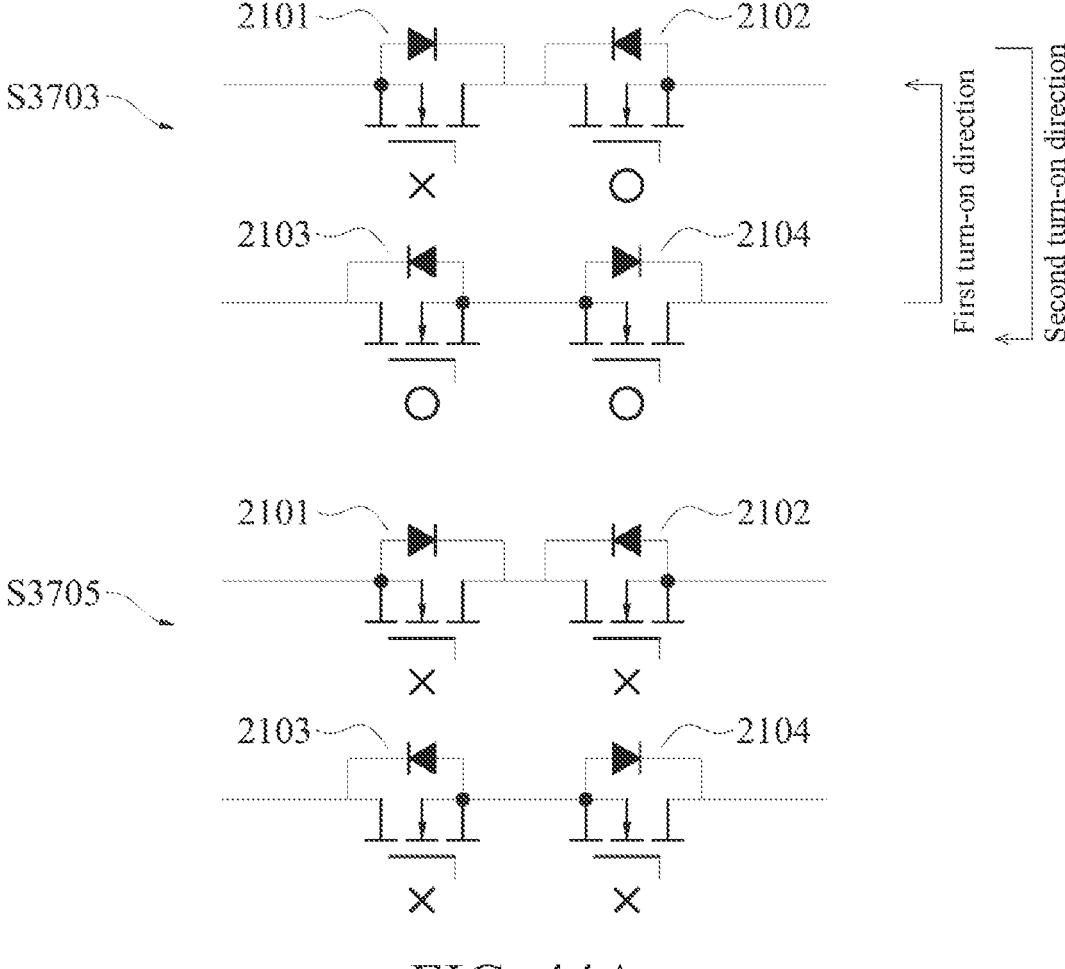
FIG. 44A and FIG. 44B are schematic diagrams of a power supply switch unit control method according to some embodiments of the present invention.
Figure 44B:
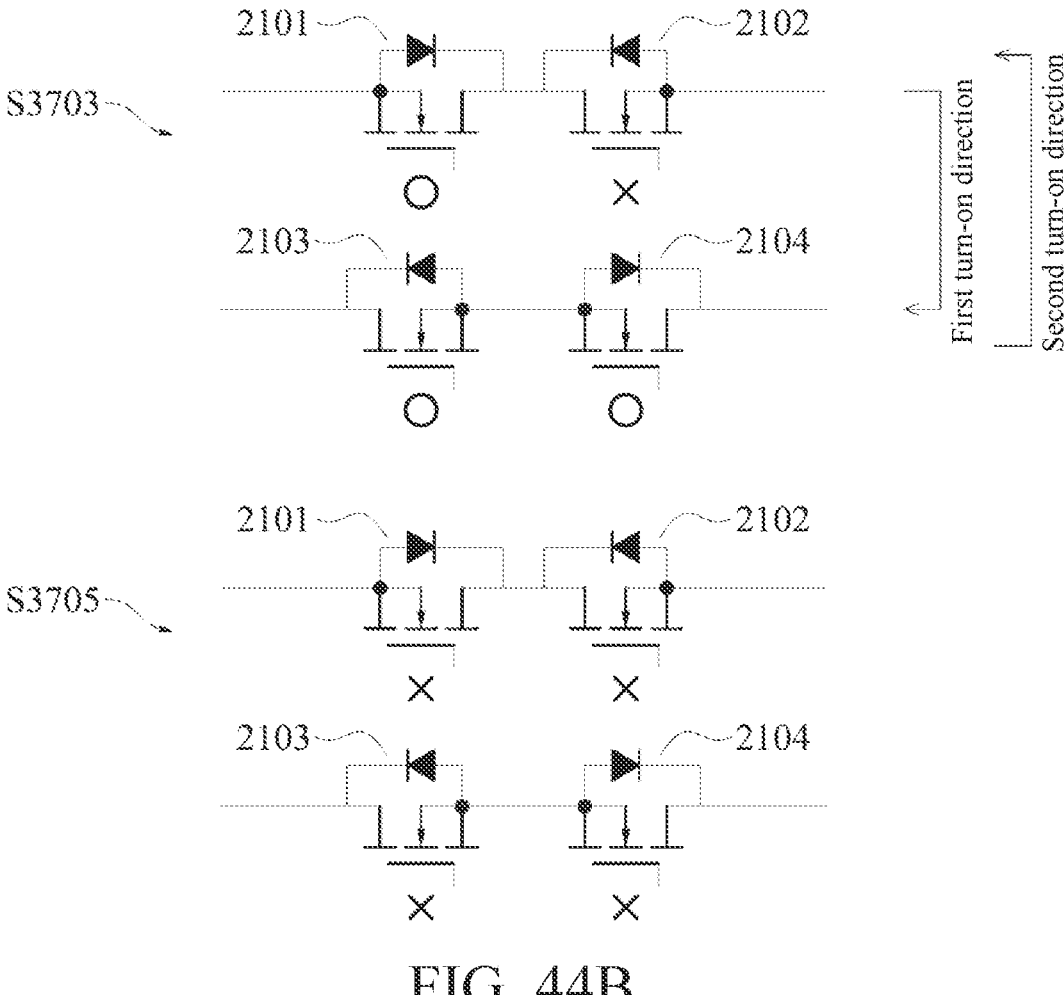

FIG. 21 is a circuit block diagram of a power supply switch unit according to some embodiments of the present invention. FIG. 22 is a schematic diagram of controlling of a switch unit of a positive half cycle according to some embodiments of the present invention. FIG. 23 is a schematic diagram of controlling of a switch unit of a negative half cycle according to some embodiments of the present invention. FIG. 44A and FIG. 44B are schematic diagrams of a power supply switch unit control method according to some embodiments of the present invention. Referring to FIG. 21, FIG. 22, FIG. 23, FIG. 44A, and FIG. 44B, in some embodiments of the present invention, the power supply switch unit (the switch unit 101-1) includes a transistor 2101 (also referred to as the first transistor of the power supply switch unit below), a transistor 2102 (also referred to as the second transistor of the power supply switch unit below), a transistor 2103 (also referred to as the third transistor of the power supply switch unit below), and a transistor 2104 (also referred to as the fourth transistor of the power supply switch unit below). The foregoing transistors each are an NMOS. The first transistor and the second transistor of the power supply switch unit are connected in a common drain connection method; and the third transistor and the fourth transistor of the power supply switch unit are connected in a common source connection method.

If the power supply switch unit is connected in the foregoing connection method, step S3703 includes a first step, and step S3705 includes a second step (the first step and the second step are only used to distinguish various steps, and do not have significance in sequence).

When the polarity half cycle is the positive half cycle, in the first step, the control unit 103 sends a turn-off signal ("×" as shown in FIG. 44A) to a gate of the first control transistor of the power supply switch unit. Because the polarity half cycle is the positive half cycle, the first control transistor of the power supply switch unit is the first transistor of the power supply switch unit. As shown in FIG. 22, at a time point t1, a voltage received by a gate of the first transistor (the transistor 2101) of the power supply switch unit is a low voltage, and then the first transistor (the transistor 2101) of the power supply switch unit starts to turn off after the time point t1. In this case, because the first transistor (the transistor 2101) of the power supply switch unit is in a turn-off state, the first turn-on direction (to be specific, opposite to a direction of the positive half cycle) of the power supply switch unit is closed. In the second step, the control unit 103 sends a turn-off signal ("×" as shown in FIG. 44A) to a gate of each of a plurality of second control transistors of the power supply switch unit. Because the polarity half cycle is the positive half cycle, the second control transistor of the power supply switch unit is the second control transistor (the transistor 2102), the third transistor (the transistor 2103), and the fourth transistor (the transistor 2104) of the power supply switch unit. As shown in FIG. 22, the second transistor (the transistor 2102), the third transistor (the transistor 2103), and the fourth transistor (the transistor 2104) of the power supply switch unit start to turn off after the time point t3. In this case, because the first transistor (the transistor 2101), the second transistor (the transistor 2102), the third transistor (the transistor 2103), and the fourth transistor (the transistor 2104) of the power supply switch unit are all in the turn-off state, both the first turn-on direction and the second turn-on direction of the power supply switch unit are closed.

When the polarity half cycle is the negative half cycle, in the first step, the control unit 103 sends a turn-off signal ("×" as shown in FIG. 44B) to a gate of the first control transistor of the power supply switch unit. Because the polarity half cycle is the negative half cycle, the first control transistor of the power supply switch unit is the second transistor of the power supply switch unit. In this embodiment, as shown in FIG. 23, the second transistor (the transistor 2102) of the power supply switch unit starts to turn off after the time point t1. In this case, because the second transistor (the transistor 2102) of the power supply switch unit is in a turn-off state, the first turn-on direction (to be specific, opposite to a direction of the negative half cycle) of the power supply switch unit is closed. In the second step, the control unit 103 sends a turn-off signal ("×" as shown in FIG. 44B) to a gate of each of a plurality of second control transistors of the power supply switch unit. Because the polarity half cycle is the negative half cycle, the second control transistor of the power supply switch unit is the first control transistor (the transistor 2101), the third transistor (the transistor 2103), and the fourth transistor (the transistor 2104) of the power supply switch unit. As shown in FIG. 23, at a time point t3, the first transistor (the transistor 2101), the third transistor (the transistor 2103), and the fourth transistor (the transistor 2104) of the power supply switch unit start to turn off after the time point t3.

Figure 24:
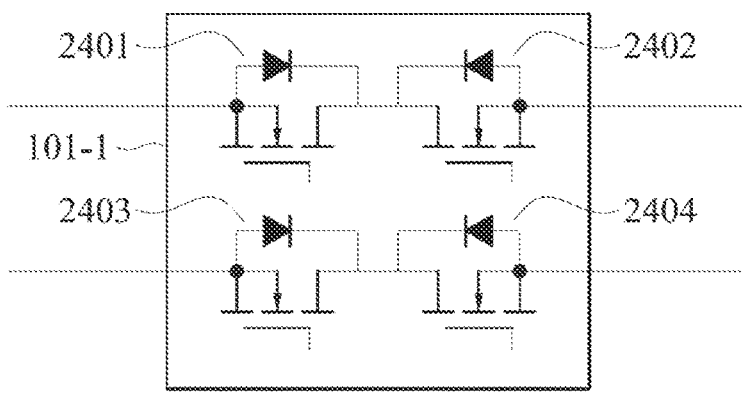
FIG. 24 is a circuit block diagram of a power supply switch unit according to some embodiments of the present invention.
Figure 25:
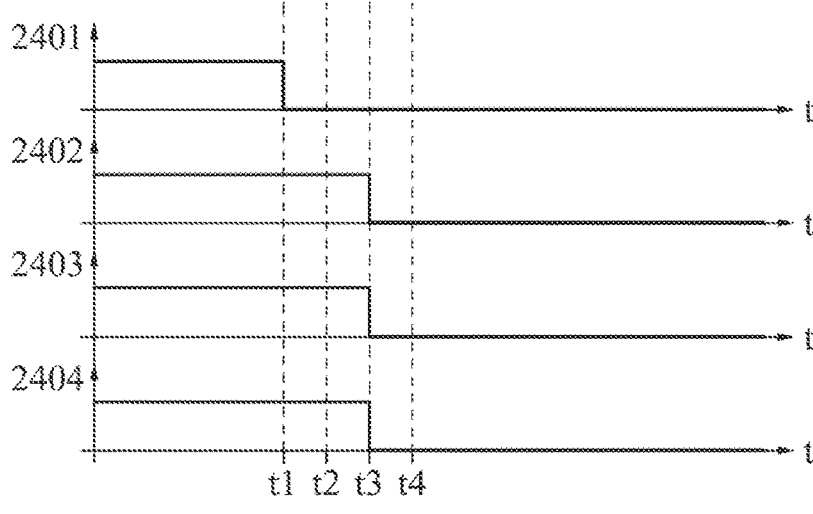
FIG. 25 is a schematic diagram of controlling of a switch unit of a positive half cycle according to some embodiments of the present invention.
Figure 26:
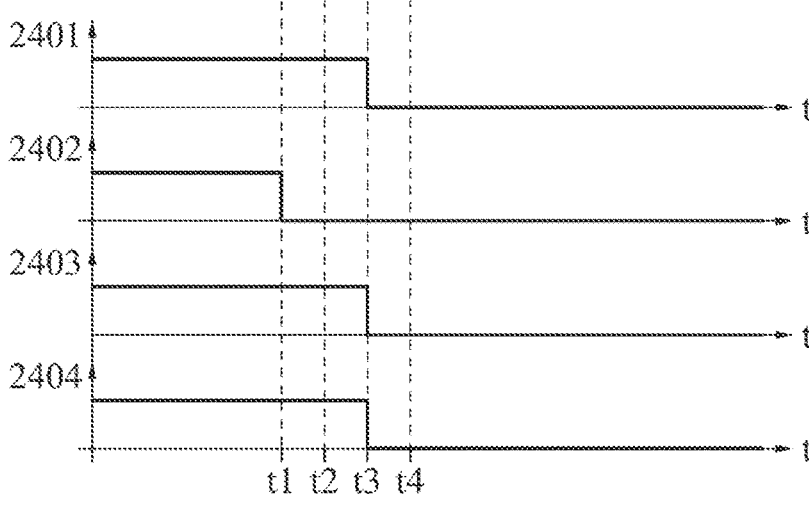
FIG. 26 is a schematic diagram of controlling of a switch unit of a negative half cycle according to some embodiments of the present invention.
Figure 45A:
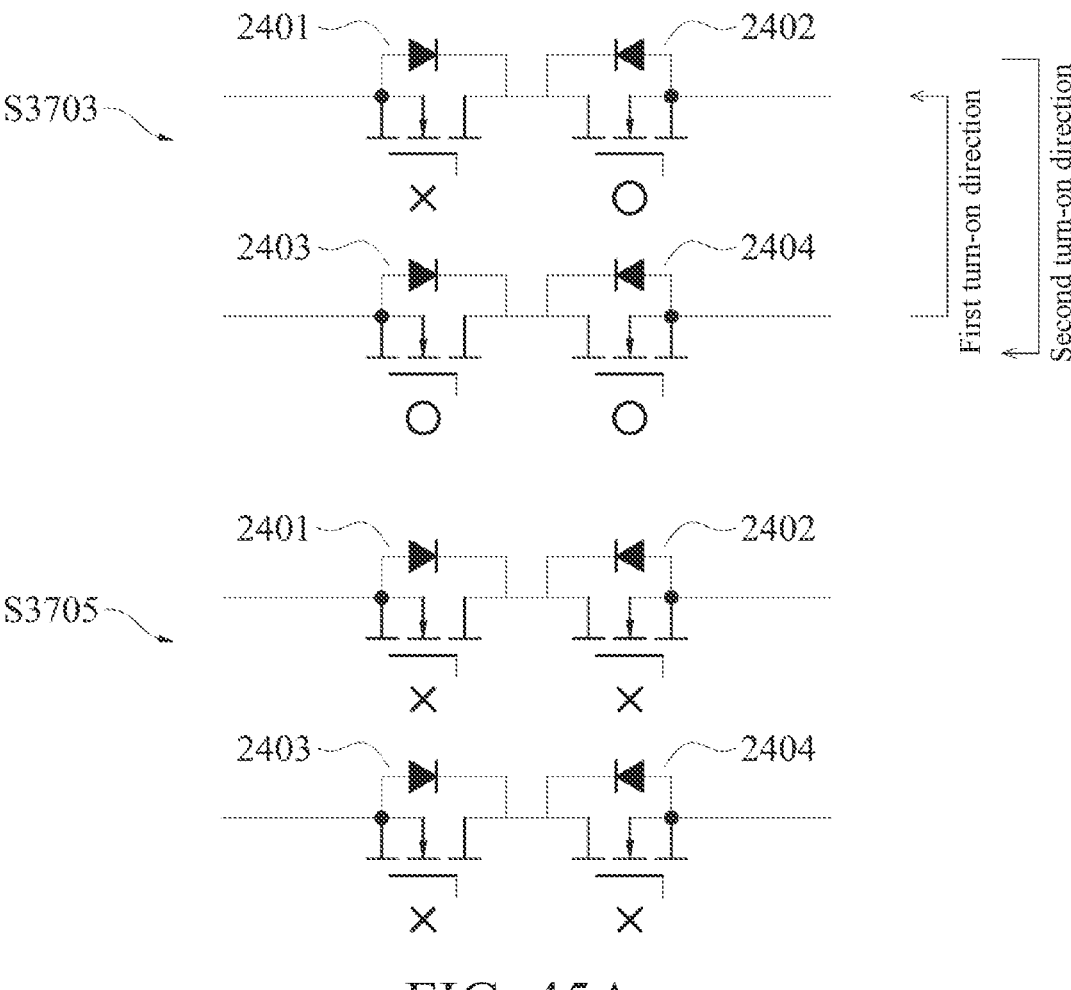
FIG. 45A and FIG. 45B are schematic diagrams of a power supply switch unit control method according to some embodiments of the present invention.
Figure 45B:
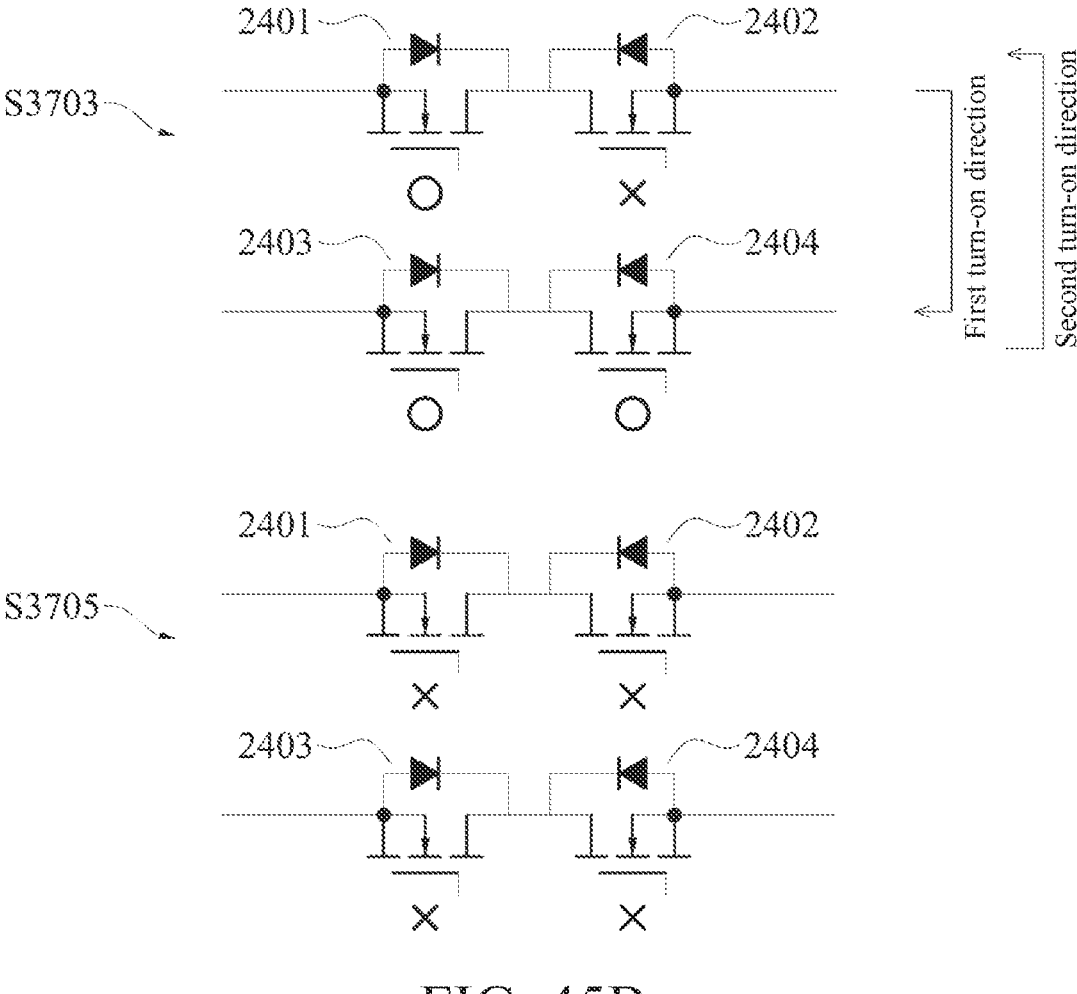

FIG. 24 is a circuit block diagram of a power supply switch unit according to some embodiments of the present invention. FIG. 25 is a schematic diagram of controlling of a switch unit of a positive half cycle according to some embodiments of the present invention. FIG. 26 is a schematic diagram of controlling of a switch unit of a negative half cycle according to some embodiments of the present invention. FIG. 45A and FIG. 45B are schematic diagrams of a power supply switch unit control method according to some embodiments of the present invention. Referring to FIG. 24, FIG. 25, FIG. 26, FIG. 45A, and FIG. 45B, in some embodiments of the present invention, the power supply switch unit (the switch unit 101-1) includes a transistor 2401 (also referred to as the first transistor of the power supply switch unit below), a transistor 2402 (also referred to as the second transistor of the power supply switch unit below), a transistor 2403 (also referred to as the third transistor of the power supply switch unit below), and a transistor 2404 (also referred to as the fourth transistor of the power supply switch unit below). The foregoing transistors each are an NMOS. The first transistor and the second transistor of the power supply switch unit are connected in a common drain connection method; and the third transistor and the fourth transistor of the power supply switch unit are also connected in a common drain connection method.

If the power supply switch unit is connected in the foregoing connection method, step S3703 includes a first step, and step S3705 includes a second step (the first step and the second step are only used to distinguish various steps, and do not have significance in sequence).

When the polarity half cycle is the positive half cycle, in the first step, the control unit 103 sends a turn-off signal ("×" as shown in FIG. 45A) to a gate of the first control transistor of the power supply switch unit. Because the polarity half cycle is the positive half cycle, the first control transistor of the power supply switch unit is the first transistor of the power supply switch unit. As shown in FIG. 25, the first transistor (the transistor 2401) of the power supply switch unit starts to turn off after the time point t1. In this case, because the first transistor (the transistor 2401) of the power supply switch unit is in a turn-off state, the first turn-on direction (to be specific, opposite to a direction of the positive half cycle) of the power supply switch unit is closed. In the second step, the control unit 103 sends a turn-off signal ("×" as shown in FIG. 45A) to a gate of each of a plurality of second control transistors of the power supply switch unit. Because the polarity half cycle is the positive half cycle, the second control transistor of the power supply switch unit is the second control transistor (the transistor 2402), the third transistor (the transistor 2403), and the fourth transistor (the transistor 2404) of the power supply switch unit. As shown in FIG. 25, at a time point t3, the second transistor (the transistor 2402), the third transistor (the transistor 2403), and the fourth transistor (the transistor 2404) of the power supply switch unit start to turn off after the time point t3. In this case, because the first transistor (the transistor 2401), the second transistor (the transistor 2402), the third transistor (the transistor 2403), and the fourth transistor (the transistor 2404) of the power supply switch unit are all in the turn-off state, both the first turn-on direction and the second turn-on direction of the power supply switch unit are closed.

When the polarity half cycle is the negative half cycle, in the first step, the control unit 103 sends a turn-off signal ("×" as shown in FIG. 45B) to a gate of the first control transistor of the power supply switch unit. Because the polarity half cycle is the negative half cycle, the first control transistor of the power supply switch unit is the second transistor of the power supply switch unit. In this embodiment, as shown in FIG. 26, the second transistor (the transistor 2402) of the power supply switch unit starts to turn off after the time point t1. In this case, because the second transistor (the transistor 2402) of the power supply switch unit is in a turn-off state, the first turn-on direction (to be specific, opposite to a direction of the negative half cycle) of the power supply switch unit is closed. In the second step, the control unit 103 sends a turn-off signal ("×" as shown in FIG. 45B) to a gate of each of a plurality of second control transistors of the power supply switch unit. Because the polarity half cycle is the negative half cycle, the second control transistor of the power supply switch unit is the first control transistor (the transistor 2401), the third transistor (the transistor 2403), and the fourth transistor (the transistor

2404) of the power supply switch unit. As shown in FIG. 26, the first transistor (the transistor 2401), the third transistor (the transistor 2403), and the fourth transistor (the transistor 2404) of the power supply switch unit start to turn off after the time point t3.

Figure 47A:
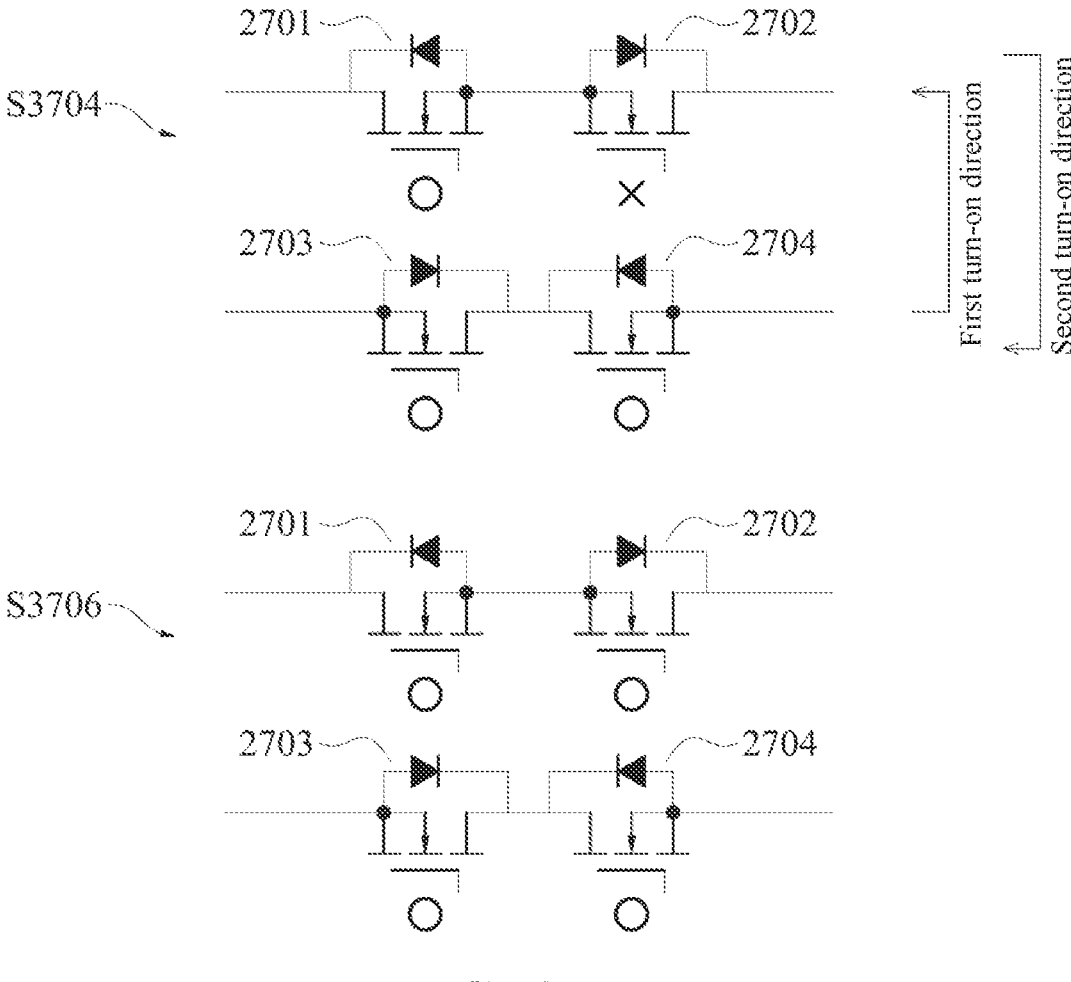
FIG. 47A and FIG. 47B are schematic diagrams of a backup switch unit control method according to some embodiments of the present invention.
Figure 47B:
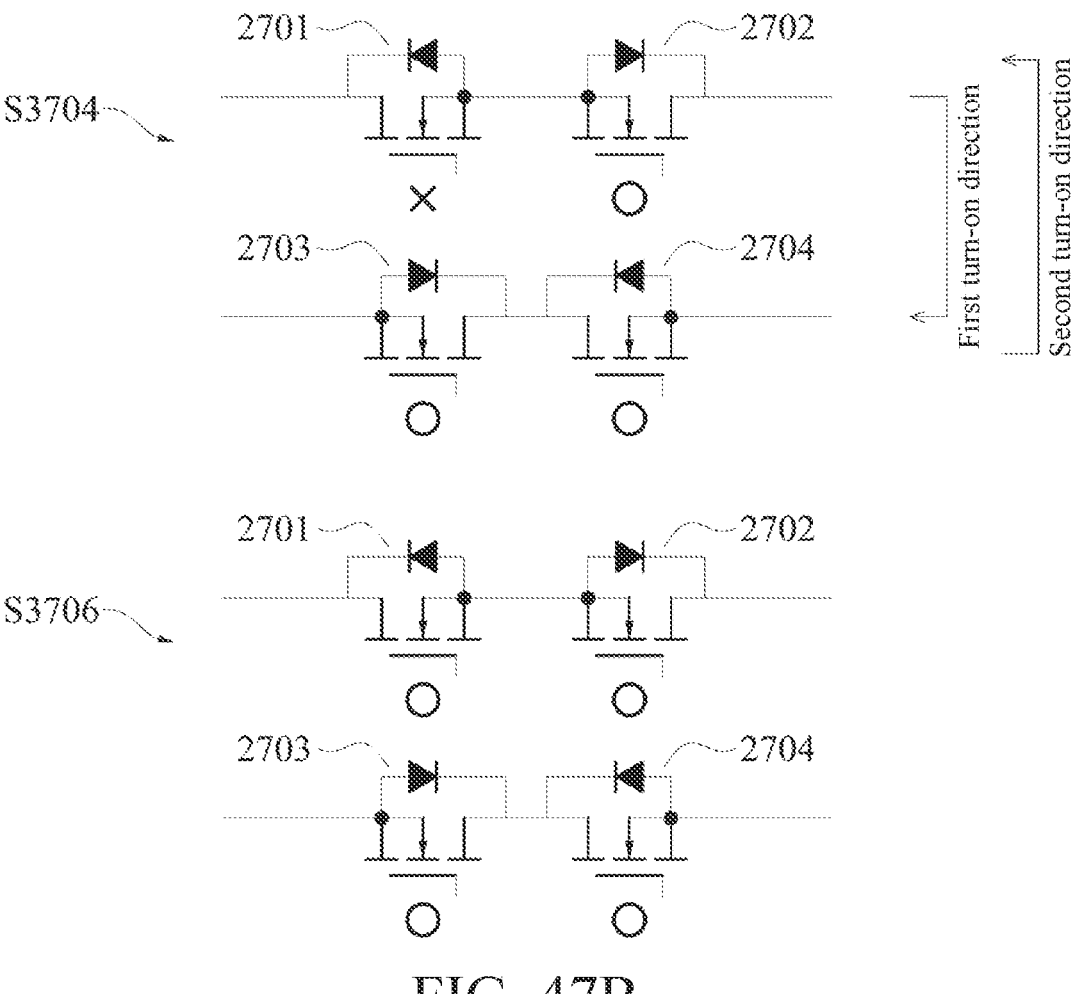

FIG. 27 is a circuit block diagram of a backup switch unit according to some embodiments of the present invention. FIG. 28 is a schematic diagram of controlling of a switch unit of a positive half cycle according to some embodiments of the present invention. FIG. 29 is a schematic diagram of controlling of a switch unit of a negative half cycle according to some embodiments of the present invention. FIG. 47A and FIG. 47B are schematic diagrams of a backup switch unit control method according to some embodiments of the present invention.

Referring to FIG. 27, FIG. 28, FIG. 29, FIG. 47A, and FIG. 47B, in some embodiments of the present invention, the backup switch unit (the switch unit 101-2) includes a transistor 2701 (also referred to as the first transistor of the backup switch unit below), a transistor 2702 (also referred to as the second transistor of the backup switch unit below), a transistor 2703 (also referred to as the third transistor of the backup switch unit below), and a transistor 2704 (also referred to as the fourth transistor of the backup switch unit below). The foregoing transistors each are an NMOS. The first transistor and the second transistor of the backup switch unit are connected in a common source connection method; and the third transistor and the fourth transistor of the backup switch unit are connected in a common drain connection method.

If the backup switch unit is connected in the foregoing connection method, step S3704 includes a first step, and step S3706 includes a second step (the first step and the second step are only used to distinguish various steps, and do not have significance in sequence).

When the polarity half cycle is the positive half cycle, in the first step, the control unit 103 sends a turn-on signal ("○" as shown in FIG. 47A) to a gate of each of a plurality of first control transistors of the backup switch unit. Because the polarity half cycle is the positive half cycle, the first control transistor of the backup switch unit is the first control transistor (the transistor 2701), the third transistor (the transistor 2703), and the fourth transistor (the transistor 2704) of the backup switch unit. In this embodiment, the turn-on signal is a high voltage signal. As shown in FIG. 28, at a time point t2, voltages received by gates of the first control transistor (the transistor 2701), the third transistor (the transistor 2703), and the fourth transistor (the transistor 2704) of the backup switch unit are high voltages, and then the first transistor (the transistor 2701), the third transistor (the transistor 2703), and the fourth transistor (the transistor 2704) of the backup switch unit start to turn on after the time point t2. In this case, because the first transistor (the transistor 2701), the third transistor (the transistor 2703), and the fourth transistor (the transistor 2704) of the backup switch unit are in a turn-on state, the second turn-on direction (to be specific, the same as a direction of the positive half cycle) of the backup switch unit is opened. It is worth noting that in this case, because the second transistor (the transistor 2702) of the backup switch unit is still turned off ("×" as shown in FIG. 47A), the first turn-on direction of the backup switch unit is still closed.

In the second step, the control unit 103 sends a turn-on signal ("○" as shown in FIG. 47A) to a gate of the second control transistor of the backup switch unit. Because the polarity half cycle is the positive half cycle, the second control transistor of the backup switch unit is the second transistor (the transistor 2702) of the backup switch unit. As shown in FIG. 28, at a time point t4, a voltage received by a gate of the second transistor (the transistor 2702) of the backup switch unit is a high voltage, and then the second transistor (the transistor 2702) of the backup switch unit starts to turn on after the time point t4. In this case, because the first transistor (the transistor 2701), the second transistor (the transistor 2702), the third transistor (the transistor 2703), and the fourth transistor (the transistor 2704) of the backup switch unit are all in the turn-on state, both the first turn-on direction and the second turn-on direction of the backup switch unit are opened.

When the polarity half cycle is the negative half cycle, in the first step, the control unit 103 sends a turn-on signal ("○" as shown in FIG. 47B) to a gate of each of a plurality of first control transistors of the backup switch unit. Because the polarity half cycle is the negative half cycle, the first control transistor of the backup switch unit is the second control transistor (the transistor 2702), the third transistor (the transistor 2703), and the fourth transistor (the transistor 2704) of the backup switch unit. As shown in FIG. 29, at a time point t2, voltages received by gates of the second transistor (the transistor 2702), the third transistor (the transistor 2703), and the fourth transistor (the transistor 2704) of the backup switch unit are high voltages, and then the second transistor (the transistor 2702), the third transistor (the transistor 2703), and the fourth transistor (the transistor 2704) of the backup switch unit start to turn on after the time point t2. In this case, because the second transistor (the transistor 2702), the third transistor (the transistor 2703), and the fourth transistor (the transistor 2704) of the backup switch unit are in a turn-on state, the second turn-on direction (to be specific, the same as a direction of the negative half cycle) of the backup switch unit is opened. It is worth noting that in this case, because the first transistor (the transistor 2701) of the backup switch unit is still turned off ("×" as shown in FIG. 47B), the first turn-on direction of the backup switch unit is still closed.

In the second step, the control unit 103 sends a turn-on signal ("○" as shown in FIG. 47B) to a gate of the second control transistor of the backup switch unit. Because the polarity half cycle is the negative half cycle, the second control transistor of the backup switch unit is the first transistor (the transistor 2701) of the backup switch unit. As shown in FIG. 29, at a time point t4, a voltage received by a gate of the first transistor (the transistor 2701) of the backup switch unit is a high voltage, and then the first transistor (the transistor 2701) of the backup switch unit starts to turn on after the time point t4. In this case, because the first transistor (the transistor 2701), the second transistor (the transistor 2702), the third transistor (the transistor 2703), and the fourth transistor (the transistor 2704) of the backup switch unit are all in the turn-on state, both the first turn-on direction and the second turn-on direction of the backup switch unit are opened.

Figure 30:
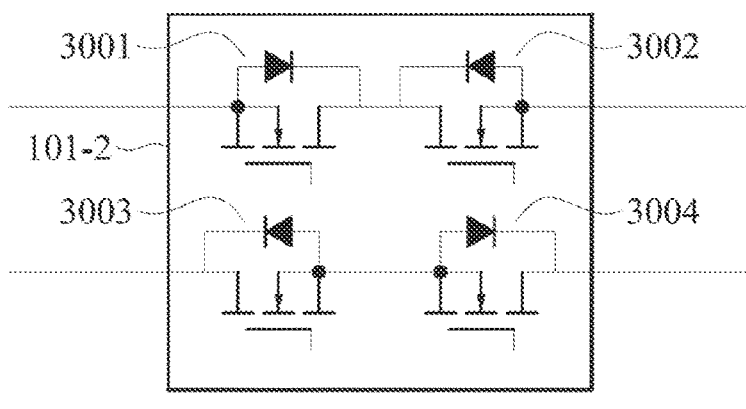
FIG. 30 is a circuit block diagram of a backup switch unit according to some embodiments of the present invention.
Figure 31:
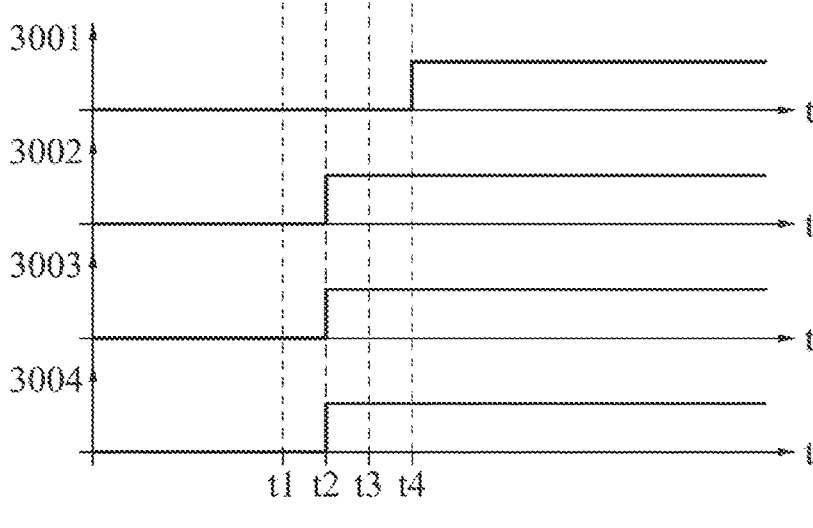
FIG. 31 is a schematic diagram of controlling of a switch unit of a positive half cycle according to some embodiments of the present invention.
Figure 32:
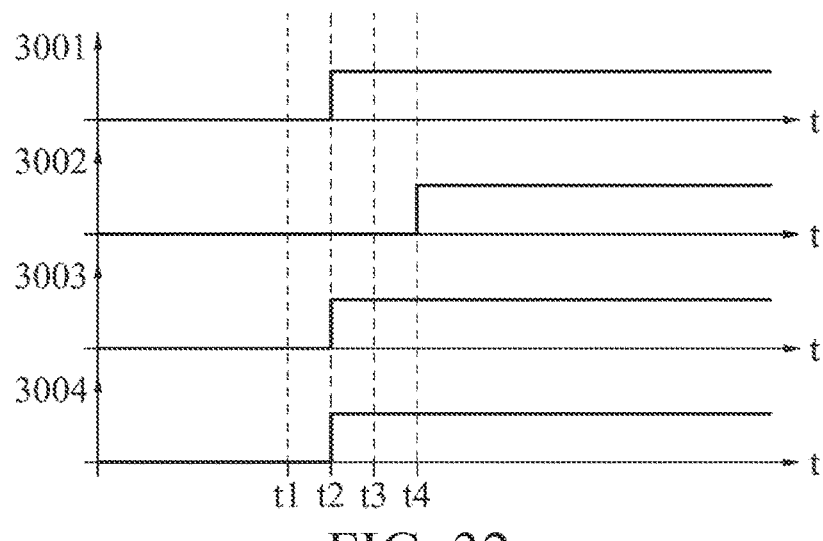
FIG. 32 is a schematic diagram of controlling of a switch unit of a negative half cycle according to some embodiments of the present invention.
Figure 48A:
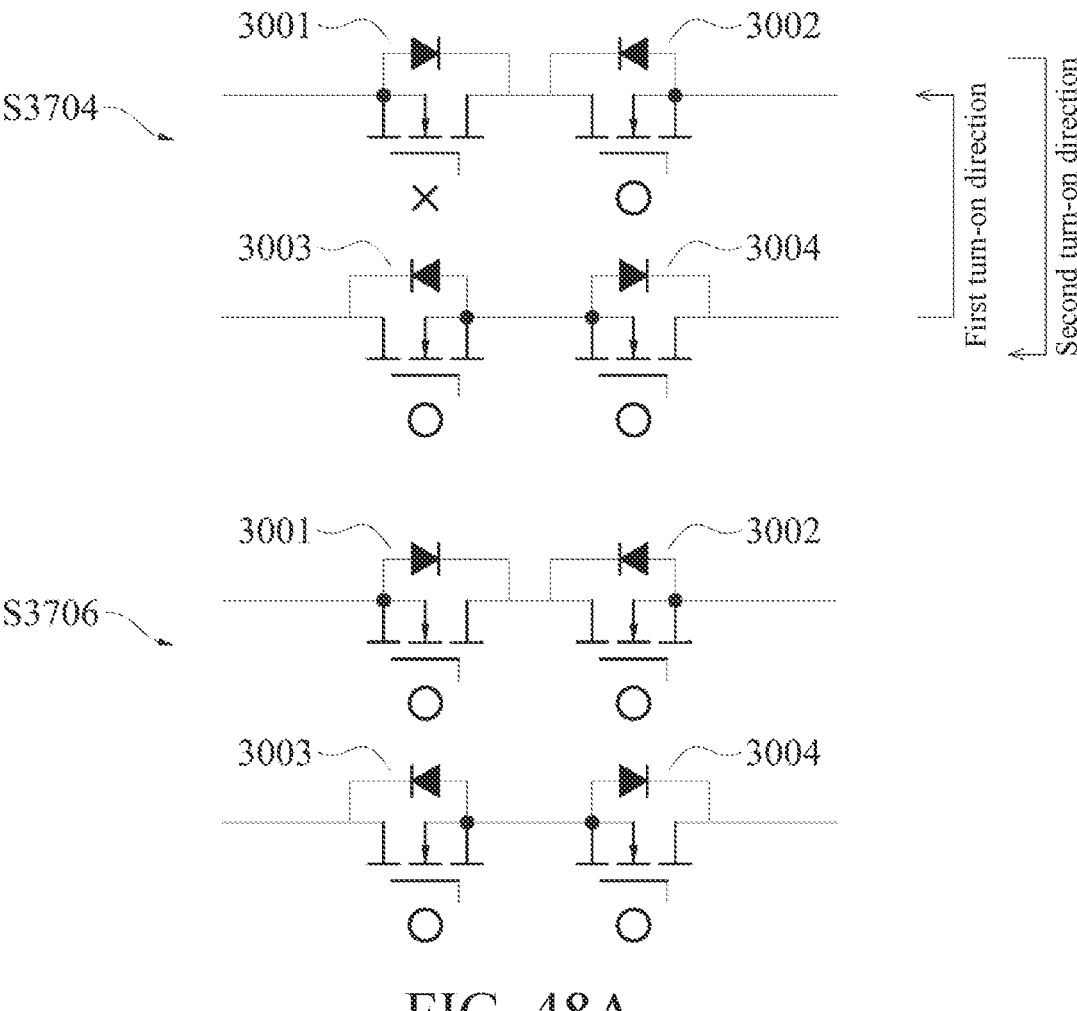
FIG. 48A and FIG. 48B are schematic diagrams of a backup switch unit control method according to some embodiments of the present invention.
Figure 48B:
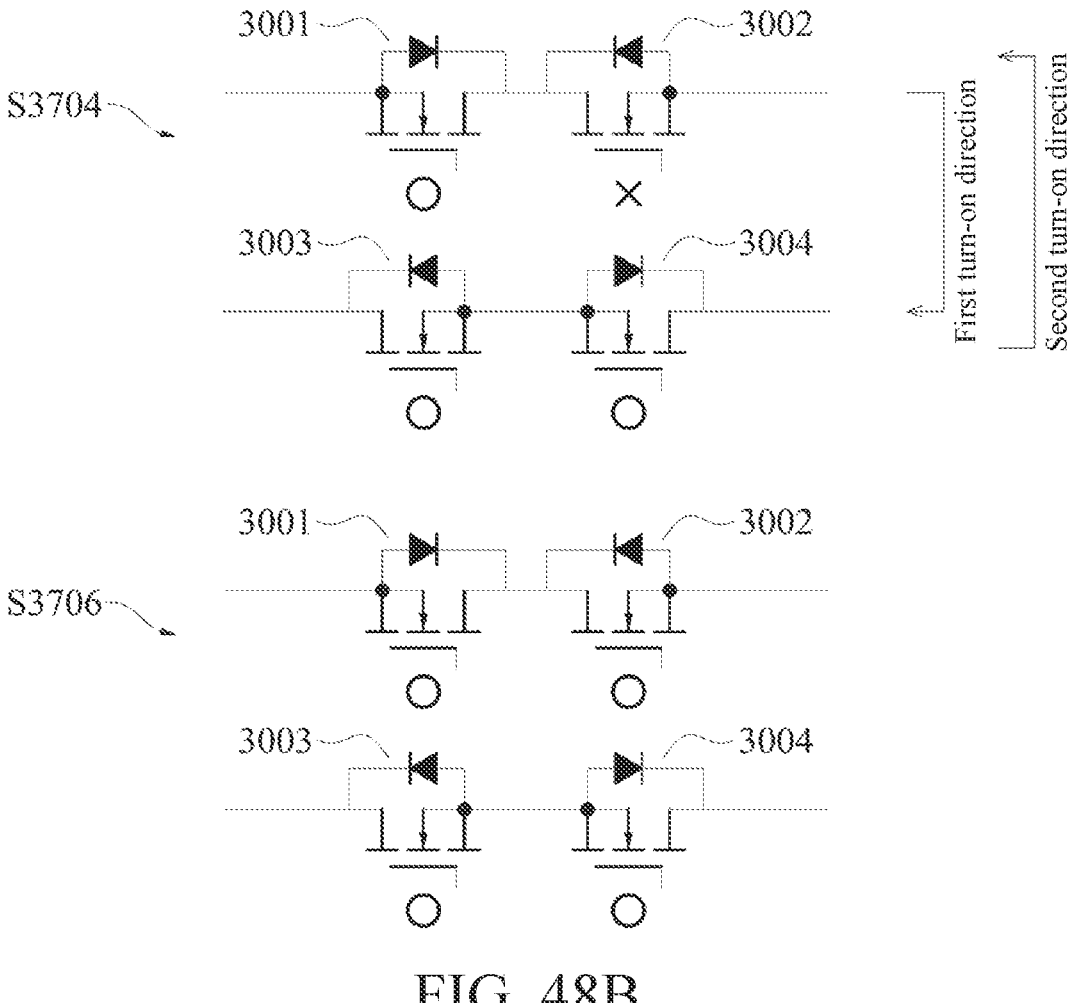

FIG. 30 is a circuit block diagram of a backup switch unit according to some embodiments of the present invention. FIG. 31 is a schematic diagram of controlling of a switch unit of a positive half cycle according to some embodiments of the present invention. FIG. 32 is a schematic diagram of controlling of a switch unit of a negative half cycle according to some embodiments of the present invention. FIG. 48A and FIG. 48B are schematic diagrams of a backup switch unit control method according to some embodiments of the present invention. Referring to FIG. 30, FIG. 31, FIG. 32, FIG. 48A, and FIG. 48B, in some embodiments of the present invention, the backup switch unit (the switch unit

101-2) includes a transistor 3001 (also referred to as the first transistor of the backup switch unit below), a transistor 3002 (also referred to as the second transistor of the backup switch unit below), a transistor 3003 (also referred to as the third transistor of the backup switch unit below), and a transistor 3004 (also referred to as the fourth transistor of the backup switch unit below). The foregoing transistors each are an NMOS. The first transistor and the second transistor of the backup switch unit are connected in a common drain connection method; and the third transistor and the fourth transistor of the backup switch unit are connected in a common source connection method.

If the backup switch unit is connected in the foregoing connection method, step S3704 includes a first step, and step S3706 includes a second step (the first step and the second step are only used to distinguish various steps, and do not have significance in sequence).

When the polarity half cycle is the positive half cycle, in the first step, the control unit 103 sends a turn-on signal ("○" as shown in FIG. 48A) to a gate of each of a plurality of first control transistors of the backup switch unit. Because the polarity half cycle is the positive half cycle, the first control transistor of the backup switch unit is the second control transistor (the transistor 3001), the third transistor (the transistor 3003), and the fourth transistor (the transistor 3004) of the backup switch unit. In this embodiment, the turn-on signal is a high voltage signal. As shown in FIG. 31, at a time point t2, voltages received by gates of the second control transistor (the transistor 3002), the third transistor (the transistor 3003), and the fourth transistor (the transistor 3004) of the backup switch unit are high voltages, and then the second transistor (the transistor 3002), the third transistor (the transistor 3003), and the fourth transistor (the transistor 3004) of the backup switch unit start to turn on after the time point t2. In this case, because the second transistor (the transistor 3002), the third transistor (the transistor 3003), and the fourth transistor (the transistor 3004) of the backup switch unit are in a turn-on state, the second turn-on direction (to be specific, the same as a direction of the positive half cycle) of the backup switch unit is opened.

In the second step, the control unit 103 sends a turn-on signal ("○" as shown in FIG. 48A) to a gate of the second control transistor of the backup switch unit. Because the polarity half cycle is the positive half cycle, the second control transistor of the backup switch unit is the first transistor (the transistor 3001) of the backup switch unit. In this embodiment, the turn-on signal is a high voltage signal. As shown in FIG. 31, at a time point t4, a voltage received by a gate of the first transistor (the transistor 3001) of the backup switch unit is a high voltage, and then the first transistor (the transistor 3001) of the backup switch unit starts to turn on after the time point t4. In this case, because the first transistor (the transistor 3001), the second transistor (the transistor 3002), the third transistor (the transistor 3003), and the fourth transistor (the transistor 3004) of the backup switch unit are all in the turn-on state, both the first turn-on direction and the second turn-on direction of the backup switch unit are opened.

When the polarity half cycle is the negative half cycle, in the first step, the control unit 103 sends a turn-on signal ("○" as shown in FIG. 48B) to a gate of each of a plurality of first control transistors of the backup switch unit. Because the polarity half cycle is the negative half cycle, the first control transistor of the backup switch unit is the first control transistor (the transistor 3001), the third transistor (the transistor 3003), and the fourth transistor (the transistor 3004) of the backup switch unit. As shown in FIG. 32, at a time point t2, voltages received by gates of the first control transistor (the transistor 3001), the third transistor (the transistor 3003), and the fourth transistor (the transistor 3004) of the backup switch unit are high voltages, and then the first transistor (the transistor 3001), the third transistor (the transistor 3003), and the fourth transistor (the transistor 3004) of the backup switch unit start to turn on after the time point t2. In this case, because the first transistor (the transistor 3001), the third transistor (the transistor 3003), and the fourth transistor (the transistor 3004) of the backup switch unit are in a turn-on state, the second turn-on direction (to be specific, the same as a direction of the negative half cycle) of the backup switch unit is opened.

In the second step, the control unit 103 sends a turn-on signal ("○" as shown in FIG. 48B) to a gate of the second control transistor of the backup switch unit. Because the polarity half cycle is the negative half cycle, the second control transistor of the backup switch unit is the second transistor (the transistor 3002) of the backup switch unit. As shown in FIG. 32, at a time point t4, a voltage received by a gate of the second transistor (the transistor 3002) of the backup switch unit is a high voltage, and then the second transistor (the transistor 3002) of the backup switch unit starts to turn on after the time point t4. In this case, because the first transistor (the transistor 3001), the second transistor (the transistor 3002), the third transistor (the transistor 3003), and the fourth transistor (the transistor 3004) of the backup switch unit are all in the turn-on state, both the first turn-on direction and the second turn-on direction of the backup switch unit are opened.

Figure 33:
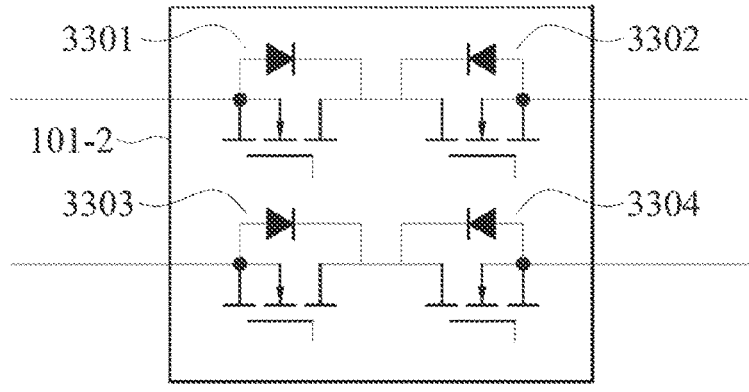
FIG. 33 is a circuit block diagram of a backup switch unit according to some embodiments of the present invention.
Figure 34:
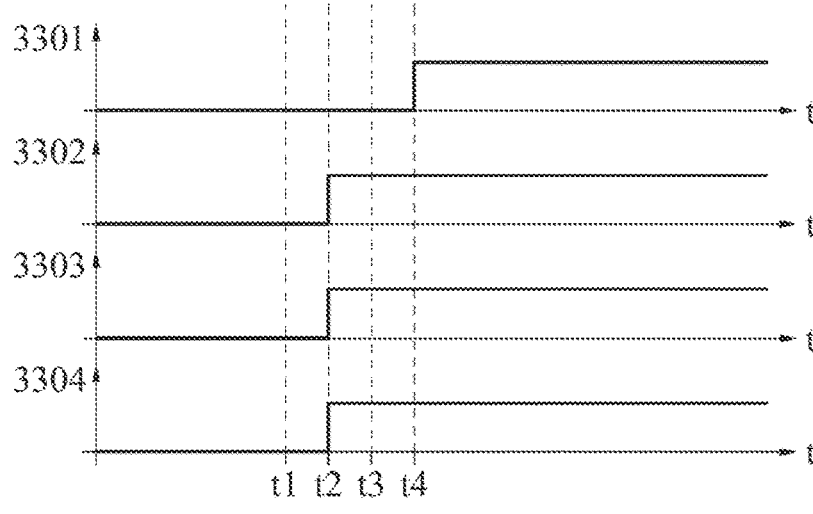
FIG. 34 is a schematic diagram of controlling of a switch unit of a positive half cycle according to some embodiments of the present invention.
Figure 35:
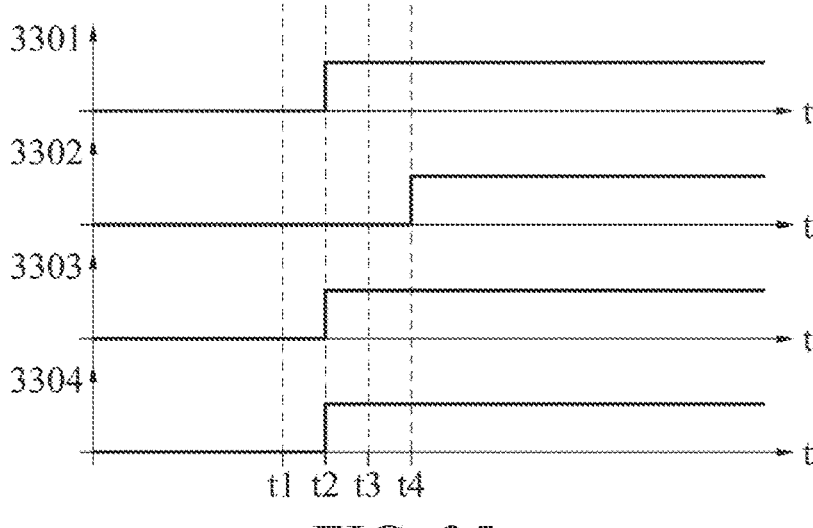
FIG. 35 is a schematic diagram of controlling of a switch unit of a negative half cycle according to some embodiments of the present invention.
Figure 49A:
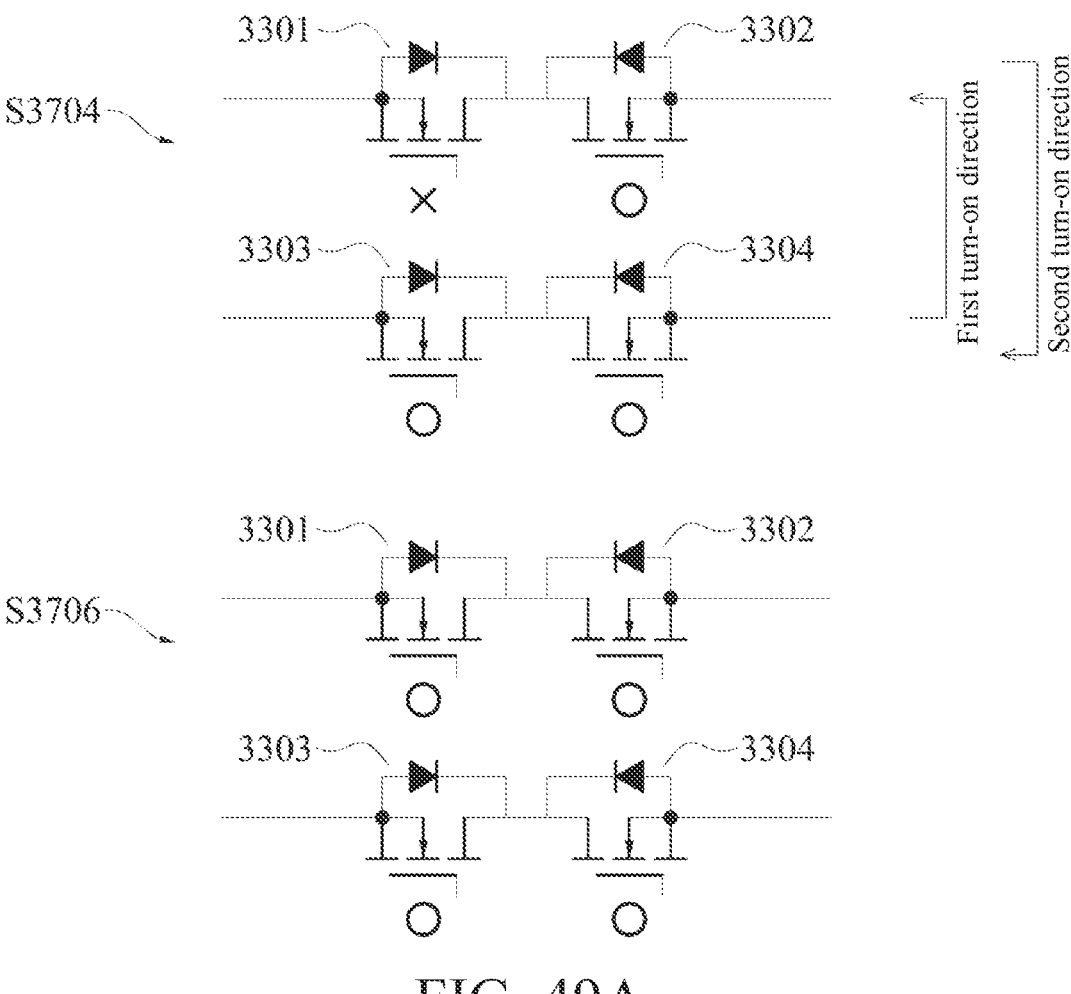
FIG. 49A and FIG. 49B are schematic diagrams of a backup switch unit control method according to some embodiments of the present invention.
Figure 49B:
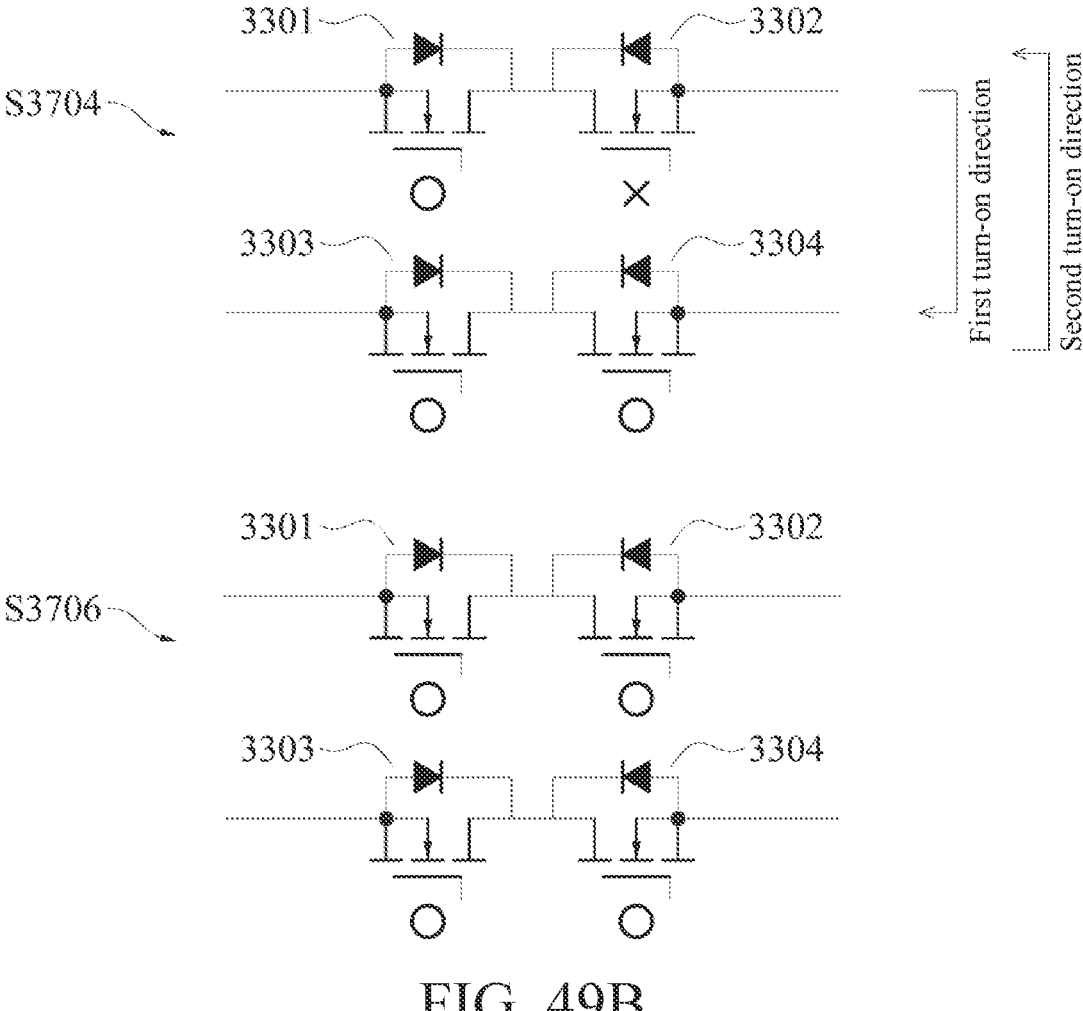

FIG. 33 is a circuit block diagram of a backup switch unit according to some embodiments of the present invention. FIG. 34 is a schematic diagram of controlling of a switch unit of a positive half cycle according to some embodiments of the present invention. FIG. 35 is a schematic diagram of controlling of a switch unit of a negative half cycle according to some embodiments of the present invention. FIG. 49A and FIG. 49B are schematic diagrams of a backup switch unit control method according to some embodiments of the present invention. Referring to FIG. 33, FIG. 34, FIG. 35, FIG. 49A, and FIG. 49B, in some embodiments of the present invention, the backup switch unit (the switch unit 101-2) includes a transistor 3301 (also referred to as the first transistor of the backup switch unit below), a transistor 3302 (also referred to as the second transistor of the backup switch unit below), a transistor 3303 (also referred to as the third transistor of the backup switch unit below), and a transistor 3304 (also referred to as the fourth transistor of the backup switch unit below). The foregoing transistors each are an NMOS. The first transistor and the second transistor of the backup switch unit are connected in a common drain connection method; and the third transistor and the fourth transistor of the backup switch unit are connected in a common drain connection method.

If the backup switch unit is connected in the foregoing connection method, step S3704 includes a first step, and step S3706 includes a second step (the first step and the second step are only used to distinguish various steps, and do not have significance in sequence).

When the polarity half cycle is the positive half cycle, in the first step, the control unit 103 sends a turn-on signal ("○" as shown in FIG. 49A) to a gate of each of a plurality of first control transistors of the backup switch unit. Because the polarity half cycle is the positive half cycle, the first control transistor of the backup switch unit is the second control transistor of the backup switch unit is the second control transistor (the transistor 3302), the third transistor (the transistor 3303), and the fourth transistor (the transistor 3304) of the backup switch unit. In this embodiment, the turn-on signal is a high voltage signal. As shown in FIG. 34, at a time point t2, voltages received by gates of the second control transistor (the transistor 3301), the third transistor (the transistor 3303), and the fourth transistor (the transistor 3304) of the backup switch unit are high voltages, and then the second transistor (the transistor 3302), the third transistor (the transistor 3303), and the fourth transistor (the transistor 3304) of the backup switch unit start to turn on after the time point t2. In this case, because the second transistor (the transistor 3302), the third transistor (the transistor 3303), and the fourth transistor (the transistor 3304) of the backup switch unit are in a turn-on state, the second turn-on direction (to be specific, the same as a direction of the positive half cycle) of the backup switch unit is opened.

In the second step, the control unit 103 sends a turn-on signal ("○" as shown in FIG. 49A) to a gate of the second control transistor of the backup switch unit. Because the polarity half cycle is the positive half cycle, the second control transistor of the backup switch unit is the first transistor (the transistor 3301) of the backup switch unit. As shown in FIG. 34, at a time point t4, a voltage received by a gate of the first transistor (the transistor 3301) of the backup switch unit is a high voltage, and then the first transistor (the transistor 3301) of the backup switch unit starts to turn on after the time point t4. In this case, because the first transistor (the transistor 3301), the second transistor (the transistor 3302), the third transistor (the transistor 3303), and the fourth transistor (the transistor 3304) of the backup switch unit are all in the turn-on state, both the first turn-on direction and the second turn-on direction of the backup switch unit are opened.

When the polarity half cycle is the negative half cycle, in the first step, the control unit 103 sends a turn-on signal ("○" as shown in FIG. 49B) to a gate of each of a plurality of first control transistors of the backup switch unit. Because the polarity half cycle is the negative half cycle, the first control transistor of the backup switch unit is the first control transistor (the transistor 3301), the third transistor (the transistor 3303), and the fourth transistor (the transistor 3304) of the backup switch unit. As shown in FIG. 35, at a time point t2, voltages received by gates of the first control transistor (the transistor 3301), the third transistor (the transistor 3303), and the fourth transistor (the transistor 3304) of the backup switch unit are high voltages, and then the first transistor (the transistor 3301), the third transistor (the transistor 3303), and the fourth transistor (the transistor 3304) of the backup switch unit start to turn on after the time point t2. In this case, because the first transistor (the transistor 3301), the third transistor (the transistor 3303), and the fourth transistor (the transistor 3304) of the backup switch unit are in a turn-on state, the second turn-on direction (to be specific, the same as a direction of the negative half cycle) of the backup switch unit is opened.

In the second step, the control unit 103 sends a turn-on signal ("○" as shown in FIG. 49B) to a gate of the second control transistor of the backup switch unit. Because the polarity half cycle is the negative half cycle, the second control transistor of the backup switch unit is the second transistor (the transistor 3302) of the backup switch unit. As shown in FIG. 35, at a time point t4, a voltage received by a gate of the second transistor (the transistor 3302) of the backup switch unit is a high voltage, and then the second transistor (the transistor 3302) of the backup switch unit starts to turn on after the time point t4. In this case, because the first transistor (the transistor 3301), the second transistor (the transistor 3302), the third transistor (the transistor 3303), and the fourth transistor (the transistor 3304) of the backup switch unit are all in the turn-on state, both the first turn-on direction and the second turn-on direction of the backup switch unit are opened.

In the foregoing embodiments, because semiconductor switches that are connected in reverse series are used, signals may be quickly turned on or turned off, thereby achieving an effect of fast switching power supply.

FIG. 36 is a circuit block diagram of a voltage detection circuit according to some embodiments of the present invention. Referring to FIG. 36, in some embodiments of the present invention, a voltage detection circuit 3600 may be included in the voltage detection module 102-1 and the voltage detection module 102-2 to detect a voltage of the alternating current 105-1 and a voltage of the alternating current 105-2. The voltage detection circuit 3600 includes an amplifier 3601, an amplifier 3602, a resistor 3603, a resistor 3604, a resistor 3605, and a resistor 3606. Resistance values of the resistor 3603 and the resistor 3604 are R1, and resistance values of the resistor 3605 and the resistor 3606 are R2. The amplifier 3601 and the amplifier 3602 receive a power supply voltage Vcc of the voltage detection circuit 3600, and the voltage detection circuit 3600 is connected to a reference voltage Vref via the resistor 3605. The amplifier 3601, the resistor 3603, the resistor 3604, the resistor 3605, and the resistor 3606 form a differential amplifier in the connection method shown in FIG. 36, which is used to attenuate a detection voltage to a voltage range that may be processed by a microprocessor. The amplifier 3602 forms a voltage follower through the connection manner shown in FIG. 36, which is used for impedance matching (high output impedance).

Refer to FIG. 1 again, in some embodiments of the present invention, the control unit 103 is configured to perform, in response to detecting that a voltage of a power supply alternating current among the alternating currents 105-1 to 105-N is less than a threshold, an emergency switching step so that the backup alternating current in the alternating currents 105-1 to 105-N replaces the power supply alternating current in the alternating currents 105-1 to 105-N to supply power to the load 104.

In some embodiments of the present invention, the emergency switching step includes steps S3701 to S3706.

Based on the above, some embodiments of the present invention provide a switching control system. By first closing the first turn-on direction of the power supply switch unit of the power supply alternating current and also maintaining the second turn-on direction of the power supply switch unit to be opened before the second turn-on direction of the backup switch unit of the backup alternating current is opened, the power supply alternating current may be prevented from short-circuiting and maintain normal operation in the switching process, to achieve an effect of uninterrupted power supply. In addition, because the switching control system replaces the conventional relay and the silicon controlled rectifier with the two-way switch, and an architecture of the switching control system is simple, through the switching control system and the switching control method described in the foregoing embodiments, the power supply alternating current and the backup alternating current may be quickly switched, to implement a backup function. In some embodiments of the present invention, pairs of transistor switches are connected in reverse series to form a two-way switch unit, thereby replacing the conventional relay and the SCR, and an additional diode is not required to prevent a reverse current.

Although the present disclosure has been described in considerable detail with reference to certain preferred embodiments thereof, the disclosure is not for limiting the scope of the invention. Persons having ordinary skill in the art may make various modifications and changes without departing from the scope and spirit of the disclosure. Therefore, the scope of the appended claims should not be limited to the description of the preferred embodiments described above.

What is claimed is:

1. A switching control system, comprising:

a plurality of switch units, configured to separately receive one of a plurality of alternating currents and couple to a load;

a detection unit, configured to detect each of the alternating currents; and a control unit, configured to, after receiving a switching signal, and in response to detecting that both a power supply alternating current and a backup alternating current of the alternating currents are in a polarity half cycle and a voltage difference between the power supply alternating current and the backup alternating current is less than a preset voltage, perform the following steps:

(a) closing a first turn-on direction of a power supply switch unit of the power supply alternating current;

(b) opening a second turn-on direction of a backup switch unit of the backup alternating current;

(c) closing a second turn-on direction of the power supply switch unit; and (d) opening a first turn-on direction of the backup switch unit; wherein the first turn-on direction of the power supply switch unit and the first turn-on direction of the backup switch unit are opposite to a direction of the polarity half cycle, the second turn-on direction of the power supply switch unit and the second turn-on direction of the backup switch unit are the same as the direction of the polarity half cycle, and the power supply switch unit and the backup switch unit are comprised in the switch units;

wherein the switching control system comprises a first phase line, a second phase line, and a neutral line, the first phase line and the neutral line are configured to receive the power supply alternating current, the second phase line and the neutral line are configured to receive the backup alternating current, both the power supply switch unit and the backup switch unit comprise a first transistor and a second transistor, the first transistor and the second transistor of the power supply switch unit are located on the first phase line and are connected in reverse series, and the first transistor and the second transistor of the backup switch unit are located on the second phase line and are connected in reverse series;

wherein the first transistor and the second transistor of the power supply switch unit each are an NMOS, a drain of the first transistor of the power supply switch unit receives the power supply alternating current, a source of the first transistor of the power supply switch unit is connected to a source of the second transistor of the power supply switch unit, a drain of the second transistor of the power supply switch unit is connected to the load, step (a) comprises sending a turn-off signal to a gate of a first control transistor of the power supply switch unit, and step (c) comprises sending the turn off signal to a gate of a second control transistor of the power supply switch unit, wherein when the polarity half cycle is a positive half cycle, the first control transistor of the power supply switch unit is the second transistor of the power supply switch unit, and the second control transistor of the power supply switch unit is the first transistor of the power supply switch unit; and when the polarity half cycle is a negative half cycle, the first control transistor of the power supply switch unit is the first transistor of the power supply switch unit, and the second control transistor of the power supply switch unit is the second transistor of the power supply switch unit.

2. The switching control system according to claim 1, wherein the first transistor and the second transistor of the backup switch unit each are an NMOS, a drain of the first transistor of the backup switch unit receives the backup alternating current, a source of the first transistor of the backup switch unit is connected to a source of the second transistor of the backup switch unit, a drain of the second transistor of the backup switch unit is connected to the load, step (b) comprises sending a turn-on signal to a gate of a first control transistor of the backup switch unit, and step (d) comprises sending a turn-on signal to a gate of a second control transistor of the backup switch unit, wherein when the polarity half cycle is the positive half cycle, the first control transistor of the backup switch unit is the first transistor of the backup switch unit, and the second control transistor of the backup switch unit is the second transistor of the backup switch unit; and when the polarity half cycle is the negative half cycle, the first control transistor of the backup switch unit is the second transistor of the backup switch unit, and the second control transistor of the backup switch unit is the first transistor of the backup switch unit.

3. The switching control system according to claim 1, wherein the first transistor and the second transistor of the backup switch unit each are an NMOS, a source of the first transistor of the backup switch unit receives the backup alternating current, a drain of the first transistor of the backup switch unit is connected to a drain of the second transistor of the backup switch unit, a source of the second transistor of the backup switch unit is connected to the load, step (b) comprises sending a turn-on signal to a gate of a first control transistor of the backup switch unit, and step (d) comprises sending a turn-on signal to a gate of a second control transistor of the backup switch unit, wherein when the polarity half cycle is the positive half cycle, the first control transistor of the backup switch unit is the second transistor of the backup switch unit, and the second control transistor of the backup switch unit is the first transistor of the backup switch unit; and when the polarity half cycle is the negative half cycle, the first control transistor of the backup switch unit is the first transistor of the backup switch unit, and the second control transistor of the backup switch unit is the second transistor of the backup switch unit.

4. A switching control system, comprising:
a plurality of switch units, configured to separately receive one of a plurality of alternating currents and couple to a load;
a detection unit, configured to detect each of the alternating currents; and
a control unit, configured to, after receiving a switching signal, and in response to detecting that both a power supply alternating current and a backup alternating current of the alternating currents are in a polarity half cycle and a voltage difference between the power supply alternating current and the backup alternating current is less than a preset voltage, perform the following steps:
(a) closing a first turn-on direction of a power supply switch unit of the power supply alternating current;
(b) opening a second turn-on direction of a backup switch unit of the backup alternating current;
(c) closing a second turn-on direction of the power supply switch unit; and
(d) opening a first turn-on direction of the backup switch unit; wherein the first turn-on direction of the power supply switch unit and the first turn-on direction of the backup switch unit are opposite to a direction of the polarity half cycle, the second turn-on direction of the power supply switch unit and the second turn-on direction of the backup switch unit are the same as the direction of the polarity half cycle, and the power supply switch unit and the backup switch unit are comprised in the switch units;
wherein the switching control system comprises a first phase line, a second phase line, and a neutral line, the first phase line and the neutral line are configured to receive the power supply alternating current, the second phase line and the neutral line are configured to receive the backup alternating current, both the power supply switch unit and the backup switch unit comprise a first transistor and a second transistor, the first transistor and the second transistor of the power supply switch unit are located on the first phase line and are connected in reverse series, and the first transistor and the second transistor of the backup switch unit are located on the second phase line and are connected in reverse series;
wherein the first transistor and the second transistor of the power supply switch unit each are an NMOS, a source of the first transistor of the power supply switch unit receives the power supply alternating current, a drain of the first transistor of the power supply switch unit is connected to a drain of the second transistor of the power supply switch unit, a source of the second transistor of the power supply switch unit is connected to the load, step (a) comprises sending a turn-off signal to a gate of a first control transistor of the power supply switch unit, and step (c) comprises sending the turn off signal to a gate of a second control transistor of the power supply switch unit, wherein when the polarity half cycle is a positive half cycle, the first control transistor of the power supply switch unit is the first transistor of the power supply switch unit, and the second control transistor of the power supply switch unit is the second transistor of the power supply switch unit; and when the polarity half cycle is a negative half cycle, the first control transistor of the power supply switch unit is the second transistor of the power supply switch unit, and the second control transistor of the power supply switch unit is the first transistor of the power supply switch unit.

5. The switching control system according to claim 1, wherein the first transistor and the second transistor of the backup switch unit each are an NMOS, a drain of the first transistor of the backup switch unit receives the backup alternating current, a source of the first transistor of the backup switch unit is connected to a source of the second transistor of the backup switch unit, a drain of the second transistor of the backup switch unit is connected to the load, step (b) comprises sending a turn-on signal to a gate of a first control transistor of the backup switch unit, and step (d)

comprises sending a turn-on signal to a gate of a second control transistor of the backup switch unit, wherein when the polarity half cycle is the positive half cycle, the first control transistor of the backup switch unit is the first transistor of the backup switch unit, and the second control transistor of the backup switch unit is the second transistor of the backup switch unit; and when the polarity half cycle is the negative half cycle, the first control transistor of the backup switch unit is the second transistor of the backup switch unit, and the second control transistor of the backup switch unit is the first transistor of the backup switch unit.

6. The switching control system according to claim 1, wherein the first transistor and the second transistor of the backup switch unit each are an NMOS, a source of the first transistor of the backup switch unit receives the backup alternating current, a drain of the first transistor of the backup switch unit is connected to a drain of the second transistor of the backup switch unit, a source of the second transistor of the backup switch unit is connected to the load, step (b) comprises sending a turn-on signal to a gate of a first control transistor of the backup switch unit, and step (d) comprises sending a turn-on signal to a gate of a second control transistor of the backup switch unit, wherein when the polarity half cycle is the positive half cycle, the first control transistor of the backup switch unit is the second transistor of the backup switch unit, and the second control transistor of the backup switch unit is the first transistor of the backup switch unit; and when the polarity half cycle is the negative half cycle, the first control transistor of the backup switch unit is the first transistor of the backup switch unit, and the second control transistor of the backup switch unit is the second transistor of the backup switch unit.

7. A switching control system, comprising:
a plurality of switch units, configured to separately receive one of a plurality of alternating currents and couple to a load;
a detection unit, configured to detect each of the alternating currents; and
a control unit, configured to, after receiving a switching signal, and in response to detecting that both a power supply alternating current and a backup alternating current of the alternating currents are in a polarity half cycle and a voltage difference between the power supply alternating current and the backup alternating current is less than a preset voltage, perform the following steps:
(a) closing a first turn-on direction of a power supply switch unit of the power supply alternating current;
(b) opening a second turn-on direction of a backup switch unit of the backup alternating current;
(c) closing a second turn-on direction of the power supply switch unit; and
(d) opening a first turn-on direction of the backup switch unit; wherein the first turn-on direction of the power supply switch unit and the first turn-on direction of the backup switch unit are opposite to a direction of the polarity half cycle, the second turn-on direction of the power supply switch unit and the second turn-on direction of the backup switch unit are the same as the direction of the polarity half cycle, and the power supply switch unit and the backup switch unit are comprised in the switch units;
wherein the switching control system comprises a first phase line, a first neutral line, a second phase line, and a second neutral line, the first phase line and the first neutral line are configured to receive the power supply alternating current, the second phase line and the second neutral line are configured to receive the backup alternating current, both the power supply switch unit and the backup switch unit comprise a first transistor, a second transistor, a third transistor, and a fourth transistor, the first transistor and the second transistor of the power supply switch unit are located on the first phase line and are connected in reverse series, the third transistor and the fourth transistor of the power supply switch unit are located on the first neutral line and are connected in reverse series, the first transistor and the second transistor of the backup switch unit are located on the second phase line and are connected in reverse series, and the third transistor and the fourth transistor of the backup switch unit are located on the second neutral line and are connected in reverse series.

8. The switching control system according to claim 7, wherein the first transistor, the second transistor, the third transistor, and the fourth transistor of the power supply switch unit each are an NMOS, a drain of the first transistor of the power supply switch unit and a drain of the third transistor of the power supply switch unit receive the power supply alternating current, a source of the first transistor of the power supply switch unit is connected to a source of the second transistor of the power supply switch unit, a source of the third transistor of the power supply switch unit is connected to a source of the fourth transistor of the power supply switch unit, a drain of the second transistor of the power supply switch unit and a drain of the fourth transistor of the power supply switch unit are connected to the load, step (a) comprises sending a turn-off signal to a gate of a first control transistor of the power supply switch unit, and step (c) comprises sending the turn-off signal to a gate of each of the plurality of second control transistors of the power supply switch unit, wherein when the polarity half cycle is a positive half cycle, the first control transistor of the power supply switch unit is the second transistor of the power supply switch unit, and the second control transistors of the power supply switch unit are the first transistor, the third transistor, and the fourth transistor of the power supply switch unit; and when the polarity half cycle is a negative half cycle, the first control transistor of the power supply switch unit is the first transistor of the power supply switch unit, and the second control transistors of the power supply switch unit are the second transistor, the third transistor, and the fourth transistor of the power supply switch unit.

9. The switching control system according to claim 8, wherein the first transistor, the second transistor, the third transistor, and the fourth transistor of the backup switch unit each are an NMOS, a drain of the first transistor of the backup switch unit and a drain of the third transistor of the backup switch unit receive the backup alternating current, a source of the first transistor of the backup switch unit is connected to a source of the second transistor of the backup switch unit, a source of the third transistor of the backup switch unit is connected to a source of the fourth transistor of the backup switch unit, a drain of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

10. The switching control system according to claim 8, wherein the first transistor, the second transistor, the third transistor, and the fourth transistor of the backup switch unit each are an NMOS, a drain of the first transistor of the backup switch unit and a source of the third transistor of the backup switch unit receive the backup alternating current, a source of the first transistor of the backup switch unit is connected to a source of the second transistor of the backup switch unit, a drain of the third transistor of the backup switch unit is connected to a drain of the fourth transistor of the backup switch unit, a drain of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

11. The switching control system according to claim 8, wherein the first transistor, the second transistor, the third transistor, and the fourth transistor of the backup switch unit each are an NMOS, a source of the first transistor of the backup switch unit and a drain of the third transistor of the backup switch unit receive the backup alternating current, a drain of the first transistor of the backup switch unit is connected to a drain of the second transistor of the backup switch unit, a source of the third transistor of the backup switch unit is connected to a source of the fourth transistor of the backup switch unit, a source of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

12. The switching control system according to claim 8, wherein the first transistor, the second transistor, the third transistor, and the fourth transistor of the backup switch unit each are an NMOS, a source of the first transistor of the backup switch unit and a source of the third transistor of the backup switch unit receive the backup alternating current, a drain of the first transistor of the backup switch unit is connected to a drain of the second transistor of the backup switch unit, a drain of the third transistor of the backup switch unit is connected to a drain of the fourth transistor of the backup switch unit, a source of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

13. The switching control system according to claim 7, wherein the first transistor, the second transistor, the third transistor, and the fourth transistor of the power supply switch unit each are an NMOS, a drain of the first transistor of the power supply switch unit and a source of the third transistor of the power supply switch unit receive the power supply alternating current, a source of the first transistor of the power supply switch unit is connected to a source of the second transistor of the power supply switch unit, a drain of the third transistor of the power supply switch unit is connected to a drain of the fourth transistor of the power supply switch unit, a drain of the second transistor of the power supply switch unit and a source of the fourth transistor of the power supply switch unit are connected to the load, step (a) comprises sending a turn-off signal to a gate of a first control transistor of the power supply switch unit, and step (c) comprises sending the turn-off signal to a gate of each of the plurality of second control transistors of the power supply switch unit, wherein when the polarity half cycle is a positive half cycle, the first control transistor of the power supply switch unit is the second transistor of the power supply switch unit, and the second control transistors of the power supply switch unit are the first transistor, the third transistor, and the fourth transistor of the power supply switch unit; and when the polarity half cycle is a negative half cycle, the first control transistor of the power supply switch unit is the first transistor of the power supply switch unit, and the second control transistors of the power supply switch unit are the second transistor, the third transistor, and the fourth transistor of the power supply switch unit.

14. The switching control system according to claim 13, wherein the first transistor, the second transistor, the third transistor, and the fourth transistor of the backup switch unit each are an NMOS, a drain of the first transistor of the backup switch unit and a drain of the third transistor of the backup switch unit receive the backup alternating current, a source of the first transistor of the backup switch unit is connected to a source of the second transistor of the backup switch unit, a source of the third transistor of the backup switch unit is connected to a source of the fourth transistor of the backup switch unit, a drain of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

15. The switching control system according to claim 13, wherein the first transistor, the second transistor, the third transistor, and the fourth transistor of the backup switch unit each are an NMOS, a drain of the first transistor of the backup switch unit and a source of the third transistor of the backup switch unit receive the backup alternating current, a source of the first transistor of the backup switch unit is connected to a source of the second transistor of the backup switch unit, a drain of the third transistor of the backup switch unit is connected to a drain of the fourth transistor of the backup switch unit, a drain of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

16. The switching control system according to claim 13, wherein the first transistor, the second transistor, the third transistor, and the fourth transistor of the backup switch unit each are an NMOS, a source of the first transistor of the backup switch unit and a drain of the third transistor of the backup switch unit receive the backup alternating current, a drain of the first transistor of the backup switch unit is connected to a drain of the second transistor of the backup switch unit, a source of the third transistor of the backup switch unit is connected to a source of the fourth transistor of the backup switch unit, a source of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

17. The switching control system according to claim 13, wherein the first transistor, the second transistor, the third transistor, and the fourth transistor of the backup switch unit each are an NMOS, a source of the first transistor of the backup switch unit and a source of the third transistor of the backup switch unit receive the backup alternating current, a drain of the first transistor of the backup switch unit is connected to a drain of the second transistor of the backup switch unit, a drain of the third transistor of the backup switch unit is connected to a drain of the fourth transistor of the backup switch unit, a source of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

18. The switching control system according to claim 7, wherein the first transistor, the second transistor, the third transistor, and the fourth transistor of the power supply switch unit each are an NMOS, a source of the first transistor of the power supply switch unit and a drain of the third transistor of the power supply switch unit receive the power supply alternating current, a drain of the first transistor of the power supply switch unit is connected to a drain of the second transistor of the power supply switch unit, a source of the third transistor of the power supply switch unit is connected to a source of the fourth transistor of the power supply switch unit, a source of the second transistor of the power supply switch unit and a drain of the fourth transistor of the power supply switch unit are connected to the load, step (a) comprises sending a turn-off signal to a gate of a first control transistor of the power supply switch unit, and step (c) comprises sending the turn-off signal to a gate of each of the plurality of second control transistors of the power supply switch unit, wherein when the polarity half cycle is a positive half cycle, the first control transistor of the power supply switch unit is the first transistor of the power supply switch unit, and the second control transistors of the power supply switch unit are the second transistor, the third transistor, and the fourth transistor of the power supply switch unit; and when the polarity half cycle is a negative half cycle, the first control transistor of the power supply switch unit is the second transistor of the power supply switch unit, and the second control transistors of the power supply switch unit are the first transistor, the third transistor, and the fourth transistor of the power supply switch unit.

19. The switching control system according to claim 18, wherein the first transistor, the second transistor, the third transistor, and the fourth transistor of the backup switch unit each are an NMOS, a drain of the first transistor of the backup switch unit and a drain of the third transistor of the backup switch unit receive the backup alternating current, a source of the first transistor of the backup switch unit is connected to a source of the second transistor of the backup switch unit, a source of the third transistor of the backup switch unit is connected to a source of the fourth transistor of the backup switch unit, a drain of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

20. The switching control system according to claim 18, wherein the first transistor, the second transistor, the third transistor, and the fourth transistor of the backup switch unit each are an NMOS, a drain of the first transistor of the backup switch unit and a source of the third transistor of the backup switch unit receive the backup alternating current, a source of the first transistor of the backup switch unit is connected to a source of the second transistor of the backup switch unit, a drain of the third transistor of the backup switch unit is connected to a drain of the fourth transistor of the backup switch unit, a drain of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

21. The switching control system according to claim 18, wherein the first transistor, the second transistor, the third transistor, and the fourth transistor of the backup switch unit each are an NMOS, a source of the first transistor of the backup switch unit and a drain of the third transistor of the backup switch unit receive the backup alternating current, a drain of the first transistor of the backup switch unit is connected to a drain of the second transistor of the backup switch unit, a source of the third transistor of the backup switch unit is connected to a source of the fourth transistor of the backup switch unit, a source of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

22. The switching control system according to claim 18, wherein the first transistor, the second transistor, the third transistor, and the fourth transistor of the backup switch unit each are an NMOS, a source of the first transistor of the backup switch unit and a source of the third transistor of the backup switch unit receive the backup alternating current, a drain of the first transistor of the backup switch unit is connected to a drain of the second transistor of the backup switch unit, a drain of the third transistor of the backup switch unit is connected to a drain of the fourth transistor of the backup switch unit, a source of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

23. The switching control system according to claim 7, wherein the first transistor, the second transistor, the third transistor, and the fourth transistor of the power supply switch unit each are an NMOS, a source of the first transistor of the power supply switch unit and a source of the third transistor of the power supply switch unit receive the power supply alternating current, a drain of the first transistor of the power supply switch unit is connected to a drain of the second transistor of the power supply switch unit, a drain of the third transistor of the power supply switch unit is connected to a drain of the fourth transistor of the power supply switch unit, a source of the second transistor of the power supply switch unit and a source of the fourth transistor of the power supply switch unit are connected to the load, step (a) comprises sending a turn-off signal to a gate of a first control transistor of the power supply switch unit, and step (c) comprises sending the turn-off signal to a gate of each of the plurality of second control transistors of the power supply switch unit, wherein when the polarity half cycle is a positive half cycle, the first control transistor of the power supply switch unit is the first transistor of the power supply switch unit, and the second control transistors of the power supply switch unit are the second transistor, the third transistor, and the fourth transistor of the power supply switch unit; and when the polarity half cycle is a negative half cycle, the first control transistor of the power supply switch unit is the second transistor of the power supply switch unit, and the second control transistors of the power supply switch unit are the first transistor, the third transistor, and the fourth transistor of the power supply switch unit.

24. The switching control system according to claim 23, wherein the first transistor, the second transistor, the third transistor, and the fourth transistor of the backup switch unit each are an NMOS, a drain of the first transistor of the backup switch unit and a drain of the third transistor of the backup switch unit receive the backup alternating current, a source of the first transistor of the backup switch unit is connected to a source of the second transistor of the backup switch unit, a source of the third transistor of the backup switch unit is connected to a source of the fourth transistor of the backup switch unit, a drain of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

25. The switching control system according to claim 23, wherein the first transistor, the second transistor, the third transistor, and the fourth transistor of the backup switch unit each are an NMOS, a drain of the first transistor of the backup switch unit and a source of the third transistor of the backup switch unit receive the backup alternating current, a source of the first transistor of the backup switch unit is connected to a source of the second transistor of the backup switch unit, a drain of the third transistor of the backup switch unit is connected to a drain of the fourth transistor of the backup switch unit, a drain of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the first transistor, the third transistor, and the fourth transistor of the backup switch unit, and the second control transistor of the backup switch unit is the second transistor of the backup switch unit; and when the polarity half cycle is the negative half cycle, the first control transistors of the backup switch unit are the second transistor, the third transistor, and the fourth transistor of the backup switch unit, and the second control transistor of the backup switch unit is the first transistor of the backup switch unit.

26. The switching control system according to claim 23, wherein the first transistor, the second transistor, the third transistor, and the fourth transistor of the backup switch unit each are an NMOS, a source of the first transistor of the backup switch unit and a drain of the third transistor of the backup switch unit receive the backup alternating current, a drain of the first transistor of the backup switch unit is connected to a drain of the second transistor of the backup switch unit, a source of the third transistor of the backup switch unit is connected to a source of the fourth transistor of the backup switch unit, a source of the second transistor of the backup switch unit and a drain of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

27. The switching control system according to claim 23, wherein the first transistor, the second transistor, the third transistor, and the fourth transistor of the backup switch unit each are an NMOS, a source of the first transistor of the backup switch unit and a source of the third transistor of the backup switch unit receive the backup alternating current, a drain of the first transistor of the backup switch unit is connected to a drain of the second transistor of the backup switch unit, a drain of the third transistor of the backup switch unit is connected to a drain of the fourth transistor of the backup switch unit, a source of the second transistor of the backup switch unit and a source of the fourth transistor of the backup switch unit are connected to the load, step (b) comprises sending a turn-on signal to a gate of each of a plurality of first control transistors of the backup switch unit, and step (d) comprises sending a turn-on signal to a gate of a second control transistor of the backup switch unit, wherein when the polarity half cycle is the positive half cycle, the first control transistors of the backup switch unit are the second transistor, the third transistor, and the fourth transistor of the backup switch unit, and the second control transistor of the backup switch unit is the first transistor of the backup switch unit; and when the polarity half cycle is the negative half cycle, the first control transistors of the backup switch unit are the first transistor, the third transistor, and the fourth transistor of the backup switch unit, and the second control transistor of the backup switch unit is the second transistor of the backup switch unit.

28. A switching control system, comprising:

a plurality of switch units, configured to separately receive one of a plurality of alternating currents and couple to a load;

a detection unit, configured to detect each of the alternating currents; and a control unit, configured to, after receiving a switching signal, and in response to detecting that both a power supply alternating current and a backup alternating current of the alternating currents are in a polarity half cycle and a voltage difference between the power supply alternating current and the backup alternating current is less than a preset voltage, perform the following steps:

(a) closing a first turn-on direction of a power supply switch unit of the power supply alternating current;

(b) opening a second turn-on direction of a backup switch unit of the backup alternating current;

(c) closing a second turn-on direction of the power supply switch unit; and (d) opening a first turn-on direction of the backup switch unit; wherein the first turn-on direction of the power supply switch unit and the first turn-on direction of the backup switch unit are opposite to a direction of the polarity half cycle, the second turn-on direction of the power supply switch unit and the second turn-on direction of the backup switch unit are the same as the direction of the polarity half cycle, and the power supply switch unit and the backup switch unit are comprised in the switch units; wherein the control unit is configured to perform, in response to detecting that a voltage of the power supply alternating current is less than a threshold, an emergency switching step to cause the backup alternating current to replace the power supply alternating current to supply power to the load.

29. The switching control system according to claim 28, wherein the emergency switching step comprises: in response to detecting that both the power supply alternating current of the alternating currents and the backup alternating current are in the polarity half cycle and the voltage difference between the power supply alternating current of the alternating currents and the backup alternating current is less than the preset voltage, performing step (a) to step (d) above.

* * * * *